(12) United States Patent
Sawada

(10) Patent No.: US 6,894,945 B2
(45) Date of Patent: May 17, 2005

(54) CLOCK SYNCHRONOUS SEMICONDUCTOR MEMORY DEVICE

(75) Inventor: Seiji Sawada, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 169 days.

(21) Appl. No.: 10/189,577

(22) Filed: Jul. 8, 2002

(65) Prior Publication Data

US 2003/0031082 A1 Feb. 13, 2003

(30) Foreign Application Priority Data

Aug. 9, 2001 (JP) ........................ 2001-241963

(51) Int. Cl.[7] .............................................. G11C 8/00
(52) U.S. Cl. ................... 365/233; 365/230.08
(58) Field of Search ................. 365/233, 230.08, 365/201; 712/9; 714/720, 742

(56) References Cited

U.S. PATENT DOCUMENTS

| | | | | |
|---|---|---|---|---|
| 4,958,345 A | * | 9/1990 | Fujisaki ..................... | 714/720 |
| 5,170,398 A | * | 12/1992 | Fujieda et al. ............... | 714/742 |
| 5,628,025 A | * | 5/1997 | Chung et al. .................. | 712/9 |
| 5,933,379 A | * | 8/1999 | Park et al. ................... | 365/233 |
| 5,970,020 A | * | 10/1999 | Ong ........................ | 365/230.08 |
| 6,324,119 B1 | * | 11/2001 | Kim .......................... | 365/233 |
| 6,356,508 B1 | * | 3/2002 | Yoshimoto ................... | 365/233 |
| 6,385,125 B1 | | 5/2002 | Ooishi et al. | |
| 6,462,995 B2 | * | 10/2002 | Urakawa ..................... | 365/200 |
| 6,498,766 B2 | * | 12/2002 | Lee et al. ................... | 365/233 |
| 6,570,800 B2 | * | 5/2003 | Tanaka et al. ............... | 365/233 |
| 6,611,469 B2 | * | 8/2003 | Williams et al. ........ | 365/189.12 |
| 6,717,887 B1 | * | 4/2004 | Kono et al. ................. | 365/233 |

FOREIGN PATENT DOCUMENTS

| | | |
|---|---|---|
| JP | 07-140207 | 6/1995 |
| JP | 11-027113 | 1/1999 |
| JP | 2000-21198 | 1/2000 |

* cited by examiner

*Primary Examiner*—Trong Phan
(74) *Attorney, Agent, or Firm*—McDermott Will & Emery LLP

(57) ABSTRACT

An internal clock generating circuit generates internal clock signals at a double speed of an external clock signal in a test mode. An input/output circuit inputs/outputs data in a DDR mode in accordance with the double-speed internal clock signal. Particularly, an output drive signal CLKO has a frequency twice as high as that of the internal clock signal, and a data strobe signal DQS is generated as a signal having a frequency twice as high as that of an external data strobe signal. In such a manner, a semiconductor memory device which inputs and outputs data in a DDR mode at a speed twice as fast as that of an external clock signal can be achieved.

20 Claims, 32 Drawing Sheets

: k < m

CLOCK SYNCHRONOUS SEMICONDUCTOR MEMORY DEVICE

BACKGROUND OF THE INVENTION

1. Field of the Invention

The present invention relates to a semiconductor memory device and, more particularly, to a clock synchronous semiconductor memory device for transferring data and taking in an external signal synchronously with a clock signal. Particularly, the invention relates to a structure of a data input/output section in a synchronous semiconductor memory device that operates in a DDR (Double Data Rate) mode of transferring data at both rising and fall edges of a clock signal. More particularly, the invention relates to a structure for operating the data input/output section at a rate faster than an external clock signal.

2. Description of the Background Art

In a high-speed data processing system, it is required to transfer data between a memory and a processor at high speed. As such a memory for transferring data at high speed, a clock synchronous semiconductor memory device to transfer data synchronously with a clock signal is known. Since data is transferred synchronously with a clock signal such as a system clock, the data transfer rate is determined by the clock signal and high-speed data transfer can be achieved.

In the clock synchronous semiconductor memory device, a control signal instructing an operation mode is merely required to satisfy the condition of set up and hold timings relative to the clock signal. It is unnecessary to consider a skew among control signals, and it is unnecessary to determine an internal timing in consideration of the margin for the skew among the control signals. Thus, the internal operation start timing can be set faster, and high speed access can be achieved.

Such a clock synchronous semiconductor memory device comes to be widely used. However, to achieve higher-speed data transfer, a semiconductor memory device operating in a DDR (Double Data Rate) mode of transferring data synchronously with both the rising and falling edges of a clock signal is implemented.

FIG. 81 is a timing chart representing a data reading operation of a conventional DDR mode semiconductor memory device. FIG. 81 shows an example of the data reading operation in the case where column latency CL is 2 and burst length BL is 4. The column latency denotes the number of clock cycles required for valid data to be output externally since a read command for instructing data reading operation is applied. The burst length indicates the number of input/output data successively per data terminal when one data reading/writing instruction is applied.

The read command for instructing data reading operation is applied synchronously with the rising edge, for example, of an external clock signal Ext.CLK. Internally, an internal clock signal CLKP is generated in response to the rising edge of external clock signal Ext.CLK, and an internal clock signal CLKN is generated synchronously with the falling edge of external dock signal Ext.CLK.

When the read command is applied, selection of a memory cell and reading of internal data are internally executed synchronously with an external clock signal. At this time, data of two bits is read in parallel per data output terminal. The 2-bit data read in parallel is converted to serial data in accordance with clock signals CLKP and CLKN, and the serial data is sequentially transferred.

Subsequently, an output circuit operates in response to an output clock signal CLKO generated synchronously with internal clock signals CLKP and CLKN, and produces external read data Dout from the internal read data. Since the column latency CL is 2 and the burst length BL is 4, after elapse of two clock cycles since the read command is applied, external read data Dout is produced, and data of four bits per data output terminal is successively output synchronously with output clock signals CLKO.

As shown in FIG. 81, in the case of the DDR mode, data is output synchronously with the rising and falling edges of external clock signal Ext.CLK, so that data can be transferred at a frequency twice as high as that of external clock signal Ext.CLK. Thus, data can be transferred at higher speed.

FIG. 81 shows a state where phases of internal clock signals CLKP and CLKN lead the rising and falling edges of external clock signal Ext.CLK. This is because internal clock signals CLKP and CLKN are generated from external dock signal Ext.CLK by using a DLL (Delay Locked Loop) for generating internal clocks CLKP and CLKN.

Output clock signal CLKO is generated in data reading, after elapse of column latency, synchronously with internal clock signals CLKP and CLKN.

FIG. 82 is a diagram schematically showing the configuration of a section of generating internal clock signals CLKP and CLKN. In FIG. 82, the internal clock generating section includes: edge detecting circuits 950 and 956 for detecting an intersection of complementary clock signals Ext.CLK and Ext.CLKB externally applied; one-shot pulse generating circuits 952 and 954 each for generating a one-shot pulse signal in response to the rising edge of an output signal of edge detecting circuit 950; and a one-shot pulse generating circuit 958 for generating a one-shot pulse signal in response to the rising edge of an output signal of edge detecting circuit 956.

Edge detecting circuits 950 and 956 each are formed of, for example, a differential amplifier, and perform complementary edge detecting operations to each other. Specifically, edge detecting circuit 950 outputs a signal which goes high when external dock signal Ext.CLK is higher than complementary external clock signal Ext.CLKB. Edge detecting circuit 956 outputs a signal which goes high when complementary external clock signal Ext.CLKB attains higher than external clock signal Ext.CLK.

One-shot pulse generating circuit 952 generates a one-shot pulse signal having a predetermined time width in response to the rising edge of the output signal of edge detecting circuit 950 and generates internal clock signal CLK. One-shot pulse generating circuit 954 generates clock signal CLKP for output control having a predetermined time width in the form of a one-shot pulse in response to the rising edge of the output signal of edge detecting circuit 950.

One-shot pulse generating circuit 958 generates clock signal CLKN for output control by generating a one-shot pulse signal having a predetermined time width in response to the rising edge of the output signal of edge detecting circuit 956.

FIG. 83 is a timing chart representing an operation of the internal clock generating section illustrated in FIG. 82. In FIG. 83, to make explanation simpler, it is assumed that the DLL is not provided and internal clock signals CLKP, CLKN, and CLKO are generated in accordance with external nal clock signals Ext.CLK and Ext.CLKB.

When external clock signal Ext.CLK becomes higher than external clock signal Ext.CLKB, edge detecting circuit 950 generates an H-level signal. Accordingly, one-shot pulse generating circuit 954 generates a one-shot pulse signal, and internal clock signal CLKP is generated. Therefore, internal dock signal CLKP is generated synchronously with the rising edge of external clock signal Ext.CLK and the falling edge of complementary external clock signal Ext.CLKB.

On the other hand, edge detecting circuit 956 outputs an H-level signal when external clock signal Ext.CLK goes low and complementary external clock signal Ext.CLKB goes high. One-shot pulse generating circuit 958 generates a one-shot pulse signal in response to the rising edge of an output signal of edge detecting circuit 956, to generate internal clock signal CLKN.

Therefore, internal clock signals CLKP and CLKN are generated synchronously with the rising and falling edges, respectively, of external clock signal Ext.CLK, so that their phases are shifted from each other by a half cycle of external clock signal Ext.CLK.

In data reading, under control of a not-shown reading control circuit, output clock signal CLKO is generated synchronously with internal clock signals CLKP and CLKN.

FIG. 84 is a diagram schematically showing the configuration of a data reading section. FIG. 84 schematically shows the configuration of the section for reading one-bit data. In FIG. 84, the data reading section includes: a register circuit 960 receiving internal read data RD0 and transferring the received data synchronously with an internal clock signal CLKEV; a register circuit 962 receiving internal read data RD1 and transferring the received data synchronously with an internal clock signal CLKOD; an output drive circuit 964 for transferring the data transferred from register circuits 960 and 962 externally, synchronously with output clock signal CLKO; and a multiplexer 965 for multiplexing internal clock signals CLKP and CLKN in accordance with an address signal bit A0 to generate internal read clock signals CLKEV and CLKOD.

In the semiconductor memory device, synchronously with internal clock signal CLK generated according to external clock signal Ext.CLK, reading of internal data (selection of a memory cell and amplification and transfer of internal read data) is performed. Internal read data RD0 and RD1 are transferred in parallel to register circuits 960 and 962. Multiplexer 965 generates internal read clock signals CLKEV and CLKOD from internal clock signals CLKP and CLKN in accordance with address signal bit A0. For example, when address signal bit A0 is "0", according to internal clock signals CLKP and CLKN, internal read clock signals CLKEV and CLKOD are generated. In this case, therefore, internal read data RD0 stored in register circuit 960 is transferred first.

Output drive circuit 964 transfers data generated synchronously with internal clock signals CLKP and CLKN and transferred from register circuits 960 and 962 externally. Output clock signal CLKO is therefore generated synchronously with the rising and falling edges of external clock signal Ext.CLK, and external output data Dout is transferred at the rising and falling edges of external clock signal Ext.CLK.

As shown in FIG. 84, on the inside, the internal circuit is operated at the cycle of external clock signal Ext.CLK, to perform selection of a memory cell, transference of memory cell data, and then a so-called "parallel to serial conversion" for transference in the data reading section. In this way, the internal circuit can operate stably also for a high-speed clock signal, and data can be transferred externally at a period twice as short as that of the external clock signal.

A data writing section also has a configuration similar to that of the data reading section. A serial-to-parallel converting process of receiving data supplied synchronously with both the rising and falling edges of external clock signal Ext.CLK from the outside of the memory device, and transmission of internal write data to selected memory cells in parallel are performed. In data writing as well, therefore, the internal circuit operates in cycles of the external clock signal. Data supplied in the cycle twice as short as that of the external clock is received, and data can be written to the selected memory cells.

In the semiconductor memory device, a function test has to be carried out to assure the reliability of the product. In the case of performing the test, a tester (testing apparatus) has to generate a clock signal and apply it to a synchronous semiconductor memory device to be tested.

When the operating speed of the semiconductor memory device increases and the frequency of the clock signal becomes high, there is such a case that the tester cannot generate a required high-speed clock signal. Particularly, in the case where there is no large change in the contents of a test while the operating speed of the synchronous semiconductor memory device increases due to alteration of generations or the like, a higher-speed synchronous semiconductor memory device is tested by using the tester used for the synchronous semiconductor memory device of the previous generation, in order to reduce the cost of the test or for other reasons.

In such a case, in the semiconductor memory device, generally, the internal clock signal is generated synchronously with both the rising and falling edges of an external clock signal, and the internal circuit is operated in the cycle twice as short as that of the external clock signal.

Between the semiconductor memory device and the tester, data is transferred synchronously with a relatively low-speed external clock signal generated by the tester. For a semiconductor memory device with an SDR (Single Data Rate) mode of transferring data synchronously with the rising edge or falling edge of the external clock signal, an internal clock signal of a frequency twice as high as that of the external clock signal is generated to operate the internal circuit in synchronization of the internal clock signal, so that an actual operation of the internal circuit can be tested by using the low-speed tester.

However, in the semiconductor memory device with the DDR mode of transferring data synchronously with the rising and falling edges of the external clock signal, data input/output sections already operate at a frequency twice as high as that of the external clock signal. Even when the internal dock signal of a frequency twice as high as that of the external clock signal is generated, read clock signal CLKO shown in FIG. 83, for example, is similarly a clock signal of a frequency twice as high as that of the external clock signal. Even when the frequency of the external clock signal is internally multiplied to generate an internal clock signal having a doubled clock frequency, the data input/output section cannot be operated in the DDR mode at a frequency twice as high as the internal clock.

For example, in a signal waveform diagram of FIG. 83, when internal clock signal CLKP is generated synchronously with both the rising and falling edges of external clock signal Ext.CLK, internal clock signals CLKP and CLKN become the same clock signal, so that the internal circuit cannot be operated accurately. In addition, output clock signal CLKO merely turns signal having the same frequency as that of internal clock signal CLKP, and the input/output circuitry cannot be operated in the DDR mode.

In the semiconductor memory device with the SDR mode as well, in the case of generating the internal clock signal synchronously with both the rising and falling edges of the external clock signal, only the internal clock signal of the frequency twice as high as that of the external clock signal can be generated, and an even higher-speed internal clock signal cannot be generated.

In addition to a test such as a function test, stress acceleration cannot be accurately performed by operating a data input/output circuit at high speed in an acceleration test, and a problem such that time required to perform a stress acceleration test such as a burn-in becomes long occurs.

SUMMARY OF THE INVENTION

An object of the invention is to provide a synchronous semiconductor memory device capable of operating an input/output section at a frequency at least four times as high as that of the external clock signal in a specific operating mode.

Another object of the invention is to provide a DDR mode semiconductor memory device that can be tested accurately by using a low-speed tester.

Further another object of the invention is to provide a DDR mode semiconductor memory device which operates at a frequency four times as high as that of the external clock signal in a specific operating mode.

A semiconductor memory device according to a first aspect of the invention includes a pulse generating circuit receiving a plurality of clock signals different in phase from each other and generating a one-shot pulse signal in a cycle shorter than that of each of the plurality of clock signals, and a data interface circuit inputting or outputting data synchronously with a pulse signal generated by the pulse generating circuit.

A semiconductor memory device according to a second aspect of the invention includes an internal strobe signal generating circuit receiving signals from a plurality of signal terminals including a strobe terminal for receiving a data strobe signal providing a data strobe timing and, in a specific operation mode, generating an internal strobe signal obtained by frequency-multiplying the signal of the strobe terminal, and a data input circuit for taking in external data and generating internal write data in accordance with the internal strobe signal.

A semiconductor memory device according to a third aspect of the invention includes an internal data transmission bus having a width of a plurality of bits, a data pattern generating circuit for generating a data pattern having a predetermined pattern in a specific operation mode, and a switching circuit for transmitting data corresponding to output data of the data pattern generating circuit in parallel to the internal data transmission bus in the specific operation mode.

A semiconductor memory device according to a fourth aspect of the invention includes a strobe terminal for receiving a strobe signal providing a data strobe timing, an internal data line for transmitting a signal of a plurality of bits, and an internal data generating circuit for, in a specific operation mode, taking in data applied to a data input terminal in response to a change in the signal applied to the strobe terminal, generating data of a plurality of bits from the data taken in response to each change, and transmitting the generated data in parallel to the internal data line.

By using a plurality of external signals, an internal clock signal having a frequency higher than a doubled frequency of an external clock signal can be generated. Therefore, a semiconductor memory device with a DDR mode can be allowed to perform data input/output operation in the DDR mode at high speed even by using a low-speed tester. Thus, the semiconductor memory device with the DDR mode that operates at high speed can be accurately tested by using a low-speed tester.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
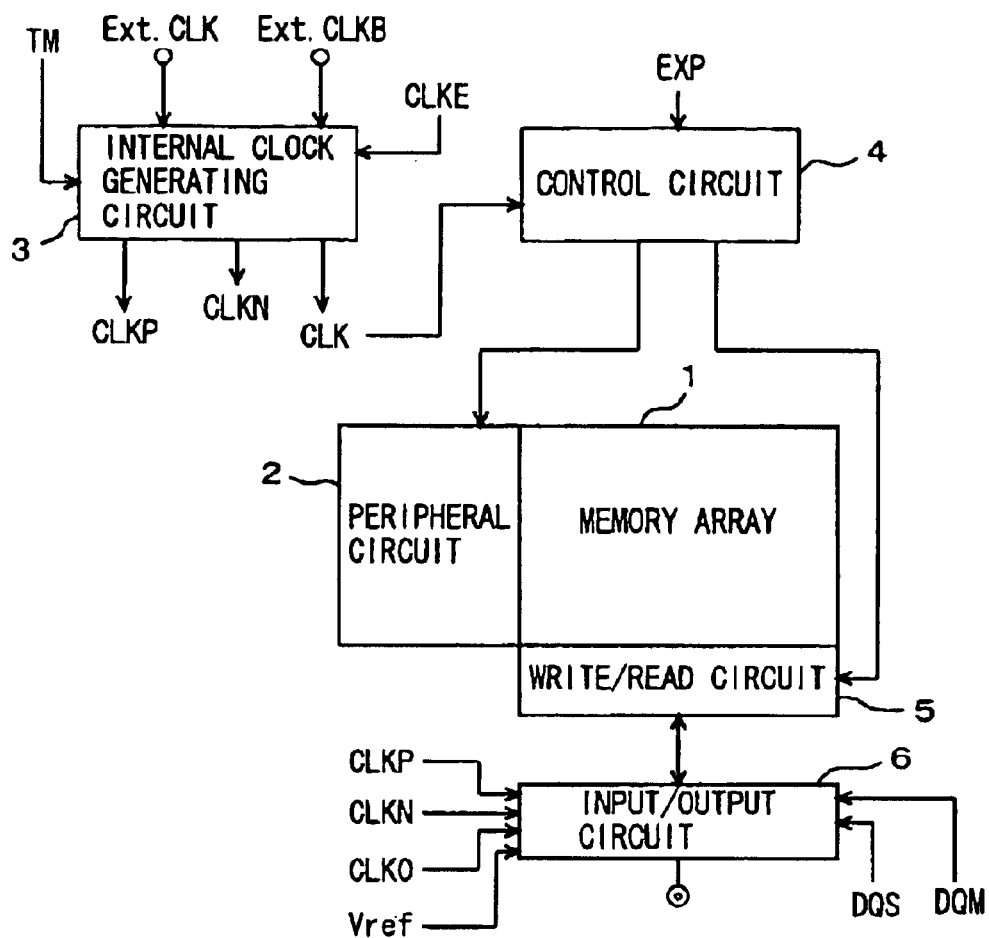
FIG. 1 is a diagram schematically showing an overall configuration of a synchronous semiconductor memory device according to the invention.

FIG. 1 is a diagram schematically showing an overall configuration of a semiconductor memory device according to a first embodiment of the invention. In FIG. 1, the semiconductor memory device includes: a memory array 1 having a plurality of memory cells arranged in rows and columns; a peripheral circuit 2 performing an operation related to selection of a memory cell in memory array 1; an internal clock generating circuit 3 that is activated, when a clock enable signal CLKE is active, to generate internal clock signals CLKP, CLKN, and CLK synchronously with complementary external clock signals Ext.CLK and Ext.CLKB; a control circuit 4 for taking in an external signal EXP synchronously with internal clock signal CLK from internal clock generating circuit 3 and generating an internal control signal; a write/read circuit 5 for internally writing/reading data to/from a selected memory cell in memory array 1 under the control of control circuit 4; and an input/output circuit 6 for inputting/outputting data from/to the outside of the memory device synchronously with internal clock signals CLKP, CLKN, and CLKO.

A test mode instruction signal TM is applied to internal clock generating circuit 3 and in the test mode, internal clock generating circuit 3 generates internal clock signals CLKP, CLKN, and CLK each having a frequency twice as high as that of external clock signal Ext.CLK.

Input/output circuit 6 inputs/outputs data in a DDR mode.

To input/output circuit 6, a data strobe signal DQS and a data mask instruction signal DQM are applied. In a data writing mode, external data is taken in according to data strobe signal DQS. In a data reading mode, output clock signal CLKO is output as data strobe signal DQS to provide a data strobe timing to an external device such as an external processor. The external device samples data transferred from the semiconductor memory device in accordance with data strobe signal DQS.

Input/output circuit 6 also selectively masks (inhibits writing/reading) data having a width of a plurality of bits in writing/reading the data in response to data mask instruction signal DQM.

In a normal operation mode, external clock signals Ext.CLK and Ext.CLKB are complementary clock signals. In response to an intersection between external clock signals Ext.CLK and Ext.CLKB, internal clock signals CLKP, CLK, and CLKN are generated.

In a test mode, as external clock signals Ext.CLK and Ext.CLKB, clock signals shifted in phase from each other by a ¼ cycle (¼ times the cycle of the external clock signal) are applied. In the test mode, internal clock generating circuit 3 generates a one-shot pulse signal synchronously with a transition of the clock signals shifted in phase from each other by a ¼ cycle, to generate internal clock signals CLKP, CLKN, and CLK. Therefore, a clock signal having a cycle four times as short as that of external clock signal Ext.CLK can be generated as an output clock signal CLKO as described in the following.

Figure 2:
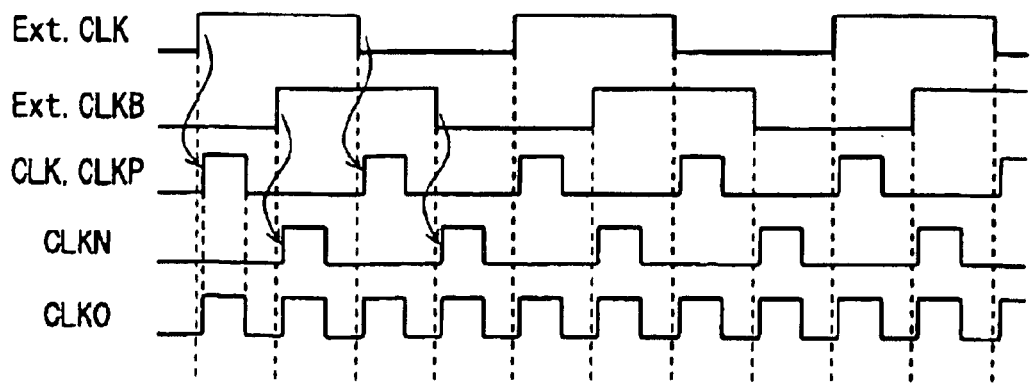
FIG. 2 is a timing chart representing the operation of the semiconductor memory device illustrated in FIG. 1.

FIG. 2 is a timing chart representing an operation in the test mode of internal clock generating circuit 3 illustrated in FIG. 1. As shown in FIG. 2, in the test mode, as external clock signals Ext.CLK and Ext.CLKB, clock signals the same in frequency but shifted in phase from each other by a ¼ cycle are applied. Synchronously with the rising and falling edges of external clock signal Ext.CLK, internal clock signals CLK and CLKP are generated. Synchronously with the rising and falling edges of external clock signal Ext.CLKB, internal clock signal CLKN is generated. Each of internal clock signals CLK, CLKP, and CLKN has a frequency twice as high as that of external clock signal Ext.CLK. The phase of each of internal clock signals CLK and CLKP and that of internal clock signal CLKN are shifted from each other by a ¼ cycle.

In reading data, output clock signal CLKO is generated according to internal clock signals CLKP and CLKN. Therefore, output clock signal CLKO has a frequency four times as high as that of external clock signal Ext.CLK. Therefore, the internal circuit can be operated synchronously with internal clock signal CLK having a frequency twice as high as that of external clock signal Ext.CLK. In addition, output clock signal CLKO having a frequency four times as high as that of external clock signal Ext.CLK is generated, and data can be output at a speed four time as fast as that of the external clock signal. Thus, the semiconductor memory device can be operated to output data in the DDR mode at a frequency twice as high as that of external clock signal Ext.CLK.

Figure 3:
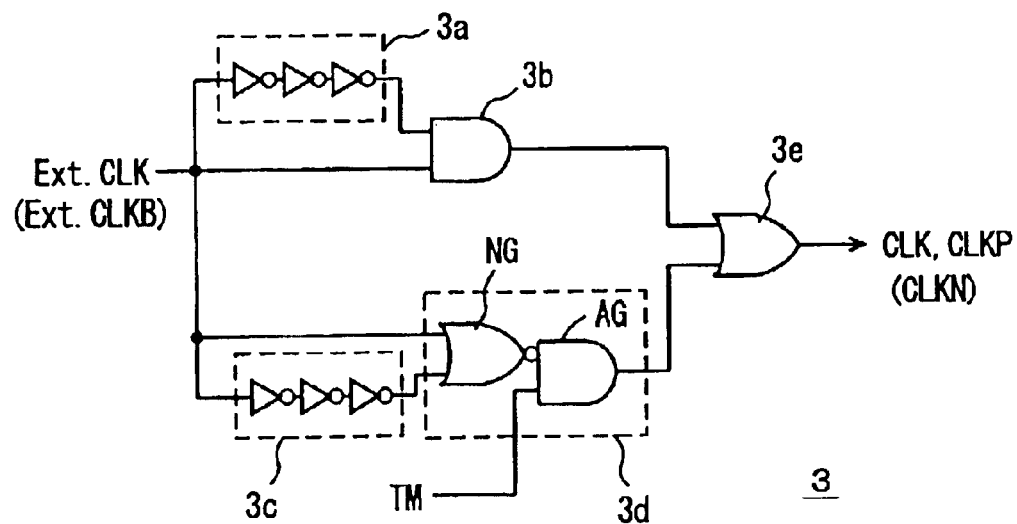
FIG. 3 is a diagram showing an example of the configuration of an internal dock generating circuit illustrated in FIG. 1.

FIG. 3 is a diagram showing an example of the configuration of internal clock generating circuit 3 illustrated in FIG. 1. FIG. 3 shows the configuration of a section of generating internal clock signals CLK and CLKP. Internal clock signal CLKN is generated according to external clock signal Ext.CLKB, using the same configuration.

In FIG. 3, internal clock generating circuit 3 includes: an inverting and delaying circuit 3a for inverting external clock signal Ext.CLK and delaying it by predetermined time; an AND circuit 3b receiving an output signal of inverting and delaying circuit 3a and external clock signal Ext.CLK; an inverting and delaying circuit 3c for delaying by a predetermined time and inverting external clock signal Ext.CLK; a composite gate 3d receiving an output signal of inverting and delaying circuit 3c, external dock signal Ext.CLK, and test mode instruction signal TM; and an OR circuit 3e receiving an output signal of AND circuit 3b and an output signal of composite gate 3d and generating internal clock signal CLK or CLKP.

Composite gate 3d equivalently includes an NOR gate NG receiving external clock signal Ext.CLK and an output signal of inverting and delaying circuit 3c and an AND gate AG receiving an output signal of NOR gate NG and test mode instruction signal TM. From AND gate AG, an output signal of composite gate 3d is generated.

In internal clock generating circuit 3 shown in FIG. 3, by inverting and delaying circuit 3a and AND circuit 3b, a one-shot pulse signal having a time width of delay time of inverting and delaying circuit 3a is generated synchronously with the rising edge of external clock signal Ext.CLK. On the other hand, by inverting and delaying circuit 3c and composite gate 3d, a pulse generating circuit for generating a one-shot pulse signal in response to the falling edge of external clock signal Ext.CLK in the test mode is implemented. The pulse width of the one-shot pulse signal generated in response to the rising and falling edges of external dock signal Ext.CLK is determined by the delay time of each of inverting and delaying circuits 3a and 3c.

OR circuit 3e generates internal clock signal CLK or CLKP from output signals of AND circuit 3b and composite gate 3d and generates, in the test mode, internal clock signals CLK and CLKP synchronously with the rising and falling edges of external dock signal Ext.CLK.

In the normal operation mode, test mode instruction signal TM is at the L level and an output signal of composite gate 3d is fixed at the L level. In this case, therefore, by inverting and delaying circuit 3a and AND circuit 3b, internal clock signal CLK or CLKP is generated synchronously with the rising edge of external clock signal Ext.CLK.

Internal clock signals CLK and CLKP are generated separately by distinct internal clock generating circuits having the same configuration. However, internal clock signals CLK and CLKP may be generated by using the common circuit. Inverting and delaying circuits 3a and 3c may be commonized. That is, an output signal of inverting and delaying circuit 3a may be applied to composite gate 3d.

It is also possible to use an AND circuit in place of composite gate 3d with the inverter at the first stage in inverting and delaying circuit 3c replaced with an NAND gate receiving external clock signal Ext.CLK and test mode instruction signal TM.

Figure 4:
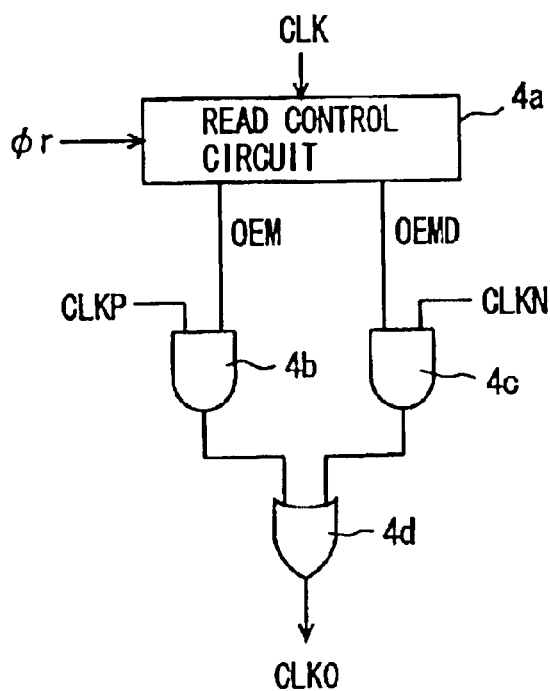
FIG. 4 is a diagram showing an example of the configuration of a control circuit illustrated in FIG. 1.

FIG. 4 is a diagram showing the configuration of a section of generating output clock signal CLKO. An output dock generating section shown in FIG. 4 is included in control circuit 4 illustrated in FIG. 1. In FIG. 4, the output clock signal generating section includes: a read control circuit 4a for generating an output activate signal OEM and a delayed output activate signal OEMD in response to an externally supplied read instruction signal φr for instructing reading of data; an AND circuit 4b receiving output activate signal OEM and internal clock signal CLKP; an AND circuit 4c receiving delayed output activate signal OEMD and internal clock signal CLKN; and an OR circuit 4d receiving output signals of AND circuits 4b and 4c and generating output clock signal CLKO.

When a read command instructing reading of data is applied, that is, when read instruction signal φr is activated, output activate signal OEM goes high after elapse of column latency CL −0.5 cycle. Delayed output activate signal OEMD is a signal obtained by delaying output activate signal OEM by a half cycle of internal clock signal CLK and is therefore made active after column latency CL elapses since the read command is applied. The active period of each of output activate signals OEM and OEMD is determined by burst length.

Read control circuit 4a operates synchronously with internal clock signal CLK. When read instruction signal φr is applied, after elapse of a cycle determined by the column latency, output activate signals OEM and OEMD are made active synchronously with internal clock signal CLK. When output activate signals OEM and OEMD are active, AND circuits 4b and 4c operate as buffer circuits for buffering internal clock signals CLKP and CLKN, respectively. Therefore, when output activate signals OEM and OEMD are active, output clock signal CLKO is generated according to internal clock signals CLKP and CLKN. Each of internal clock signals CLKP, CLKN, and CLK has a frequency twice as high as that of external clock signal Ext.CLK. Therefore, output clock signal CLKO has a frequency four times as high as that of external clock signal Ext.CLK.

By using the configurations shown in FIGS. 3 and 4, therefore, when an external tester can generate a clock signal of, for example, 500 MHz at the maximum as external clock signal Ext.CLK, the clock signal of 500 MHz is shifted in phase by a ¼ cycle to produce external clock signals Ext.CLK and Ext.CLKB. Consequently, in the semiconductor memory device, an internal clock signal of 1 GHz can be generated from the clock signals of 500 MHz to produce a clock signal of 2 GHz as a data output clock signal, and data can be output in the DDR mode at an internal operating speed of 1 GHz.

As described above, according to the first embodiment of the invention, signals shifted in phase from each other by the ¼ cycle are applied as external clock signals and one-shot pulse signals are generated as internal clock signals synchronously with the rising and falling edges of the external clock signals. Consequently, even with a low-speed external clock signal applied, a high-speed internal clock signal can be generated to implement an operation in the DDR mode.

Since signals shifted in phase from each other by the ¼ cycle are applied, in the test mode, to the terminals which receive external clock signals Ext.CLK and Ext.CLKB, it is unnecessary to generate an internal clock signal by additionally using a dedicated pin terminal. Thus, an internal clock signal having a desired frequency can be generated without increasing the number of pin terminals.

Although the clock signals of the same phase are used as external clock signals, the external clock signals may have opposite phases. As long as the phases are shifted from each other by the ¼ cycle, it is sufficient.

Second Embodiment

Figure 5:
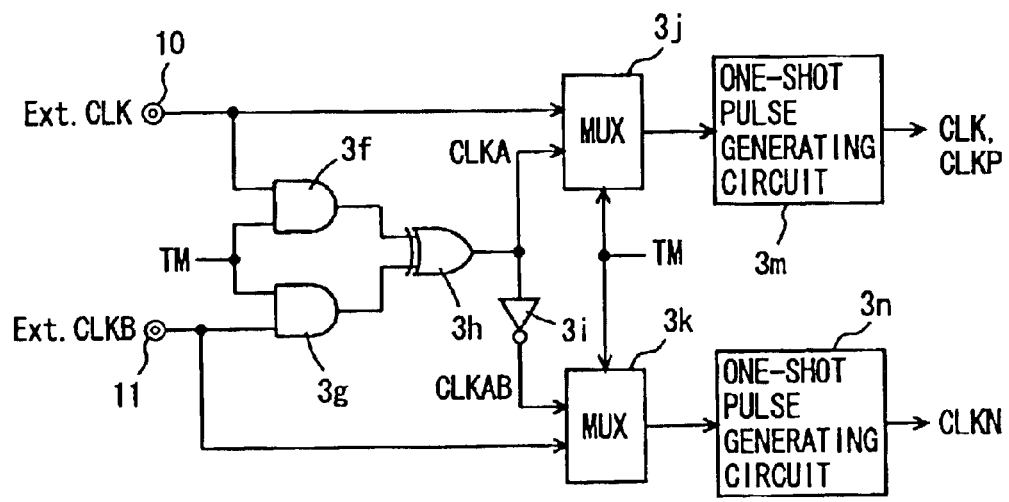
FIG. 5 is a diagram schematically showing the configuration of an internal clock generating circuit according to a second embodiment of the invention.

FIG. 5 is a diagram schematically showing the configuration of internal clock generating circuit 3 according to a second embodiment of the invention. In FIG. 5, in the normal operation mode, complementary external clock signals Ext.CLK and Ext.CLKB are supplied to clock input terminals 10 and 11, respectively. In the test mode, clock signals whose phases are shifted from each other by a ¼ cycle are supplied to clock input terminals 10 and 11.

Internal clock generating circuit 3 includes: an AND circuit 3f receiving test mode instruction signal TM and signal Ext.CLK supplied to clock input terminal 10; an AND circuit 3g receiving test mode instruction signal TM and clock signal Ext.CLKB supplied to clock input terminal 11; an EXOR circuit 3h receiving output signals of AND circuits 3f and 3g; an inverter 3i inverting an output signal CLKA of EXOR circuit 3h; a selector (MUX) 3j for selecting one of output signal CLKA of EXOR circuit 3h and external clock signal Ext.CLK from clock input terminal 10 in accordance with test mode instruction signal TM; a selector (MUX) 3k for selecting one of an output signal of inverter 3i and clock signal Ext.CLKB from clock input terminal 11 in accordance with test mode instruction signal TM; a one-shot pulse generating circuit 3m for generating a one-shot pulse signal in response to the rising edge of an output signal of selector 3j; and a one-shot pulse generating circuit 3n for generating a one-shot pulse signal in response to the rising edge of an output signal of selector 3i.

Internal clock signals CLK and CLKP are generated from one-shot pulse generating circuit 3m and internal clock signal CLKN is generated from one-shot pulse generating circuit 3n. A one-shot pulse generating circuit may be provided for each of internal clock signals CLK and CLKP.

Figure 6:
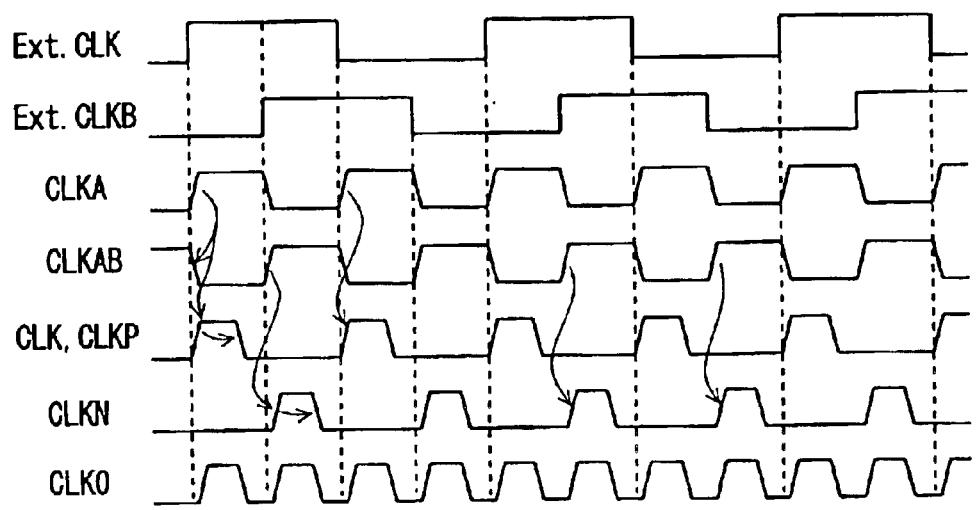
FIG. 6 is a timing chart representing an operation of the internal clock generating circuit illustrated in FIG. 5.

In the normal operation mode, test mode instruction signal TM is at the L level and in an inactive state, output signals of AND circuits 3f and 3g are fixed at the L level, and an output signal of EXOR circuit 3h is also fixed at the L level. In this state, selectors 3j and 3k select external clock signals Ext.CLK and Ext.CLKB supplied to clock input terminals 10 and 11 and supply the selected signals to one-shot pulse generating circuits 3m and 3n, respectively. Therefore, in the normal operation mode, internal clock signals CLK and CLKP are generated synchronously with the rising edge of external clock signal Ext.CLK. On the other hand, internal clock signal CLKN is generated in response to the rising edge of complementary external clock signal Ext.CLKB. Now, the operation in the test operation mode of the internal clock signal generating circuit shown in FIG. 5 will be described with reference to the timing chart of FIG. 6.

In the test mode, clock signals Ext.CLK and Ext.CLKB the same in frequency but shifted in phase from each other by a ¼ cycle are supplied to clock input terminals 10 and 11. Selectors 3j and 3k are set in a state of selecting clock signal CLKA from EXOR circuit 3h and clock signal CLKAB from inverter 3i, respectively, in accordance with test mode instruction signal TM. When test mode instruction signal TM is at the H level, AND circuits 3f and 3g operate as buffer circuits.

EXOR circuit 3h outputs an H-level signal when the logic levels of external clock signals Ext.CLK and Ext.CLKB are different from each other. Therefore, clock signal CLKA from EXOR circuit 3h has a frequency twice as high as that of external clock signal Ext.CLK, and goes high and remains at H-level for a period of the ¼ cycle of external clock signal Ext.CLK synchronously with the rising and falling edges of external clock signal Ext.CLK. Inverter 3i inverts clock signal CLKA to generate clock signal CLKAB.

One-shot pulse generating circuit 3m generates a one-shot pulse signal in response to the rising edge of clock signal CLKA. On the other hand, one-shot pulse generating circuit 3n generates a one-shot pulse signal in response to the rising edge of clock signal CLKAB. Therefore, internal clock signals CLK and CLKP are each generated synchronously with the rising and falling edges of external clock signal Ext.CLK, and internal clock signal CLKN is generated synchronously with the rising and falling edges of complementary internal clock signal Ext.CLKB.

Each of internal clock signals CLK, CLKP, and CLKN has a frequency twice as high as that of external clock signal Ext.CLK, and the phase of internal clock signals CLK and CLKP are shifted from that of internal clock signal CLKN by a ¼ cycle of external clock signal. Therefore, every ¼ cycle of external clock signal Ext.CLK, internal clock signals CLKP and CLKN are alternately generated. By combining internal clock signals CLKP and CLKN, output clock signal CLKO having a frequency four times as high as that of clock signal Ext.CLK can be generated.

In the case of the configuration of the internal clock generating circuit shown in FIG. 5, it is sufficient to prepare a circuit for normally generating a one-shot pulse in response to the rising edge of a clock signal as a one-shot pulse generating circuit. It is unnecessary to separately provide a circuit for generating a one-shot pulse synchronously with both the rising and falling edges. In the test mode, clock signals CLKA and CLKAB each having a frequency twice as high as that of external clock signal Ext.CLK are simply generated synchronously with external clock signals Ext.CLK and Ext.CLKB. Therefore, a circuit occupying area can be reduced, and a high-speed internal clock signal can be generated from a low-speed external clock signal to operate the semiconductor memory device in the DDR mode in the test mode.

Only in the test mode, the circuit portion for generating a double-speed clock signal CLKA in accordance with the external clock signal is operated. In the normal operation mode, the operation of the circuit portion for generating double-speed clock signal CLKA is stopped. Thus, current consumption in the normal operation mode can be reduced.

Third Embodiment

Figure 7:
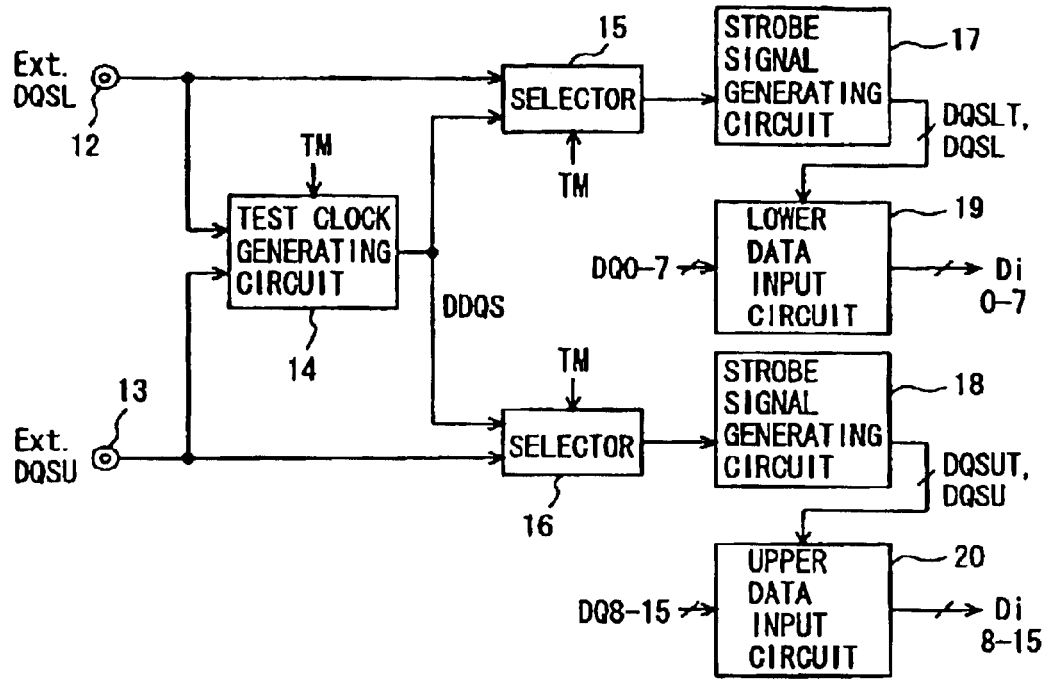
FIG. 7 is a diagram schematically showing the configuration of a data strobe signal generating section according to a third embodiment of the invention.

FIG. 7 is a diagram schematically showing the configuration of a main portion of a semiconductor memory device according to a third embodiment of the invention. FIG. 7 schematically shows the configuration of a data input section. As an internal clock signal, in the test mode, a clock signal having a frequency twice as high as that of an external clock signal is generated. The semiconductor memory device inputs/outputs, as an example, 16-bit data DQ0 to DQ15.

Usually, in such a semiconductor memory device for inputting/outputting 16-bit data, a data strobe signal Ext.DQSU is supplied to a terminal 13 from the outside of the memory device for upper byte data, and a data strobe signal Ext.DQSL is supplied from the outside of the memory device to a terminal 12 for lower byte data. According to external data strobe signals Ext.DQSL and Ext.DQSU, data is strobed or taken in and internal write data is generated. Consequently, without considering a skew occurring between a clock signal and write data, data supplied according to the strobe signal can be taken in to generate internal write data with accuracy.

In the instant embodiment, a strobe signal in the test mode is generated by using these data strobe signal input terminals 12 and 13.

The semiconductor memory device includes: a test clock generating circuit 14 activated, when test mode instruction signal TM is active, to generate a double-speed data strobe signal DDQS from data strobe signals Ext.DQSL and Ext.DQSU supplied to terminals 12 and 13; a selector 15 for selecting one of double-speed data strobe signal DDQS and external data strobe signal Ext.DQSL supplied via terminal 12 in accordance with test mode instruction signal TM; a selector 16 for selecting one of double-speed data strobe signal DDQS and external data strobe signal Ext.DQSU supplied via terminal 13 in accordance with test mode instruction signal TM; a strobe signal generating circuit 17 for generating data strobe signal DQSL in accordance with an output signal of selector 15; and a strobe signal generating circuit 18 for generating an upper data strobe signal DQSU in accordance with the strobe signal supplied via selector 16.

When test mode instruction signal TM is active, selectors 15 and 16 select double-speed data strobe signal DDQS from test clock generating circuit 14.

An upper data input circuit 20 provided for upper byte data DQ8 to DQ15 receives data bits supplied externally in accordance with upper data strobe signal DQSU from strobe signal generating circuit 18 and generates internal write data Di8 to Di15. A lower data input circuit 19 provided for lower byte data DQ0 to DQ7 takes in and latches the data bits DQ0 to DQ7 in accordance with lower data strobe signal DQSL from strobe signal generating circuit 17 and generates internal write data Di0 to Di7.

Strobe signal generating circuits 17 and 18 further generate transfer/latch instruction signals DQSLT and DQSUT determining the timing of transferring internal write data, respectively.

Figure 8:
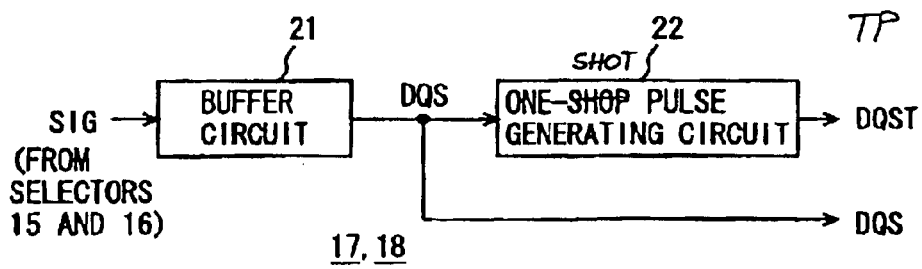
FIG. 8 is a diagram schematically showing an example of the configuration of a strobe signal generating circuit illustrated in FIG. 7.

FIG. 8 is a diagram schematically showing the configuration of strobe signal generating circuits 17 and 18 illustrated in FIG. 7. Since strobe signal generating circuits 17 and 18 have the same configuration, the configuration of one of them is representatively shown in FIG. 8. In FIG. 8, each of strobe signal generating circuits 17 and 18 includes: a buffer circuit 21 for buffering a signal SIG supplied from selector 15 or 16 and generating an inner strobe signal DQS; and a one-shot pulse generating circuit 22 for generating a one-shot pulse signal in response to the falling edge of internal strobe signal DQS from buffer circuit 21 and generating transfer/latch instruction signal DQST.

In lower data input circuit 19 and upper data input circuit 20, data bits DQ0 to DQ15 each serially supplied via a corresponding data input terminal is converted into parallel data. The timing of taking in the serial data is determined by data strobe signal DQS and the timing of transferring the taken in 2-bit data is determined by transfer/latch instruction signal DQST.

Figure 9:
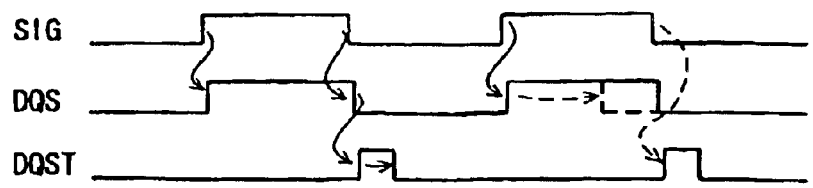
FIG. 9 is a timing chart representing an operation of the strobe signal generating circuit illustrated in FIG. 8.

Therefore, as shown in FIG. 9, buffer circuit 21 generates internal data strobe signal DQS in accordance with signal SIG from selector 15 or 16, and one-shot pulse generating circuit 22 generates transfer/latch instruction signal DQST in response to the falling edge of internal data strobe signal DQS. However, as shown by a broken line in FIG. 9, internal strobe signal DQS may be generated in the form of a one-shot pulse in response to output signal SIG of the corresponding selector, and transfer/latch instruction signal DQST may be generated in the form of a one-shot pulse in response to the falling edge of output signal SIG of the corresponding selector.

Figure 10:
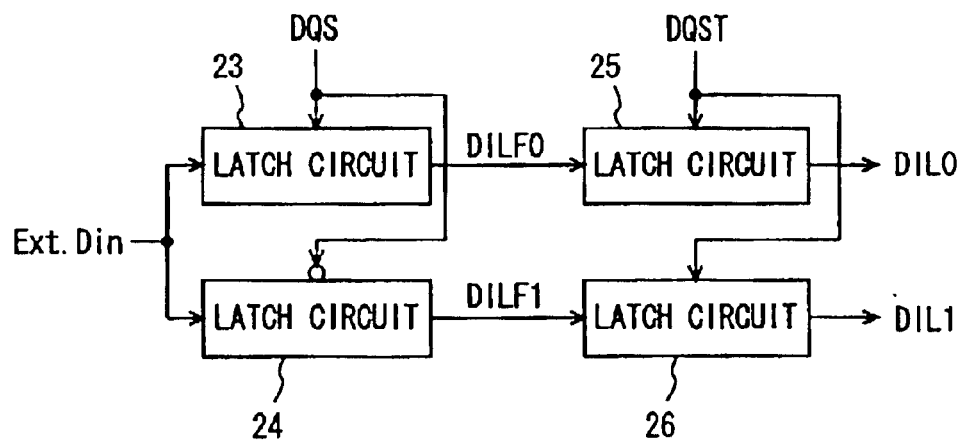
FIG. 10 is a diagram schematically showing the configuration of an input circuit illustrated in FIG. 7.

FIG. 10 is a diagram schematically showing the configuration of a one-bit input circuit of lower data input circuit 19 and upper data input circuit 20 illustrated in FIG. 7. In FIG. 10, the input circuit includes: a latch circuit 23 for taking in and latching external data bit Ext.Din in response to the rising edge of data strobe signal DQS; a latch circuit 24 for taking in and latching an external write data bit Ext.Din in response to the falling edge of data strobe signal DQS; and latch circuits 25 and 26 for latching and transferring data bits DILF0 and DILF1 supplied from latch circuits 23 and 24 in accordance with transfer/latch instruction signal DQST.

Output data bits DIL0 and DIL1 of latch circuits 25 and 26 are transmitted in parallel or at the same time on different internal data bus lines.

Usually, an internal write data line (when it is assumed that bus lines through which DIL0 and DEL1 are transmitted are internal write data bus lines) to which external write data bit Ext.Din is transferred is determined by an address signal. However, the configuration of a section of determining the correspondence between external write data bit Ext.Din and internal write data bits DIL0 and DELL is not shown to simplify the drawing. In the configuration of determining the correspondence in accordance with the address signal, for example, data strobe signal DQS is modified by an address signal bit and the latching order of latch circuits 23 and 24 is updated according to whether the address signal is an even or an odd. The order can be updated by, for example, taking an EXOR between data strobe signal DQS and the address signal bit. Alternatively, a multiplexer for switching a connection route in accordance with an address signal may be provided between latch circuits 25 and 26 and the internal write data bus lines. In any of the configurations, the corresponding relationship between the data bus line through which external write data Ext.Din is transferred and external data bit Ext.Din is determined by an address signal.

Figure 11:
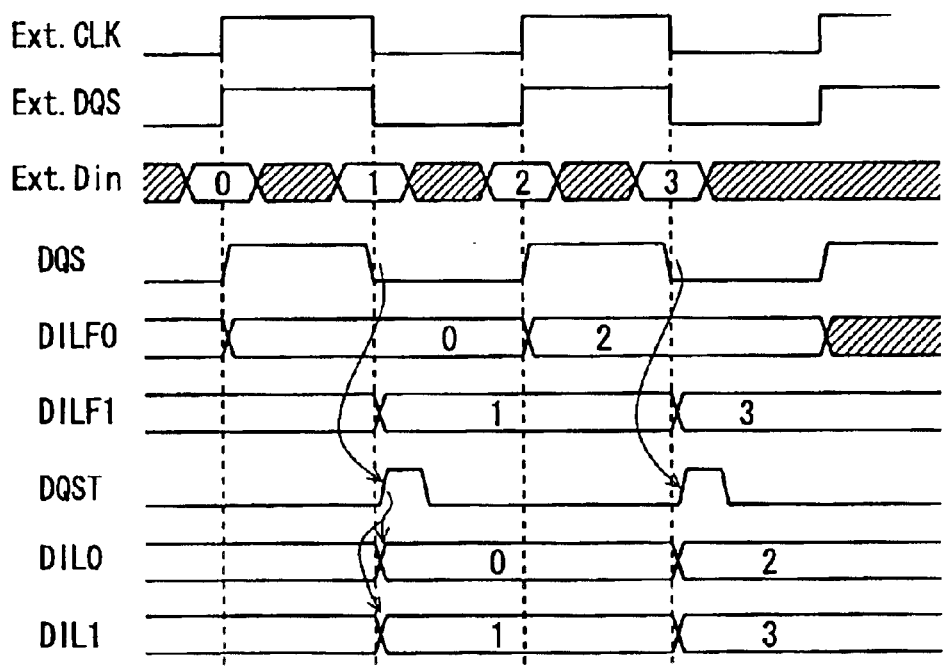
FIG. 11 is a timing chart representing an operation of an input circuit illustrated in FIG. 10.

FIG. 11 is a timing chart representing an operations of the input circuit illustrated in FIG. 10. Referring to FIG. 11, the operation of the input circuit shown in FIG. 10 will be briefly described in the following.

Synchronously with the rising and falling edges of external data strobe signal Ext.DQS, external write data Ext.Din is supplied. On the inside of the memory device, in the normal operation mode, internal data strobe signal DQS is generated in accordance with external data strobe signal Ext.DQS. Synchronously with the rising edge of internal data strobe signal DQS, latch circuit 23 takes in external write data Ext.Din and enters a latch state in response to the falling edge of external data strobe signal DQS. On the other hand, latch circuit 24 enters a through state in response to the falling edge of external data strobe signal DQS, takes in external write data Ext.Din (1), and enters a latch state in response to the rising edge of external data strobe signal Ext.DQS.

In response to the falling edge of internal data strobe signal DQS, transfer/latch instruction signal DQST is generated. When transfer/latch instruction signal DQST goes high, latch circuits 25 and 26 takes in internal latch data DILF0 and DEFL1 supplied from corresponding latch circuits 23 and 24 and enter the latch state. Therefore, according to transfer/latch instruction signal DQST, data DIL0 and DIL1 are output from latch circuits 25 and 26 in parallel.

Subsequently, when internal data strobe signal DQS goes high again, latch circuit 23 enters a through state, takes in external write data Ext.Din, and enters the latch state. Latch circuit 24 takes in and latches again external write data Ext.Din in response to the falling edge of internal data strobe signal DQS. In response to the falling edge of internal data strobe signal DQS, transfer/latch instruction signal DQST is generated in the form of a one-shot pulse signal, and latch circuits 25 and 26 output the taken-in data in parallel.

Therefore, synchronously with the rising and falling edges of external data strobe signal Ext.DQS, external write data Ext.Din is transferred in series, the serially transferred data is converted to parallel data by internal latch circuits 23 to 26, and the parallel data is transmitted on a 2-bit basis to selected memory cells. External data strobe signal Ext.DQS is a signal having the same frequency as that of an external clock. Therefore, by generating double-speed data strobe signal DDQS from the external data strobe signal, data can be input at a speed four times as fast as the external clock signal.

Data strobe signal DQS determines the operating timing of a portion related to data strobe. An internal clock signal, which determines the operating speed of the internal circuit, is generated in accordance with the external clock signal and has a speed twice as high as that of the external clock signal. Thus, the internal circuit operates at a speed twice as high as that of the external clock signal.

Figure 12:
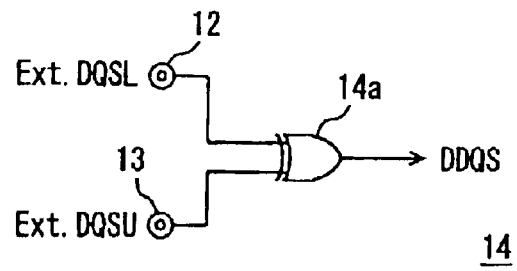
FIG. 12 is a diagram schematically showing the configuration of a double-speed data strobe signal generating unit in the third embodiment of the invention.

FIG. 12 is a diagram showing an example of the configuration of test clock generating circuit 14 illustrated in FIG. 7. In FIG. 12, test clock generating circuit 14 includes an EXOR circuit 14a receiving strobe signals Ext.DQSL and Ext.DQSU supplied to data strobe input terminals 12 and 13 and generating a double-speed data strobe signal DDQS. In the test mode, the signals Ext.DQSU and Ext.DQSL the same in phase and frequency but shifted in phase from each other by a ¼ cycle are supplied to terminals 12 and 13. Therefore, double-speed data strobe signal DDQS has a frequency twice as high as that of each of external signals Ext.DQSL and Ext.DQSU.

Figure 13:
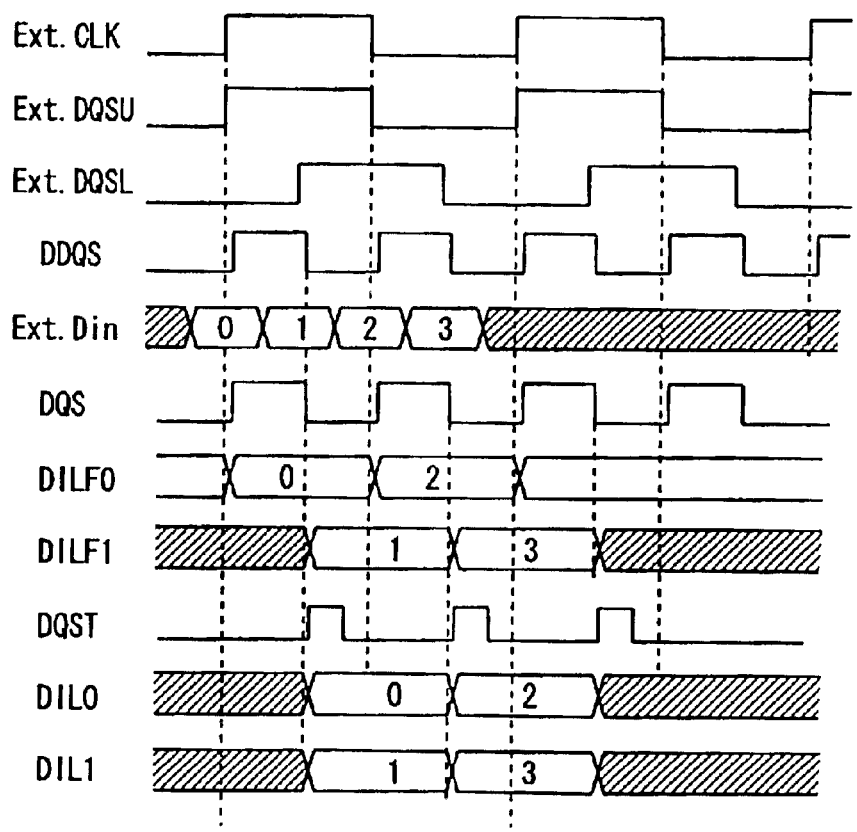
FIG. 13 is a timing chart representing an operation of the semiconductor memory device according to the third embodiment of the invention.

FIG. 13 is a timing chart representing an operation in a test operation mode of the circuit illustrated in FIG. 7. Referring to FIG. 13, the operations of the circuits shown in FIGS. 7, 8, 10, and 12 will be described in the following.

In the test operation mode, in data writing operation, external data strobe signals Ext.DQSU and Ext.DQSL shifted in phase from each other by a ¼ cycle are supplied to terminals 12 and 13. The strobe signals Ext.DQSU and Ext.DQSL are signals having the same frequency as that of external clock signal Ext.CLK, and external data strobe signal Ext.DQSU is applied in the same phase as that of external clock signal Ext.CLK.

Therefore, double-speed data strobe signal DDQS from EXOR circuit 14a goes high and is kept at H-level for a period of the ¼ cycle of external clock signal Ext.CLK synchronously with the rising and falling edges of external data strobe signal Ext.DQSU. Synchronously with the rising and falling edges of external data strobe signals Ext.DQSU and Ext.DQSL, external write data Ext.Din is supplied.

In the semiconductor memory device, in the test operation mode, internal data strobe signal DQS and transfer/latch instruction signal DQST are generated in accordance with double-speed data strobe signal DDQS. Therefore, when data signal Ext.Din is supplied at a speed four times as fast as that of external clock signal Ext.CLK, according to internal data strobe signal DQS, latch circuits 23 and 24 shown in FIG. 10 alternately take in and latch the supplied data. Subsequently, transfer/latch instruction signal DQST is generated in the form of a one-shot pulse in response to the falling edge of internal data strobe signal DQS, and the data latched by latch circuits 23 and 24 are transmitted to the internal write data lines.

Therefore, in the test mode, by shifting the phases of the signals Ext.DQSL and Ext.DQSU to be supplied to strobe terminals 12 and 13 from each other by a ¼ cycle, double-speed data strobe signal DDQS can be generated. Even when data is supplied from an external tester in accordance with external data strobe signals Ext.DQSU and Ext.DQSL, internal data strobe signal DQS can be changed at a speed twice as fast as that of external clock signal. Accordingly, data supplied at a quadruple speed can be internally taken in accurately and transferred to selected memory cells.

It can be assumed that, when the tester cannot perform high-speed data transfer, external write data Ext.Din cannot be generated at a speed four times as fast as that of the external dock signal. However, in the case of a test data pattern other than a checker pattern in which the logic level of data varies bit by bit, when data is transferred synchronously with the rising and falling edges of external clock signal Ext.CLK and the same data is strobed in the semiconductor memory device, a test can be performed.

Alternately, by providing two data output circuits in parallel in the tester and causing the two data output circuits to operate synchronously with the rising and falling edges of data strobe signals Ext.DQSU and Ext.DQSL, respectively, data can be transferred at a quadruple speed. Further, as will be described, by generating write data in the semiconductor memory device, a data series of a quadruple-speed of the external clock signal can be easily generated.

In reading data, output clock signal CLKO is transferred as data strobe signals Ext.DQSL and Ext.DQSU from the semiconductor memory device to the tester. Therefore, since the tester takes in data supplied synchronously with output clock signal CLKO, the tester can easily sample the data transferred from the semiconductor memory device. Therefore, in the tester, it is unnecessary to provide a special structure for reading in data at high speed.

Modification

Figure 14:
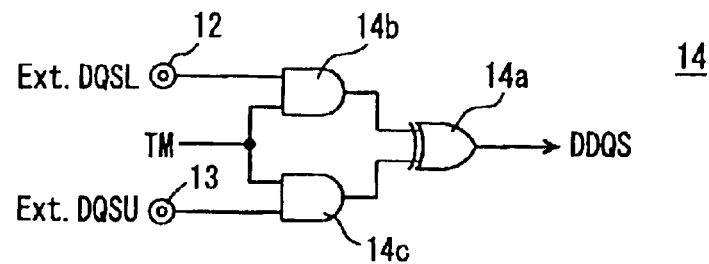
FIG. 14 is a diagram showing the configuration of a modification of the third embodiment of the invention.

FIG. 14 is a diagram showing a modification of the configuration of test clock generating circuit 14 of the third embodiment of the invention. In FIG. 14, test clock generating circuit 14 includes: an AND circuit 14b receiving the signal Ext.DQSL supplied to terminal 12 and test mode instruction signal TM; an AND circuit 14c receiving the signal Ext.DQSU supplied to terminal 13 and test mode instruction signal TM; and an EXOR circuit 14a receiving output signals of AND circuits 14b and 14c and generating a double-speed data strobe signal DDQS.

In the configuration of test clock generating circuit 14 shown in FIG. 14, when test mode instruction signal TM is at the L level, output signals of AND circuits 14b and 14c are at the L level, and double-speed data strobe signal DDQS maintains the L level. Since the operation of test clock generating circuit 14 is stopped in the normal operation mode, power consumption in the normal operation mode can be reduced.

In the test mode, test mode instruction signal TM is at the H level, AND circuits 14b and 14c operate as buffer circuits and generate signals in accordance with external data strobe signals Ext.DQSU and Ext.DQSL, respectively. From EXOR circuit 14a, double-speed data strobe signal DDQS is generated.

As described above, according to the third embodiment of the invention, in the configuration where two terminals for receiving external strobe signals are disposed, by applying signals the same in frequency but shifted in phase from each other by a ¼ cycle to the two terminals and using the signals, the data strobe signal twice as fast as the external clock signal can be easily generated. Without disposing an extra terminal, data can be input at a speed four times as fast as the external clock signal, and the semiconductor memory device with the DDR mode can be operated to perform data input at high speed by using a low-speed tester.

Fourth Embodiment

Figure 15:
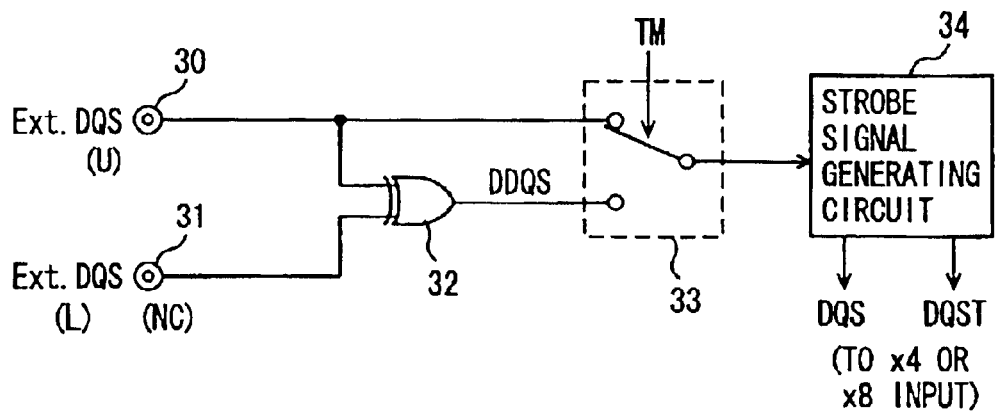
FIG. 15 is a diagram schematically showing the configuration of a fourth embodiment of the invention.

FIG. 15 is a diagram schematically showing the configuration of a main portion of a semiconductor memory device according to a fourth embodiment of the invention. Usually, in a semiconductor memory device having a word configuration of ×4 bits or ×8 bits, as a terminal for receiving a strobe signal applied from the outside of the memory device, one strobe terminal 30 is provided. One external data strobe signal Ext.DQS common to data bits is supplied to terminal 30. According to data strobe signal Ext.DQS, strobe signal generating circuit 34 generates internal data strobe signal DQS and transfer/latch instruction signal DQST onto a data input circuit having a width of ×4 bits or ×8 bits.

In the semiconductor memory device, a terminal 31 which is kept in a no connection (NC) state (open state) in a normal operation mode is used. External data strobe signal Ext.DQS in the normal operation mode supplied to terminal 30 is used as an external data strobe signal Ext.DQSU in the test operation mode. A signal applied to terminal 31 in the test mode is used as external data strobe signal Ext.DQSL. Terminals 30 and 31 are coupled to an EXOR circuit 32. One of an output signal of EXOR circuit 32 and external data strobe signal Ext.DQS supplied to terminal 30 is selected by a selector 33 and supplied to a strobe signal generating circuit 34.

The configuration of strobe signal generating circuit 34 is the same as that shown in FIG. 8. Generated internal data strobe signal DQS and transfer/latch instruction signal DQST are transferred commonly to the data input circuit having the ×4 bits or ×8 bits width.

In the case of the configuration shown in FIG. 15, when only one external data strobe signal is used as external data strobe signal Ext.DQS in the normal operation mode. In the test mode, terminal 31 which is kept in the no-connection state (open state) in the normal operation mode is used, and signals the same in frequency but shifted in phase from each other by the ¼ cycle are supplied to terminals 30 and 31. Consequently, from EXOR circuit 32, in a manner similar to the foregoing third embodiment, double-speed data strobe signal DDQS can be generated and supplied to strobe signal generating circuit 34 via selector 33.

Thus, in a manner similar to the third embodiment, data strobe signal DDQS which is twice as fast as that of external data strobe signal Ext.DQS can be generated, and quadruple-speed data input can be achieved.

Selector 33 selects double-speed data strobe signal DDQS from EXOR circuit 32 in the test mode in accordance with test mode instruction signal TM. In the normal operation mode, selector 33 selects external data strobe signal Ext.DQS supplied to terminal 30.

Modification

Figure 16:
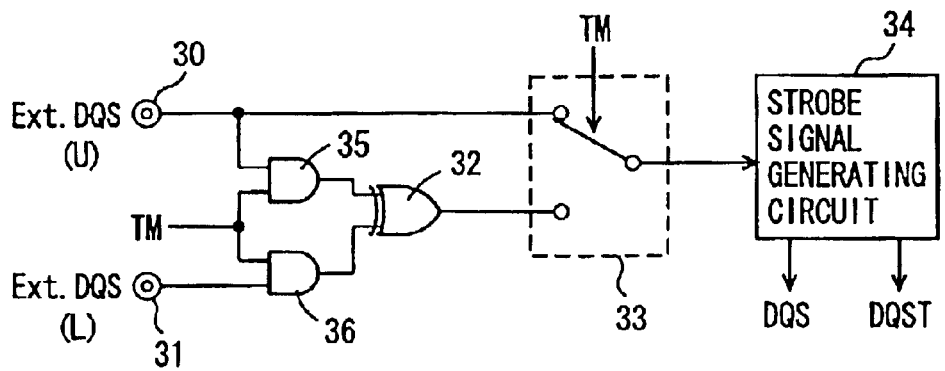
FIG. 16 is a diagram schematically showing the configuration of a modification of the fourth embodiment of the invention.

FIG. 16 is a diagram schematically showing the configuration of a modification of the fourth embodiment of the invention. In FIG. 16, at the preceding stage of EXOR circuit 32, an AND circuit 35 receiving a signal supplied to terminal 30 and test mode instruction signal TM and an AND circuit 36 receiving a signal supplied to terminal 31 and test mode instruction signal TM are provided. Output signals of AND circuits 35 and 36 are supplied to EXOR circuit 32. The other configuration is the same as that shown in FIG. 15. The corresponding parts are designated by the same reference numerals and their detailed description will not be repeated.

In the configuration shown in FIG. 16, terminal 31 is held in an open state (no-connection state) in the normal operation mode. However, in the normal operation mode, test mode instruction signal TM is set to L level to fix output signals of AND circuits 35 and 36 to the L level. Thus, the output signal of AND circuit 36 can be fixed at the L level with reliability even when terminal 31 enters a floating state in the normal operation mode. Also in the configuration shown in FIG. 16, power consumption in the normal operation mode can be reduced.

As described above, according to the fourth embodiment of the invention, in the case where there is only one data strobe signal input terminal available, a terminal, which is in the open state and is not used in the normal operation mode, is used to receive a signal the same in frequency but shifted in phase by ¼ cycle relative to the signal at the strobe terminal in the test mode. The double-speed data strobe signal can be generated without using a dedicated terminal, and data can be input at a speed quadruple to the external clock signal.

Fifth Embodiment

Figure 17:
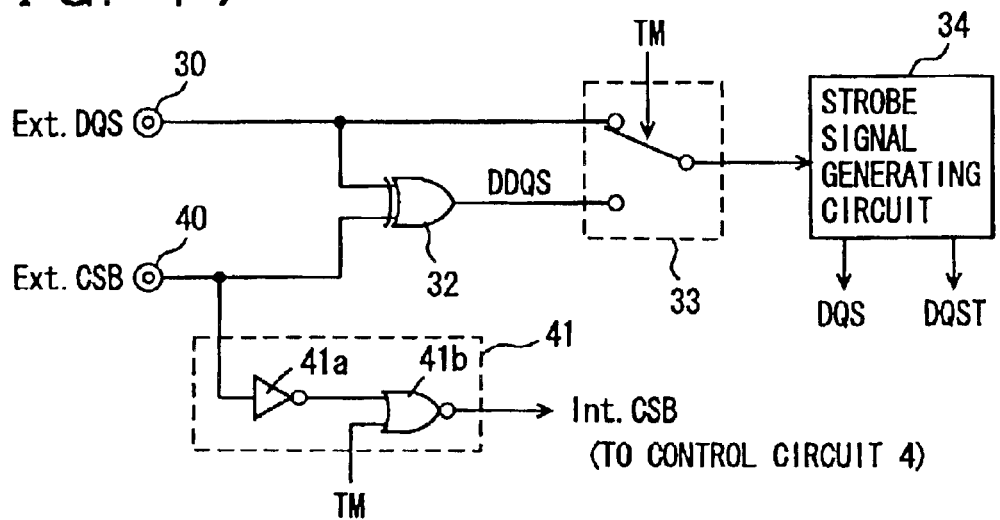
FIG. 17 is a diagram schematically showing the configuration of a fifth embodiment of the invention.

FIG. 17 is a diagram schematically showing the configuration of a main portion of a semiconductor memory device according to a fifth embodiment of the invention. Also in the configuration shown in FIG. 17, similarly to the foregoing third embodiment, strobe signal generating circuit 34 is provided commonly to the data input circuit inputting data of a plurality of bits, and external data strobe signal Ext.DQS is supplied to terminal 30 in the normal operation mode and the test operation mode.

To generate a test clock signal, EXOR circuit 32 which receives the signals applied to terminals 30 and 40 and selector 33 for selecting one of a signal Ext.DQS(U) on terminal 30 and output signal DDQS of EXOR circuit 32 and supplying the selected one to strobe signal generating circuit 34 are provided.

To terminal 40, an external chip select signal Ext.CSB for setting the semiconductor memory device in a selected state is supplied in the normal operation mode. External chip select signal Ext.CSB is a signal which is at the L level in the selected state. When chip select signal Ext.CSB is at the H level, the semiconductor memory device is in a non-selected state, a command for instructing an operation mode supplied externally is dealt as a NOP (no operation) command, and a new operation is not performed.

In order to use chip select terminal 40 as a terminal for generating a double-speed data strobe signal in the test mode, test mode instruction signal TM is supplied to a CS buffer 41 for generating an internal chip select signal Int.CSB. In the test mode, internal chip select signal Int.CSB is always set to the L level irrespective of the state of the signal of chip select terminal 40, and the semiconductor memory device is held in a selected state.

CS buffer 41 includes: an inverter 41a for inverting a signal on chip select terminal 40; and an NOR circuit 41b receiving an output signal of inverter 41a and test mode instruction signal TM and generating internal chip select signal Int.CSB.

In CS buffer 41, since test mode instruction signal TM is at the L level in the normal operation mode, NOR circuit 41b operates as an inverter, and internal chip select signal Int.CSB is generated according to external chip select signal Ext.CSB and supplied to control circuit 4 shown in FIG. 1. On the other hand, in the test mode, test mode instruction signal TM is kept at the H level, so that internal chip select signal Int.CSB from NOR circuit 41b is kept at the L level. In the test mode, since the chip select signal is always in an active state, control circuit 4 takes in an external control signal at the rising edge of the internal clock signal and determines whether a new operation mode is designated or not.

Specifically, in control circuit 4, internal chip select signal Int.CSB is supplied to a command decoder which receives a set of control signals from the outside of the memory device. When internal chip select signal Int.CSB is at the L level, the command decoder determines the set of logic levels of the external control signals at the rising edge of the internal clock signal and identifies the designated operation mode.

EXOR circuit 32 generates double-speed data strobe signal DDQS in a manner similar to the foregoing third embodiment. Consequently, also in the case where only one data strobe terminal 30 exists, by applying the signals of the same frequency whose phases are shifted from each other by the ¼ cycle to terminals 30 and 40 in the test mode by using chip select terminal 40, double-speed data strobe signal DDQS having a frequency twice as high as that of external data strobe signal Ext.DQS can be generated.

The operation timing chart in the test mode of the circuit shown in FIG. 17 is the same as that shown in FIG. 13. It is merely required to use external chip select signal Ext.CSB in place of external data strobe signal Ext.DQSL.

In the configuration shown in FIG. 17 as well, as shown in FIG. 16, AND circuits 35 and 36 may be disposed at the preceding stage of EXOR circuit 32.

As described above, according to the fifth embodiment of the invention, the data strobe terminal and chip select terminal are used to receive signals whose phases are shifted from each other by the ¼ cycle to these terminals in the test mode. Thus, the internal data strobe signal having a frequency twice as high as that of external data strobe signal can be easily generated. Data can be input in the test mode synchronously with the double-speed internal clock signal, that is, at both the rising and falling edges of the data strobe signal.

Sixth Embodiment

Figure 18:
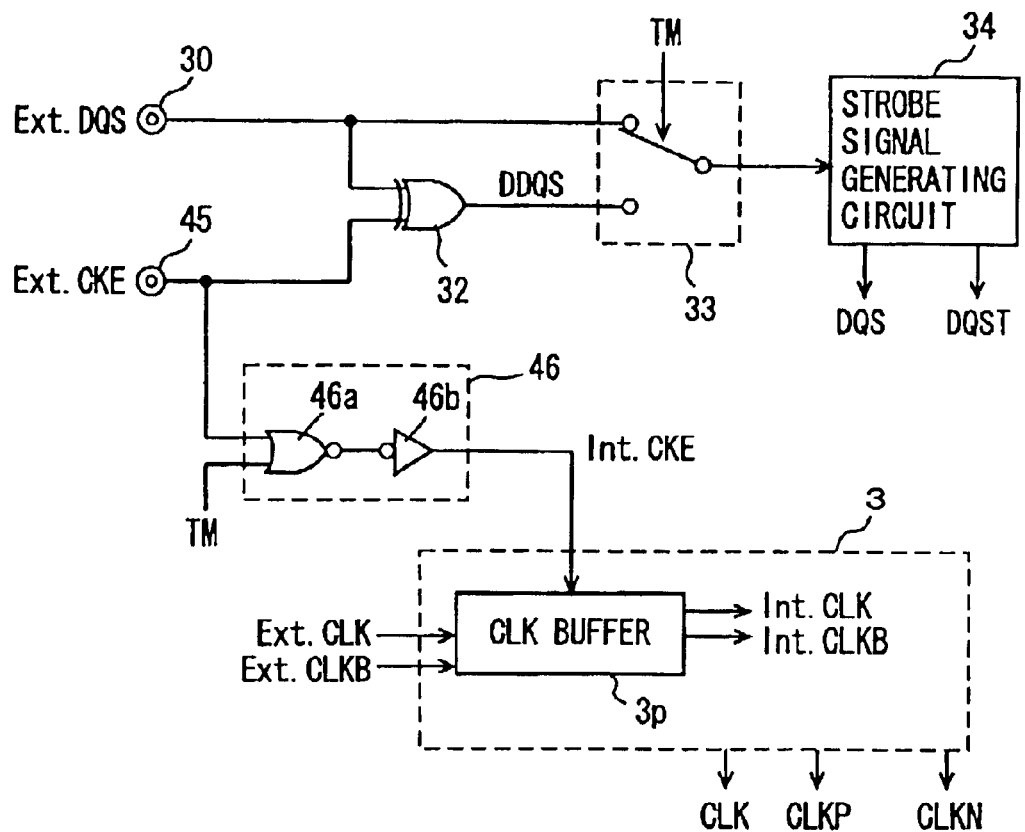
FIG. 18 is a diagram schematically showing the configuration of a sixth embodiment of the invention.

FIG. 18 is a diagram schematically showing the configuration of a main portion of a semiconductor memory device according to a sixth embodiment of the invention. In FIG. 18, EXOR circuit 32 for generating double-speed data strobe signal DDQS receives external data strobe signal Ext.DQS supplied to terminal 30 and external clock enable signal Ext.CKE supplied applied to a terminal 45. Double-speed data strobe signal DDQS from EXOR circuit 32 is supplied to strobe signal generating circuit 34 via selector 33.

External clock enable signal Ext.CKE supplied to terminal 45 controls generation of an internal clock signal. When clock enable signal Ext.CKE is at the H level, the internal clock signal is generated according to the external clock signal. On the other hand, when external clock enable signal Ext.CKE is at the L level and in an inactive state, generation of an internal clock signal is stopped.

A CKE buffer 46 for generating internal clock enable signal Int.CKE includes an NOR gate 46a receiving test mode instruction signal TM and external clock enable signal Ext.CKE supplied to terminal 45, and an inverter 46b inverting an output signal of NOR gate 46a to generate internal clock enable signal Int.CKE. CKE buffer 46 generates internal clock enable signal Int.CKE in accordance with external clock enable signal Ext.CKE in the normal operation mode. In the test mode, CKE buffer 46 fixedly maintains internal clock enable signal Int.CKE at the H level of the active state.

Internal clock enable signal Int.CKE is supplied to a CLK buffer 3p included in internal clock generating circuit 3. When activated, CLK buffer 3p buffers external clock signals Ext.CLK and Ext.CLKB to generate internal clock signals Int.CLK and Int.CLKB. According to internal clock signals Int.CLK and Int.CLKB, as in the circuit configuration shown in FIGS. 3 and 5, internal clock signals CLK, CLKP, and CLKN are generated. Therefore, buffered internal clock signals Int.CLK and Int.CLKB output from CLK buffer 3p are supplied in place of external clock signals Ext.CLK and Ext.CLKB shown in FIGS. 3 and 5, respectively, and internal clock signals are generated.

In the case of the configuration shown in FIG. 18, in the test mode, clock signals of two phases shifted from each other by the ¼ cycle of the data strobe signal (external clock signal) are supplied to terminals 30 and 45. Therefore, in a manner similar to the foregoing third embodiment, according to signals supplied to terminals 30 and 45, EXOR circuit 32 generates double-speed data strobe signal DDQS. In the test mode, internal clock enable signal Int.CKE is always at the H level of the active state, and buffered internal clock signals Int.CLK and Int.CLKB are generated according to external clock signals Ext.CLK and Ext.CLKB. Consequently, according to buffered internal clock signals Int.CLK and Int.CLKB, internal clock signals CLK, CLKP, and CLKN each twice as fast as the external clock signal can be generated in the test mode.

In the case of operating the internal circuit at a speed twice as fast as that of external clock signal Ext.CLK, double-speed data strobe signal DDQS is generated in accordance with signals shifted in phase from each other by the ¼ cycle and applied to terminals 30 and 45. Data can be input at a speed four times as fast as external clock signal Ext.CLK (external data strobe signal Ext.DQS) without using a dedicated terminal in the test mode. Also in the case where the clock enable signal terminal is used to generate the data strobe signal by forcing the internal clock enable signal forcedly into an active state in the test operation mode, the internal clock signal can be generated according to the external clock signal with reliability.

The operation in the test operation mode of the circuit shown in FIG. 18 is represented according to the timing chart of FIG. 13. To be specific, in place of signal Ext.DQSL in FIG. 13, external clock enable signal Ext.CKE is used.

As described above, according to the sixth embodiment of the invention, signals the same in frequency but sifted in phase from each other by a ¼ cycle are applied to the data strobe terminal and the clock enable terminal in the test mode. Thus, a data strobe signal which is twice as fast as the external data strobe signal can be easily generated. Accordingly, without increasing the number of terminals, a data input circuit can be easily operated at a speed four times as fast as the external clock signal. By maintaining the internal clock enable signal always in the active state in the test mode, according to external clock signals Ext.CLK and Ext.CLKB, double-speed internal clock signals CLK, CLKP, and CLKN can be generated. Consequently, without exerting an adverse influence on the operation of generating the internal clock signal, a double-speed data strobe signal can be generated.

In the case of testing a clock masking operation while stopping the generation of the internal clock signal, another test mode instruction signal is generated and internal clock enable signal Int.CKE is generated according to external clock enable signal Ext.CKE. Therefore, test mode instruction signal TM is held in the active state in the test mode in which the data input/output circuit is operated at the quadruple speed of the external clock signal.

Seventh Embodiment

Figure 19:
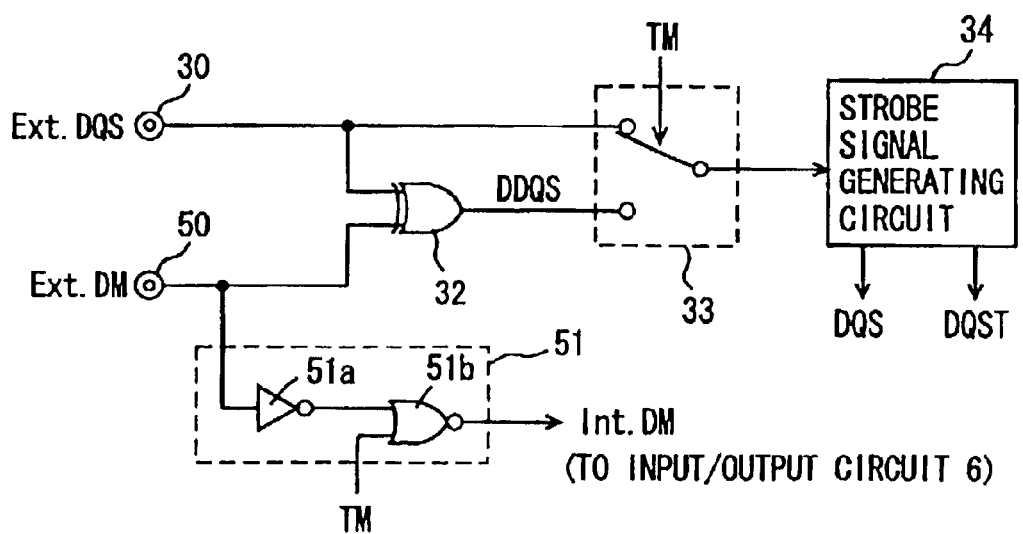
FIG. 19 is a diagram schematically showing the configuration of a seventh embodiment of the invention.

FIG. 19 is a diagram showing the configuration of a data strobe signal generating unit according to a seventh embodiment of the invention. In the configuration shown in FIG. 19, in the test mode, EXOR circuit 32 receives signals whose phases are shifted from each other by the ¼ cycle via terminals 30 and 50. To terminal 30, external data strobe signal Ext.DQS is applied. To terminal 50, in the normal operation mode, external data mask signal Ext.DM for instructing masking of data is applied. In the normal operation mode, according to external data mask signal Ext.DM on terminal 50, an internal data mask signal Int.DM is generated by a DM buffer 51. Internal data mask signal Int.DM is applied to input/output circuit 6 shown in FIG. 1.

DM buffer 51 includes an inverter 51a for inverting a signal on terminal 50 and an NOR circuit 51b receiving an output signal of inverter 51a and test mode instruction signal TM and generating internal data mask signal Int.DM.

In the normal operation mode, test mode instruction signal TM is at the L level, NOR circuit 51*b* operates as an inverter circuit, and internal data mask signal Int.DM is generated according to external data mask signal Ext.DM applied to terminal 50. On the other hand, when test mode instruction signal TM turns H level, internal data mask signal Int.DM output from NOR circuit 51*b* turns L level, and data masking is not performed.

Double-speed data strobe signal DDQS output from EXOR circuit 32 is applied to strobe signal generating circuit 34 via selector 33.

As shown in FIG. 19, therefore, when only one terminal 30 exists as a terminal for receiving data strobe signal Ext.DQS applied externally, by applying signals whose phases are shifted from each other by the ¼ cycle from the tester in the test mode to terminals 30 and 50, with terminal 50 for receiving external data mask signal Ext.DM utilized. Accordingly, without increasing the number of terminals, double-speed data strobe signal DDQS having a frequency twice as high as that of external data strobe signal Ext.DQS can be generated. In DM buffer 51, by fixing internal data mask signal Int.DM to the L level or the inactive state by test mode instruction signal TM in the test mode, test data can be written to a selected memory cell with reliability.

Also in the configuration shown in FIG. 19, at the preceding stage of EXOR circuit 32, an AND circuit receiving a signal applied to terminal 30 and the test mode instruction signal and an AND circuit receiving a signal applied to terminal 50 and the test mode instruction signal may be disposed (refer to FIG. 16).

As described above, according to the seventh embodiment of the invention, signals whose phases are shifted from each other by the ¼ cycle are applied in the test mode to the terminals which receive the external data strobe signal and the data mask signal in the normal operation mode, and the double-speed data strobe signal is be generated. Thus, without increasing the number of terminals, a data strobe signal which is twice as fast as the external data strobe signal (external clock signal) can be generated and the input circuit can be operated at a speed four times as fast as that of the external clock signal.

The operation waveform of the configuration shown in FIG. 19 is provided by the timing chart of FIG. 13, with external data mask signal Ext.DM used in place of signal Ext.DQSL in FIG. 13.

Eighth Embodiment

Figure 20:
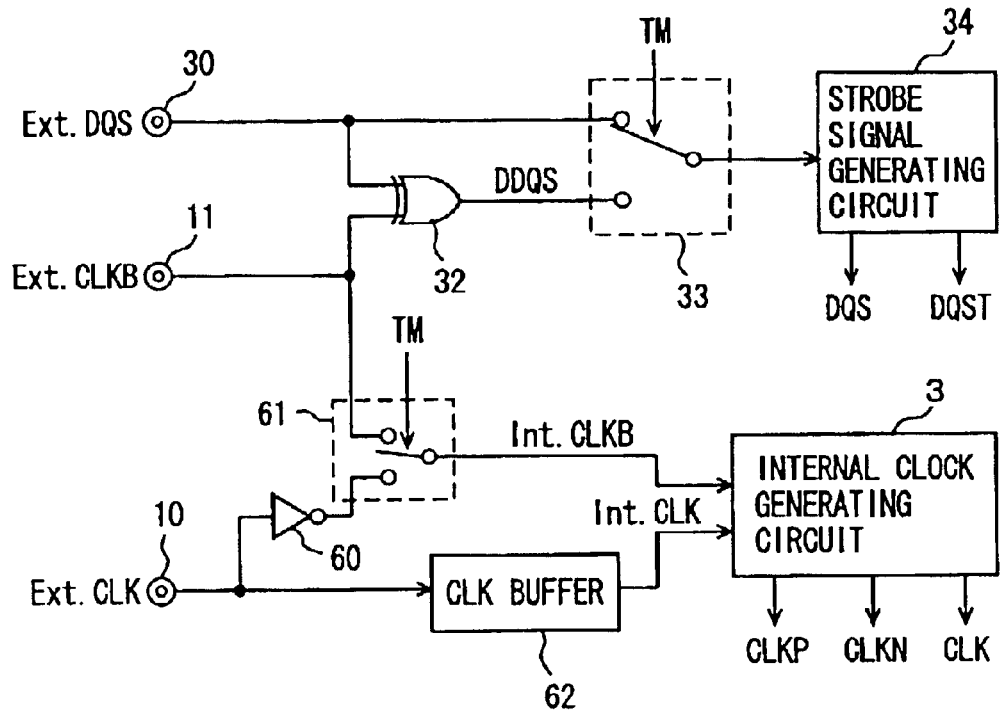
FIG. 20 is a diagram schematically showing the configuration of an eighth embodiment of the invention.

FIG. 20 is a diagram schematically showing the configuration of a main portion of a semiconductor memory device according to an eighth embodiment of the invention. In the configuration shown in FIG. 20, EXOR circuit 32 for generating double-speed data strobe signal DDQS in the test mode receives signals the same in frequency but shifted in phase from each other by the ¼ cycle via strobe terminal 30 and clock input terminal 11 in the test mode. To clock input terminal 11, complementary external clock signal Ext-.CLKB is applied in the normal operation mode.

To generate the complementary clock signal in the test mode, there are provided: an inverter 60 receiving external clock signal Ext.CLK supplied to clock input terminal 10; a selector 61 for selecting one of an output signal of inverter 60 and a signal supplied to terminal 11 in accordance with test mode instruction signal TM and generating a complementary buffer internal clock signal Int.CLKB; and a CLK buffer 62 for buffering external clock signal Ext.CLK from terminal 10 and generating internal buffered clock signal Int.CLK. Buffered internal clock signal Int.CLKB from selector 61 and internal buffer clock signal Int.CLK from CLK buffer 62 are applied to internal clock generating circuit 3.

Selector 61 selects external clock signal Ext.CLKB applied to terminal 11 when test mode instruction signal TM is in an inactive state and the normal operation mode is designated. On the other hand, when test mode instruction signal TM is made active, selector 61 selects an output signal of inverter 60. In the test mode, according to external clock signal Ext.CLK applied to clock input terminal 10, complementary buffer internal clock signals Int.CLKB and Int.CLK are generated and supplied to internal clock generating circuit 3.

Internal clock generating circuit 3 has the configuration similar to that shown in the foregoing first embodiment and generates internal clock signals CLK, CLKN, and CLKP in accordance with complementary buffer internal clock signals Int.CLK and Int.CLKB.

Double-speed data strobe signal DDQS output from EXOR circuit 32 is supplied to strobe signal generating circuit 34 via selector 33.

In the configuration shown in FIG. 20, in the test mode, a signal having a phase shifted from that of data strobe signal Ext.DQS by the ¼ cycle is supplied to clock input terminal 11. The internal clock signal is generated according to complementary buffered internal clock signals Int.CLKB and Int.CLK generated from external clock signal Ext.CLK supplied to clock input terminal 10. Therefore, when internal clock generating circuit 3 generates internal clock signals CLK, CLKN, and CLKP each of which is twice as fast as external clock signal Ext.CLK in the test mode, strobe signal generating circuit 34 similarly generates signals DQS and DQST each twice as fast as data strobe signal Ext.DQS. In such a manner, in the case of operating the internal circuit at a speed twice as fast as the external clock signal, data can be input at a speed four times as fast as the external clock signal.

In the test mode, by applying a signal whose phase is shifted from that of external data strobe signal Ext.DQS applied to strobe terminal 30 by the ¼ cycle by using clock input terminal 11, without increasing the number of pin terminals, a signal whose phase is shifted by the ¼ cycle can be easily supplied in the test mode, and data strobe signal DDQS which is twice as fast as external data strobe signal Ext.DQS can be generated.

In the configuration of FIG. 20 as well, at the preceding stage of EXOR circuit 32, an AND circuit receiving the signal applied to terminal 30 and the test mode instruction signal and an AND circuit receiving the signal applied to terminal 11 and the test mode instruction signal may be disposed.

The timing chart of the operations of the circuits in FIG. 20 can be obtained by using complementary external clock signal Ext.CLKB in place of signal Ext.DQSL in the timing chart of FIG. 13.

Ninth Embodiment

Figure 21:
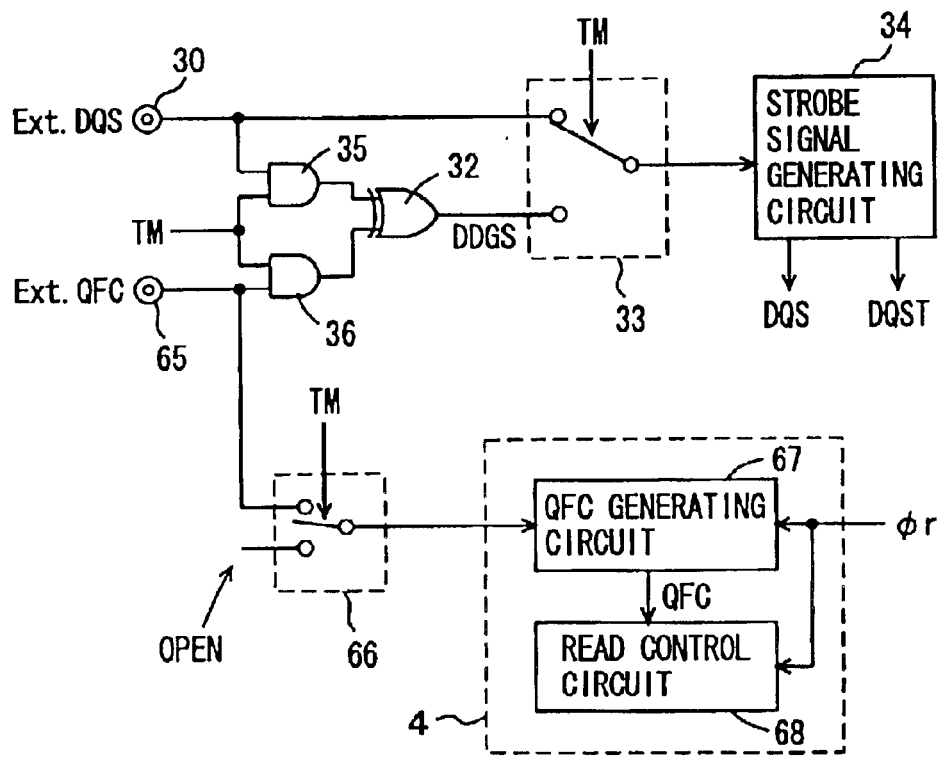
FIG. 21 is a diagram schematically showing the configuration of a ninth embodiment of the invention.

FIG. 21 is a diagram showing the configuration of a main portion of a semiconductor memory device according to a ninth embodiment of the invention. In FIG. 21, at the preceding stage of EXOR circuit 32 for generating double-speed data strobe signal DDQS, AND circuit 35 receiving test mode instruction signal TM and external data strobe signal Ext.DQS applied to terminal 30 and AND circuit 36 receiving an external output control signal Ext.QFC applied to a terminal 65 and test mode instruction signal TM are provided. Double-speed data strobe signal DDQS output from EXOR circuit 32 is applied to strobe signal generating circuit 34 via selector 33.

External output control signal Ext.QFC applied to terminal 65 is applied to a QFC generating circuit 67 included in control circuit 4 via a selector 66. When read instruction signal φr instructing data reading is activated and external output control signal Ext.QFC is in an active state, QFC generating circuit 67 generates an internal output control signal QFC to a read control circuit 68. Read control circuit 68 controls a column selecting operation for internal data reading and data reading operation in response to read instruction signal φr and internal output control signal QFC.

When a write command instructing data writing is applied and subsequently a read command instructing data reading is applied, when external output control signal Ext.QFC is in the active state, start of the reading operation is delayed by the period of column latency required in the data writing operation, thereby preventing conflict between write data and read data. Read control circuit 68 controls the operations of circuits related to internal data reading such as an internal read circuit (preamplifier) in reading data. The read control circuit and write control circuit may share a circuit for controlling the operations related to column selection, to control common column selection operation by the shared circuit when a write command or read command is applied.

When test mode instruction signal TM is in an inactive state, selector 66 selects external output control signal Ext.QFC applied to terminal 65 and applies it to QFC generating circuit 67. On the other hand, when test mode instruction signal TM is in an active stage, selector 66 selects a terminal in an open state. Selector 66 therefore may simply be formed of a switching element that is made conductive or non-conductive in accordance with test mode instruction signal TM.

In the case of the configuration shown in FIG. 21, in the test mode, selector 66 is set to the open state, external data strobe signal Ext.DQS is applied to terminal 30, and a signal whose phase is shifted from that of external data strobe signal Ext.DQS by the ¼ cycle is applied to terminal 65. From the signals applied to terminals 30 and 65, EXOR circuit 32 generates double-speed data strobe signal DDQS to strobe signal generating circuit 34.

In the case where signals DQS and DQST are generated by strobe signal generating circuit 34, only data writing is performed. In response to a write command, an address is taken in, memory cells are selected, and data are written to the selected memory cells. Since the read command instructing reading of data is not applied in this state, even if external output control signal Ext.QFC is not applied to QFC generating circuit 67, no problem occurs.

In the configuration shown in FIG. 21, the operation timings are the same as those in the signal waveform chart shown in FIG. 13. In place of data strobe signals Ext.DQSU and Ext.DQSL, signals Ext.DQS and Ext.QFC are used.

In the configuration shown in FIG. 21, when test mode instruction signal TM is active, selector 66 may be constructed so as to select a voltage at a level (for example, power supply voltage), at which the output control signal QFC is made inactive.

Also in the configuration shown in FIG. 21, to terminal 65 for receiving external output control signal Ext.QFC in the normal operation mode, a signal whose phase is shifted from that of external data strobe signal Ext.DQS applied to terminal 30 by the ¼ cycle is applied in the test mode. Thus, without increasing the number of pin terminals, a double-speed data strobe signal can be easily generated.

Selector 66 is provided for terminal 65, and in the test mode, QFC generating circuit 67 and terminal 65 for receiving external output control signal Ext.QFC are isolated from each other. Therefore, in the test mode, the QFC generating circuit can be prevented from operating according to a signal applied to terminal 65. Thus, without exerting an adverse influence on the internal circuit operation, a double-speed data strobe signal can be generated without increasing the number of pins.

Tenth Embodiment

Figure 22:
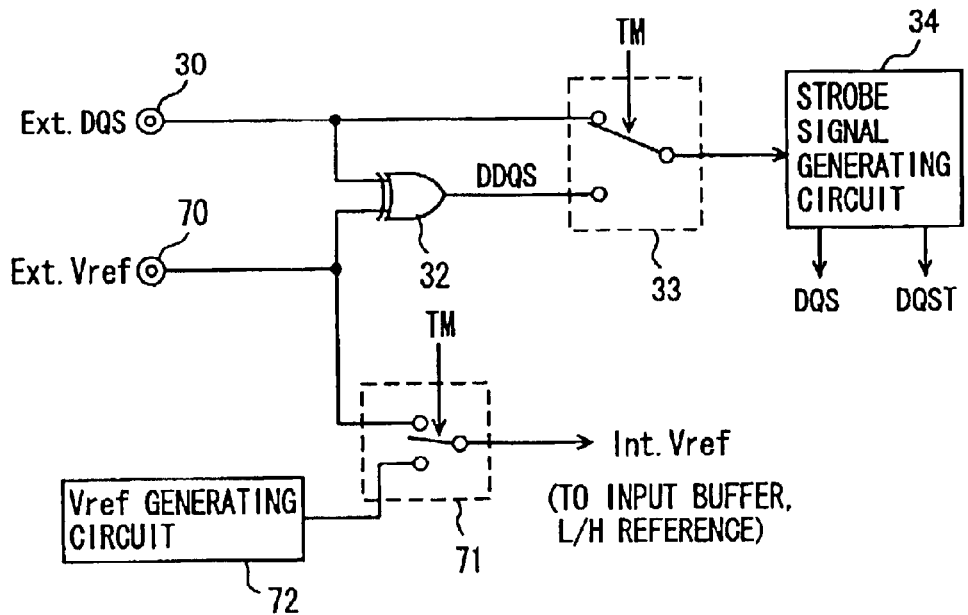
FIG. 22 is a diagram schematically showing the configuration of a tenth embodiment of the invention.

FIG. 22 is a diagram schematically showing the configuration of a double-speed data strobe signal generating section according to a tenth embodiment of the invention. In FIG. 22, EXOR circuit 32 for generating double-speed data strobe signal DDQS receives external data strobe signal Ext.DQS applied to terminal 30 and a signal on a terminal 70 for receiving a reference voltage. To terminal 70, in the normal operation mode, a reference voltage Ext.Vref as a reference of determining the level (H or L level) of an input signal is supplied.

With selector 71 provided to reference voltage input terminal 70, one of the reference voltage on terminal 70 and an output voltage of a Vref generating circuit 72 for generating a reference voltage Vref is selected according to test mode instruction signal TM, and internal reference voltage Int.Vref is transmitted. Internal reference voltage Int.Vref from selector 71 is supplied to an input buffer for receiving taking in a signal externally applied and used as a reference for determining the level (H or L level) of an external signal.

In the configuration shown in FIG. 22 as well, to terminals 30 and 70 used in a normal operation mode, signals whose phases are shifted from each other by the ¼ cycle are applied, and double-speed data strobe signal DDQS is generated. Thus, it is unnecessary to provide a dedicated pin terminal, and a double-speed data strobe signal can be desirably generated.

In the configuration shown in FIG. 22, it is also possible to provide an AND circuit to each of terminals 30 and 70 as shown in FIG. 21 at the preceding stage of EXOR circuit 32, with these AND circuits receive test mode instruction signal TM at their respective first input nodes.

Vref generating circuit 72 may be configured to generate reference voltage Vref when test mode instruction signal TM is in an active state. By stopping the operation of generating reference voltage Vref of Vref generating circuit 72 in the normal operation mode, power consumption in the normal operation mode can be reduced.

Eleventh Embodiment

Figure 23:
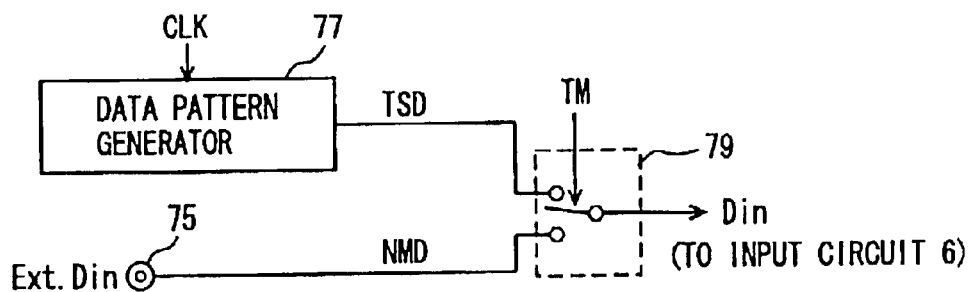
FIG. 23 is a diagram schematically showing the configuration of a main portion of a semiconductor memory device according to an eleventh embodiment of the invention.

FIG. 23 is a diagram schematically showing the configuration of a data input section according to an eleventh embodiment of the invention. FIG. 23 shows the configuration of a section related to a data input terminal 75 of one bit. In correspondence with each of data bits from the outside, the circuit configuration shown in FIG. 23 is disposed.

In FIG. 23, in correspondence to data input terminal 75, a data pattern generator 77 for generating test data TSD in the test mode and a selector 79 for selecting one of test data TSD from data pattern generator 77 and an external input data bit Ext.Din (normal data NMD) from data input terminal 75 and generating internal data Din are provided. Internal data Din from selector 79 is supplied to input circuit 6 shown in FIG. 1.

As shown in FIG. 23, by using data pattern generator 77, also in the case where an external tester cannot transfer write data at high speed, a data pattern can be generated synchronously with a high-speed internal clock signal in the semiconductor memory device. In the case where the internal clock signal doubles in frequency the external clock signal, test data can be written to the memory cells in the DDR mode with reliability.

Modification

Figure 24:
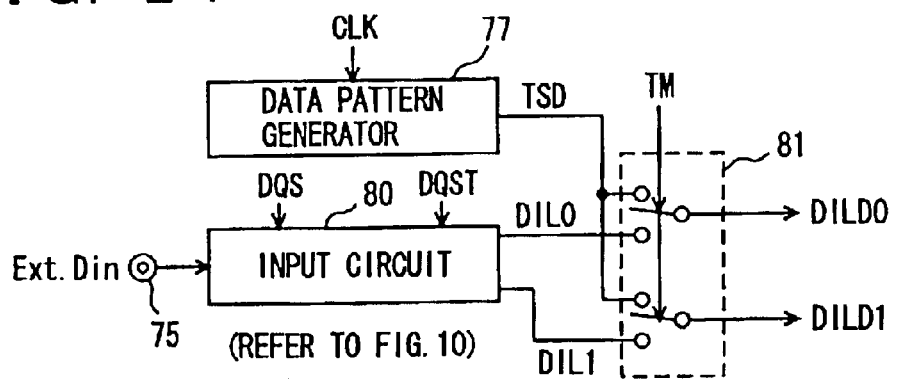
FIG. 24 is a diagram schematically showing the configuration of a data input section according to the eleventh embodiment of the invention.

FIG. 24 is a diagram schematically showing the configuration of a modification of the eleventh embodiment of the invention. In the configuration shown in FIG. 24, a selector 81 is provided on an output stage of an input circuit 80. Input circuit 80 has the configuration similar to that shown in FIG. 10, receives external write data Ext.Din supplied to data input terminal 75 in response to data strobe signal DQS and transfer/latch signal DQST, and generates internal write data DIL0 and DIL1 in parallel.

Selector 81 selects one of internal write data DIL0 and DIL1 generated by input circuit 80 and test data TSD generated by data pattern generator 77 in accordance with test mode instruction signal TM, generates write data DILD0 and DILD1, and transmits the write data onto an internal write data line.

In the case of the configuration shown in FIG. 24, in the test mode, selector 81 selects test data TSD output from data pattern generator 77 and generates write data DILD0 and DILD1. Therefore, input circuit 80 does not have to operate in the test mode and particularly, does not have to generate data strobe signals DQS and DQST in the test mode. In response to a write command, data pattern generator 77 is started and test data TDS is generated according to internal clock signal CLK.

In the configurations shown in FIGS. 23 and 24, in place of internal clock signal CLK, internal data strobe signal DQS may be used. Internal data strobe signal DQS changes in the test mode at a doubled frequency of the external clock signal, and has the same cycle as that of internal clock signal CLK. Therefore, write data can be generated in accordance with data strobe signal DQS in the test mode, and a test data pattern can be generated at accurate timings in response to a write command.

As described above, according to the eleventh embodiment of the invention, a test data pattern is generated internally. Even in the case where a tester is a slow speed apparatus and write data cannot be transferred at high speed, internal write data can be generated at a speed four times as fast as that of the external clock signal and test data can be equivalently written to selected memory cells in the DDR mode with reliability.

Twelfth Embodiment

Figure 25:
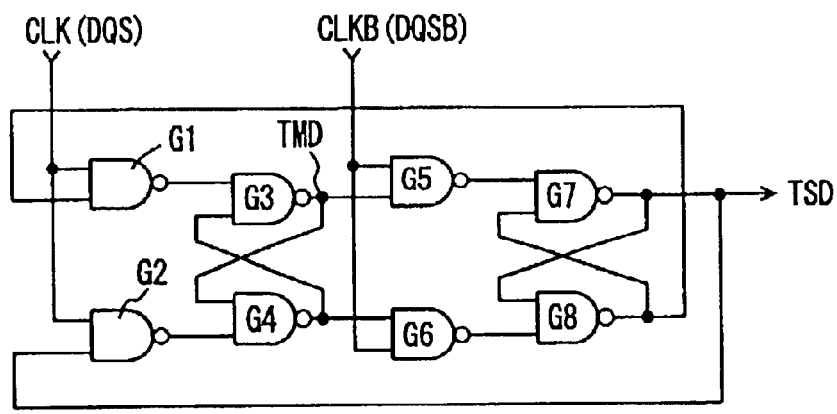
FIG. 25 is a diagram schematically showing the configuration of a data pattern generator according to a twelfth embodiment of the invention.

FIG. 25 is a diagram showing the configuration of data pattern generator 77 according to a twelfth embodiment of the invention. In FIG. 25, data pattern generator 77 includes NAND gates G1 and G2 receiving internal clock signal CLK at their first inputs, and NAND gates G3 and G4 receiving output signals of NAND gates G1 and G2 at their respective first inputs. Outputs of NAND gates G3 and G4 are coupled to second inputs of NAND gates G4 and G3, respectively.

Data pattern generator 77 further includes NAND gates G5 and G6 receiving complementary internal clock signal CLKB at their first inputs and receiving output signals of NAND gates G3 and G4 at their second inputs, and NAND gates G7 and G8 receiving output signals of NAND gates G5 and G6 at their first inputs, respectively. Outputs of NAND gates G7 and G8 are coupled to second inputs of NAND gates G8 and G7, respectively.

NAND gates G3 and G4 construct a flip-flop type latch circuit, and NAND gates G7 and G8 construct a flip-flop type latch circuit. NAND gates G1 and G2 function as transfer gates for transferring data supplied synchronously with internal clock signal CLK, and NAND gates G5 and G6 function as transfer gates for passing output signals of NAND gates G3 and G4 synchronously with complementary internal clock signal CLKB.

Output signals of NAND gates G8 and G7 are applied to the second inputs of NAND gates G1 and G2 at the initial stage. From NAND gate G7, 1-bit test data TSD is generated. In the configuration of data pattern generator 77 shown in FIG. 25, every cycle of internal clock signal CLK, test data TSD is inverted and generated. The operation of data pattern generator 77 shown in FIG. 25 will now be described with reference to the timing chart shown in FIG. 26.

Internal clock signal CLK is generated synchronously with the rising and falling edges of external clock signal Ext.CLK. When internal clock signal CLK turns H level, NAND gates G1 and G2 operate as an inverter and transfer output signals of NAND gates G8 and G7 to NAND gates G3 and G4 at the subsequent stage. When an output signal of NAND gate G8 is at the H level, an output signal of NAND gate G1 turns L level and an output signal TMD of NAND gate G3 accordingly turns H level.

When internal clock signal CLK goes low, output signals of NAND gates G1 and G2 go high, and NAND gates G3 and G4 latch signals transmitted from NAND gates G1 and G2 immediately before internal clock signal CLK goes high.

When internal clock signal CLK goes low, complementary internal clock signal CLKB goes high, and NAND gates G5 and G6 transfer output signals of NAND gates G3 and G4 to NAND gates G7 and G8 at the next stage. Since an output signal of NAND gate G3 is at the H level, an output signal of NAND gate G5 attains L level and accordingly, test data TSD output from NAND gate G7 attains H level. Test data TSD is transferred as internal write data DILD0 and DILD1 as shown in FIG. 24. To memory cells of two bits selected simultaneously, data of the same logic level is written.

When internal clock signal CLK attains H level again, according to test data TSD of the H level, an output signal of NAND gate G3 turns L level. Subsequently, in response to the falling edge of internal clock signal CLK, test data TSD attains L level. At this time, therefore, L-level data is transferred as internal write data DILD0 and DILD1. The logic level of data is inverted every two bits, as HH, LL, HH, . . . and a two-bit checker pattern is generated.

Figure 26:
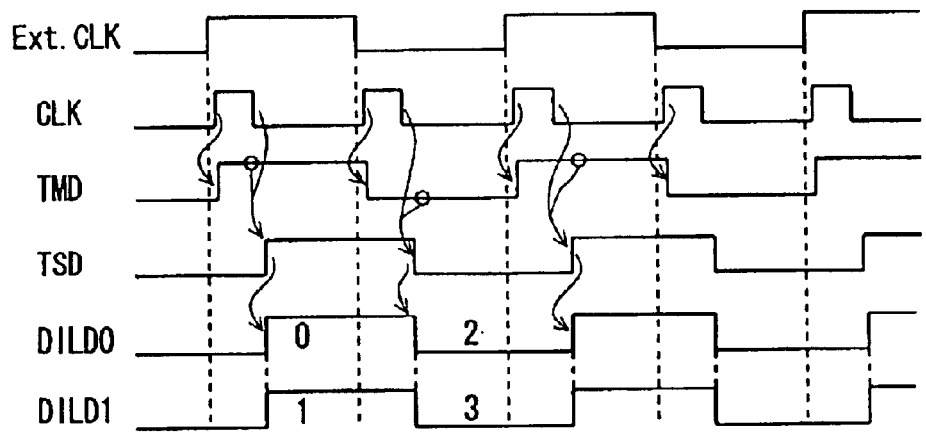
FIG. 26 is a timing chart representing an operation of the data pattern generator illustrated in FIG. 25.

In the memory array, data is written simultaneously to memory cells in adjacent columns. A data line to which a memory cell on an even-numbered column is connected and a data line to which a memory cell in an odd-numbered column is connected are fixedly determined. The least significant address bit is set in a degenerate state and memory cells of two bits are simultaneously selected. Which one of two bits of memory cell data supplied externally is written first is determined by the least significant column address bit. Since data from a latch circuit is transmitted to the selected memory cells in a state where the least significant column address signal is degenerated, in the test mode, the 2-bit checker pattern can be written into the memory cells in the memory array with reliability. FIG. 26 shows a case where write data DIL0 is written into memory cells on even-numbered columns and write data DIL1 is written into memory cells on odd-numbered columns.

In writing test data, data pattern generator 77 may be always operated in the test mode. A write command is supplied and, internally, memory cells are selected in accordance with an address signal applied together with the write command. Since the write command is supplied synchronously with external clock signal Ext.CLK, even when internal write data is always generated synchronously with internal clock signal CLK internally, data can be accurately written to the selected memory cells.

Alternatively, in place of internal clock signal CLK, internal data strobe signal DQS and complementary data strobe signal DQSB may be used. In this case, only in writing data, complementary internal data strobe signals DQS and DQSB change. Thus, data pattern generator 77 can be operated in the writing operation to generate test data and the test data can be written to memory cells with reliability.

In the test mode, it is not particularly necessary to operate an input circuit for inputting data. In the test mode, therefore, the operation of input circuit 80 may be stopped. This is easily achieved by simply applying, as a data strobe signal, a signal obtained by taking an AND between an inverted signal of test mode instruction signal TM and data strobe signal DQS to input circuit 80 and applying, as a transfer/latch instruction signal, a signal obtained by taking an AND between transfer/latch instruction signal DQST and an inverted signal of the test mode instruction signal to the latch circuit at the output stage in the input circuit.

Figure 27:
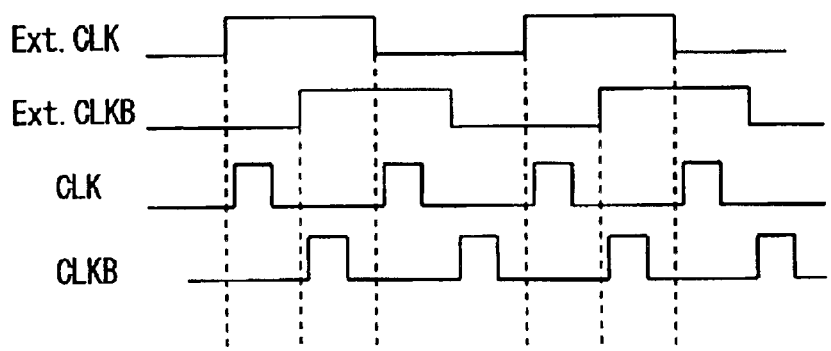
FIG. 27 is a diagram illustrating the timing relationship between external and internal clock signals in the twelfth embodiment of the invention.

In the test mode, complementary external clock signal Ext.CLKB whose phase is shifted from that of external clock signal Ext.CLK by the ¼ cycle is applied and internal clock signal CLK is generated. In this case, therefore, complementary internal clock signal CLKB can be generated by using signal Ext.CLKB whose phase is shifted from that of external clock signal Ext.CLK by the ¼ cycle (refer to FIG. 27). In this case, it is possible to generate internal clock signal CLKP having the same phase as that of internal clock signal CLK and use complementary internal clock signal CLKB as another internal clock signal CLKN. Reversely, internal clock signal CLKN can be used as complementary internal clock signal CLKB.

As described above, according to the twelfth embodiment of the invention, the logic level of output data is inverted every cycle of the internal clock signal and the resultant data is transmitted to internal data line of two bits in parallel. Thus, a two-bit checker pattern can be generated to be written into memory cells at high speed in the test mode with reliability.

Thirteenth Embodiment

Figure 28:
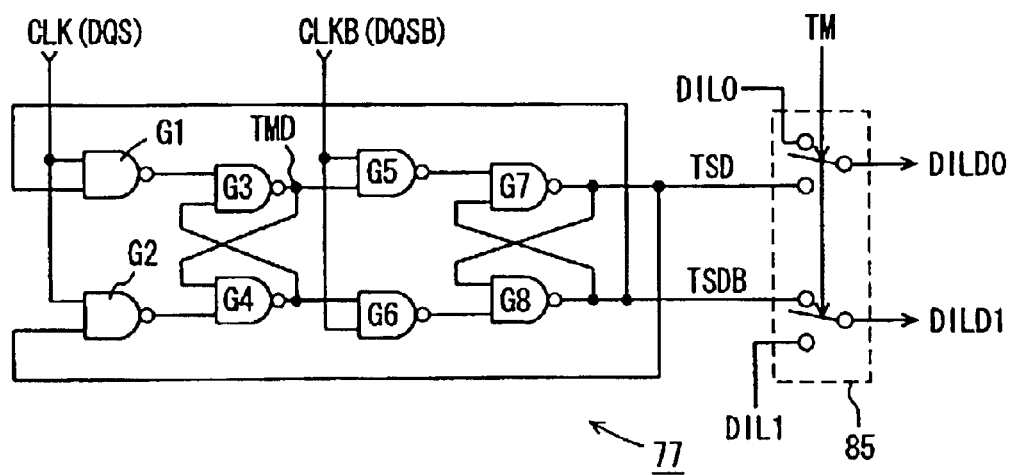
FIG. 28 is a diagram schematically showing the configuration of a thirteenth embodiment of the invention.

FIG. 28 is a diagram schematically showing the configuration of a data input section according to a thirteenth embodiment of the invention. FIG. 28 is a diagram schematically showing the configuration of the data input section according to the thirteenth embodiment of the invention. In FIG. 28, data pattern generator 77 generates complementary test data TSD and TSDB to each other.

Figure 29:
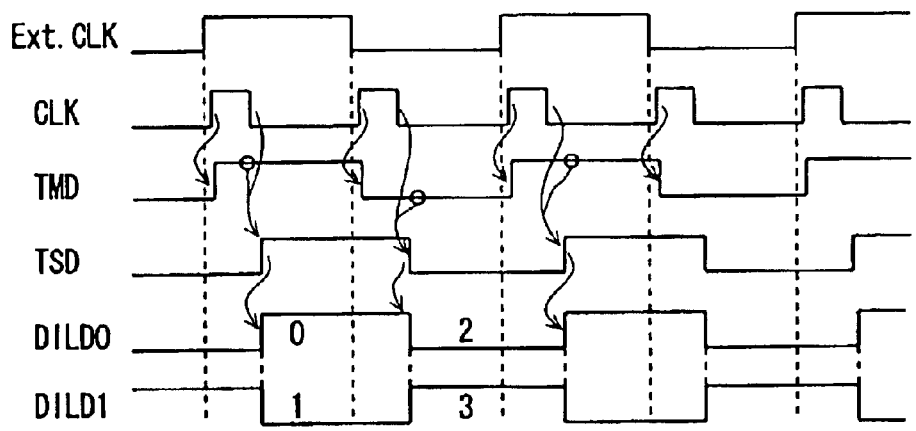
FIG. 29 is a timing chart representing the operation of a data pattern generator illustrated in FIG. 28.

A selector 85 provided to an output of data pattern generator 77 selects one of test data TSD and internal write data DIL0 from an input circuit in accordance with test mode instruction signal TM to generate internal write data DILD0, and selects one of complementary test data bit TSDB and normal internal write data DIL1 in accordance with test mode instruction signal TM to generate internal write data DILD1. Therefore, internal write data DILD0 and DILD1 always become complementary data bits to each other in the test mode. The configuration of data pattern generator 77 shown in FIG. 28 is the same as that of the data pattern generator shown in FIG. 25. Thus, the same reference numerals are designated to corresponding parts and their detailed description will not be repeated. The operation of the data input section shown in FIG. 28 will be described by referring to the timing chart of FIG. 29.

In the test mode, in response to the falling edge of internal clock signal CLK, the logic level of test data TSD changes and complementary test data TSDB inverted in logic level relative to test data TSD is generated. In the test mode, selector 85 selects test data TSD and TSDB and generates internal write data DILD0 and DILD1. Therefore, as internal write data DILD0 and DILD1, data having logic levels complementary to each other are transmitted. That is, a two-bit checker pattern of data H, L, L, H, H, L, . . . is generated. In this case, when column address signals bits are assumed CA0 and CA1, the same data pattern is repeatedly generated on a four-bit basis. In the four-bit data, when CA0 and CA1 are (0,0), (0,1), (1,0), and (1,1), data of H, L, L, and H levels are written, respectively. Thus, the data pattern of the exclusive OR (EXNOR) between column address signal bits CA0 and CA1 can be sequentially written in the column direction (row extending direction) of the memory array.

As shown in FIG. 28, complementary test data are generated and written to memory cells of two bits every clock cycle of the internal clock signal. Thus, a checker pattern, formed of data obtained through of the exclusive OR of least significant two bits of the column address signal bits, can be generated and written into memory cells.

In the configuration shown in FIG. 28 as well, in place of internal clock signal CLK, complementary internal data strobe signals DQS and DQSB may be used.

Fourteenth Embodiment

Figure 30:
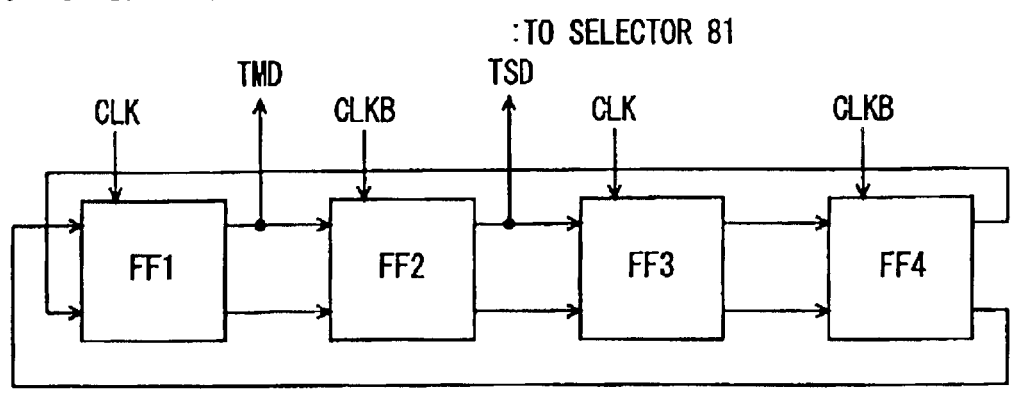
FIG. 30 is a diagram schematically showing the configuration of a fourteenth embodiment of the invention.

FIG. 30 is a diagram schematically showing the configuration of a data pattern generator according to a fourteenth embodiment of the invention. In FIG. 30, the data pattern generator includes four flip flops FF1 to FF4. Each of flip flops FF1 to FF4 includes NAND gates serving as a transfer gate shown in FIGS. 25 and 28 and a cross-coupled type latch circuit for latching output signals of the transfer gate. An output signal of flip flop FF4 at the final stage is inverted and transmitted to the flip flop FF1 at the first stage. From flip flop FF2, test data TSD to be supplied to selector 81 shown in FIG. 24 is generated.

Figure 31:
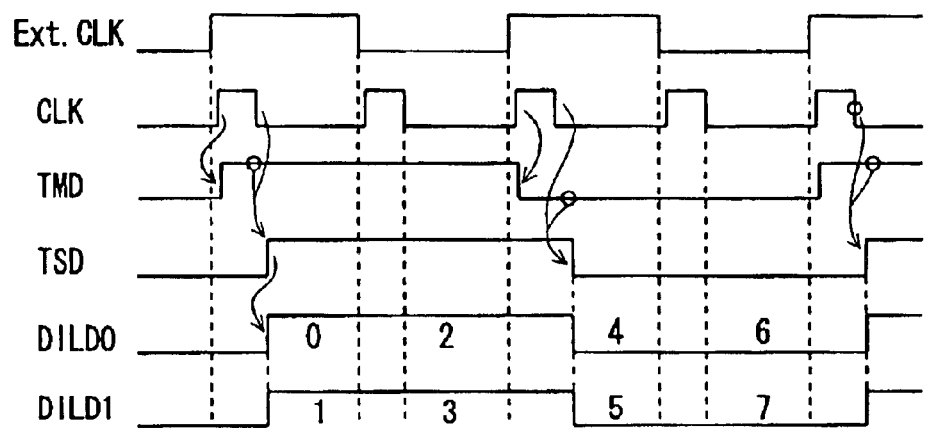
FIG. 31 is a timing chart representing an operation of a data pattern generator illustrated in FIG. 30.

FIG. 31 is a timing chart showing a test data generation sequence in the case of using the data pattern generator shown in FIG. 30. As shown in FIG. 31, internal clock signal CLK is generated synchronously with the rising and falling edges of external clock signal Ext.CLK in the test mode. Flip flops FF1 to FF4 perform the transferring/latching operation in accordance with internal clock signal CLK and complementary internal clock signal CLKB. Specifically, when output data TMD of flip flop FF1 turns H level in response to the rising edge of first internal clock signal CLK, flip flop FF2 latches output test data TMD at the next falling edge of internal clock signal CLK and output test data TSD turns H level.

In the test mode, selector 81 selects test data TSD and generates internal write data DILD0 and DILD1. First, H-level data is output as internal write data DILD0 and DILD1.

Even when internal clock signal CLK attains H level again, due to the transferring operation by flip flops FF3 and FF4, a delay of a half cycle of internal clock signal CLK is caused between test data TSD and internal data TM, so that test data TSD remains unchanged and maintains at the H level. Therefore, in the next cycle as well, H-level data is transferred as internal write data DILD0 and DILD1.

When internal clock signal CLK is generated again, since an output signal of flip flop FF4 is changed to the H level in the preceding cycle, the logic level of output data TMD of flip flop FF1 is inverted in response to the rising edge of internal clock signal CLK. When internal clock signal CLK turns L level, flip flop FF2 performs latching and transferring operation, so that test data TSD turns L level. In this cycle, therefore, as internal write data DILD0 and DILD1, L-level data is transferred. The L level is continued for a period of two clock cycles of internal clock signal CLK. Therefore, L-level data is transferred to memory cells of four bits.

As shown in FIG. 31, the logic level of write data to memory cells changes on the four-bit basis. Consequently, a so-called "four-bit checker pattern" in which the logic level of data bits changes every four columns in the memory array can be generated.

As shown in the timing chart of FIG. 31, the logic levels of internal write data DILD0 and DILD1 change synchronously with the falling edge of internal clock signal CLK. However, as described above with reference to FIG. 11, after internal clock signal CLK (data strobe signal DQS) turns L level, the logic levels of internal write data DIL0 and DIL1 change. Even in the case where internal clock signal CLK and internal data strobe signal DQS are the same in frequency but is different in pulse width, transferring operation of internal write data similar to that according to data strobe signal DQS and transfer/latch signal DQST in the normal operation mode can be achieved accurately in the test mode.

In the configuration of the data pattern generator shown in FIG. 30, in the case of generating internal write data DILD0 and DILD1 by using complementary data TSD and TSDB of flip flop FF2, a checker pattern in which memory cell data changes every column can be generated.

As described above, according to the fourteenth embodiment of the invention, the logic level of the output of the data pattern generator is changed every two cycles of internal clock signal CLK and the 2-bit pattern is transferred simultaneously to internal data bus of two bits. Accordingly, a test data pattern of a four-bit checker pattern can be easily generated at an accurate timing.

Also in the configuration shown in FIG. 30, in place of internal clock signals CLK and CLKB, data strobe signal DQS and transfer/latch instruction signal DQST may be used, respectively.

Fifteenth Embodiment

Figure 32:
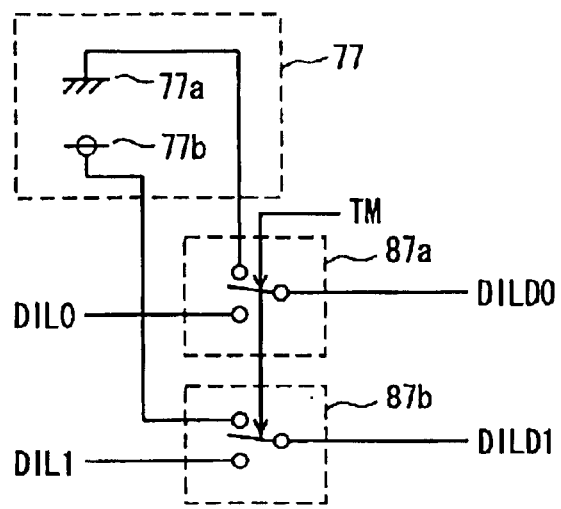
FIG. 32 is a diagram schematically showing the configuration of a fifteenth embodiment of the invention.

FIG. 32 is a diagram showing the configuration of a data input section according to a fifteenth embodiment of the invention. In FIG. 32, data pattern generator 77 includes a ground line connected to a ground node 77*a* and a power line connected to a power supply node 77*b*. Data pattern generator 77 therefore always generates a signal of the ground voltage level and a signal of the power supply voltage level.

For internal write data DILD0, a selector 87*a* for selecting one of a signal from ground node 77*a* and normal write data DIL0 in accordance with test mode instruction signal TM is provided. For internal write data DILD1, a selector 87*b* for selecting one of an H-level signal from power supply node 77*b* and write data DILL in accordance with test mode instruction signal TM is provided.

In the test mode, selectors 87*a* and 87*b* select the ground voltage and the power supply voltage, respectively, and generate internal write data DILD0 and DILD1, respectively.

In the normal operation mode, selectors 87*a* and 87*b* select internal write data DIL0 and DIL1, respectively, transferred in response to transfer/latch instruction signals from corresponding latch circuits.

Figure 33:
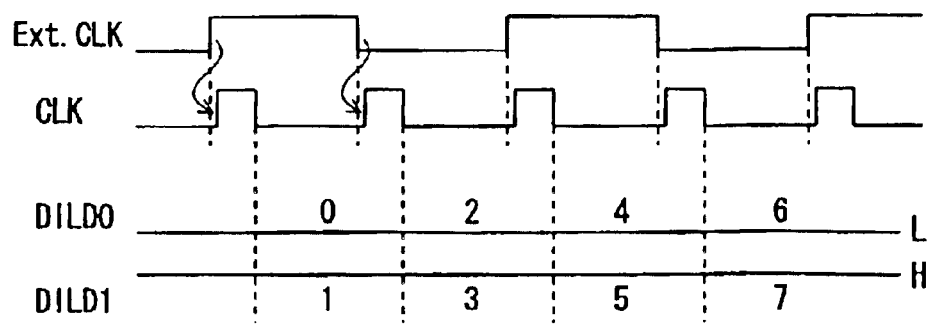
FIG. 33 is a timing chart representing an operation of a data pattern generator illustrated in FIG. 32.

When internal write data in a test is generated by using data pattern generator 77 shown in FIG. 32, an L-level signal is always transmitted as internal write data DILD0, and an H-level signal is always transmitted as internal write data DILD1, as shown in FIG. 33. In this case, therefore, data of the L and H levels of two bits is transmitted in each clock cycle of internal clock signal CLK, data of the L level, H, level, L level, H level, ... is stored in memory cells aligned in the row direction, so that a checker pattern can be generated.

In data pattern generator 77, normally, a voltage from power supply node 77*b* and ground node 77*a* is merely transmitted. Therefore, it is unnecessary to adjust the timing for generating internal test data. Thus, internal write data can be generated and transmitted to a selected memory cell with sufficient margin in the test mode.

Modification

Figure 34:
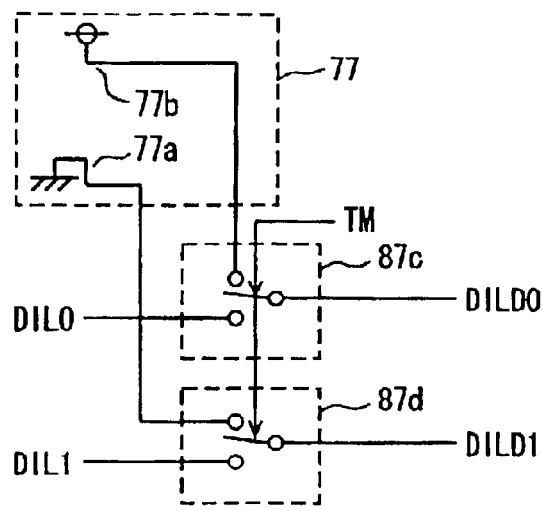
FIG. 34 is a diagram schematically showing the configuration of a modification of the fifteenth embodiment of the invention.

FIG. 34 is a diagram showing the configuration of a modification of the fifteenth embodiment of the invention. In FIG. 34, data pattern generator 77 includes, in a manner similar to the configuration shown in FIG. 32, a ground line connected to ground node 77*a* and a power supply line connected to power supply node 77*b*.

For internal write data DILD0, a selector 87*c* for selecting one of a signal on the ground line connected to ground node 77*a* and write data DIL0 in accordance with test mode instruction signal TM is provided. For internal write data DILD1, a selector 87*d* for selecting one of a signal on the power supply line connected to power supply node 77*b* and latch internal write data DIL1 in accordance with test mode instruction signal TM is provided.

Figure 35:
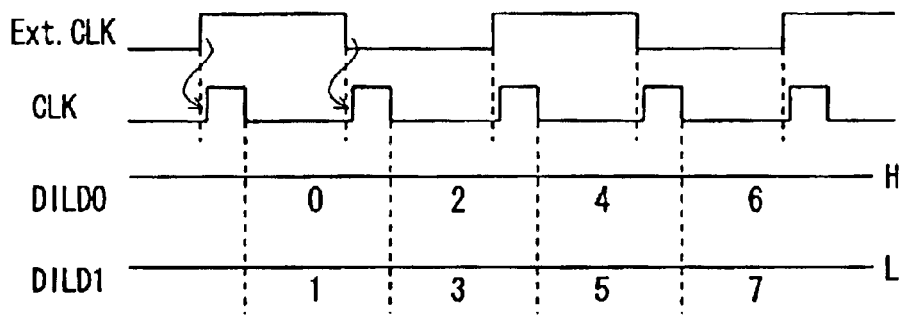
FIG. 35 is a timing chart representing an operation of a data pattern generator illustrated in FIG. 34.

In the case of the configuration shown in FIG. 34, therefore, in the test mode, as shown in FIG. 35, an H-level signal is always transmitted as internal write data DILD0, and an L-level signal is always transmitted as internal write data DILD1. Since internal write data DILD0 and DILD1 is transmitted to memory cells of two bits in parallel, a data pattern of an inverted checker pattern in which H level, L level, H level, L level, ... can be stored in the memory cells in the column direction (row extending direction).

As described above, according to the fifteenth embodiment of the invention, the data pattern generator is constructed to fixedly generate H-level and L-level data. Consequently, data patterns of the checker pattern and the inverted checker pattern can be easily generated. According to this configuration, the power supply line and the ground line are simply used. It is therefore unnecessary to operate the data pattern generator in response to the internal clock signal or data strobe signal, so that current consumption in the test mode can be reduced. It is also unnecessary to consider any timing margin for the test write data. Write data can be generated and transmitted to an internal memory cell with sufficient margin.

Sixteenth Embodiment

Figure 36:
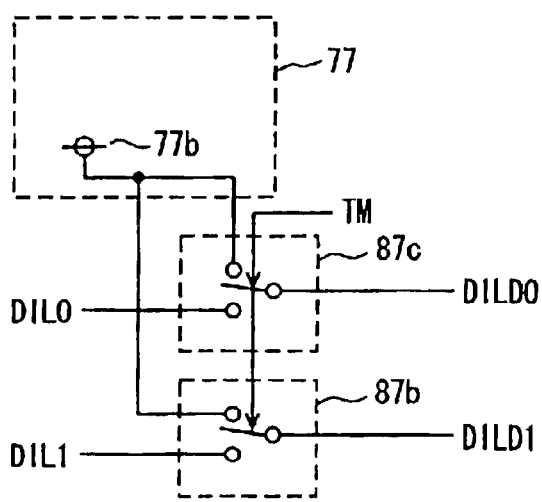
FIG. 36 is a diagram schematically showing the configuration of a sixteenth embodiment of the invention.

FIG. 36 is a diagram showing the configuration of a data input section according to a sixteenth embodiment of the invention. In FIG. 36, data pattern generator 77 includes a power supply line connected to power supply node 77*b*. Selector 87*c* provided for internal write data DILD0 selects one of a signal on the power supply line connected to power supply node 77*b* and latch write data DIL0 in accordance with test mode instruction signal TM.

Selector 87*b* provided for internal write data DILD1 selects one of a signal on the power supply line connected to power supply node 77*b* and latch write data DIL1 in accordance with test mode instruction signal TM.

Figure 37:
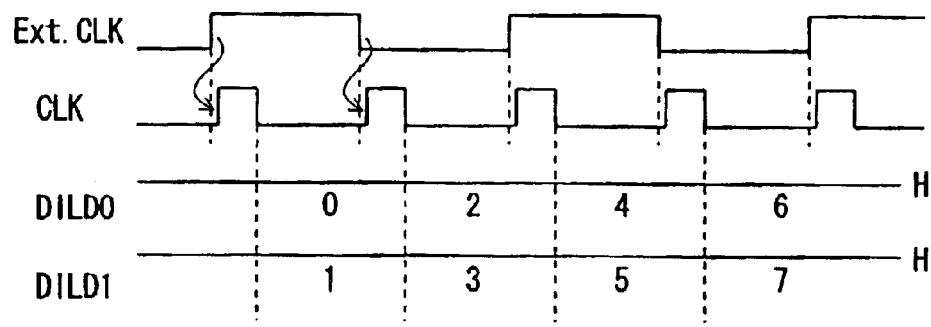
FIG. 37 is a timing chart representing an operation of a data pattern generator illustrated in FIG. 36.

Consequently, when test mode instruction signal TM is in an active state, both selectors 87*b* and 87*c* select the signal on the power supply line connected to power supply node 77*b*. Therefore, in the test mode, internal write data DILD0 and DILD1 are at H level. As shown in the signal waveform diagram shown in FIG. 37, H-level data can be written to all of memory cells.

Modification

Figure 38:
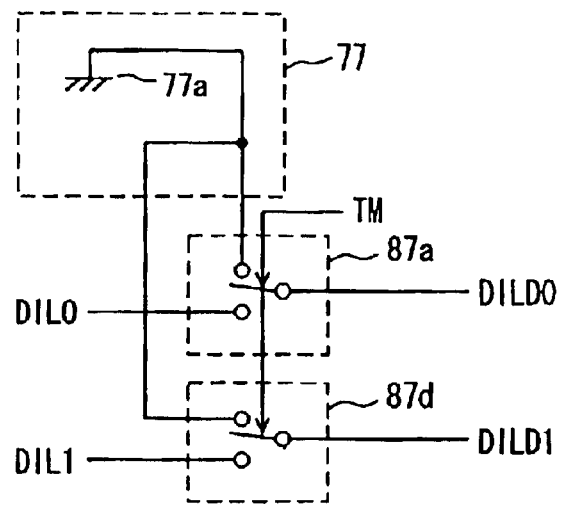
FIG. 38 is a diagram schematically showing the configuration of a first modification of the sixteenth embodiment of the invention.

FIG. 38 is a diagram schematically showing the configuration of a data input section in a modification of the sixteenth embodiment of the invention. In FIG. 38, data pattern generator 77 includes a ground line connected to ground node 77*a*.

Selector 87*a* provided for internal write data DILD0 selects one of a signal on the ground line connected to ground node 77a and latch write data DIL0 in accordance with test mode instruction signal TM. Selector 87d provided for internal write data DILD1 selects one of a signal on the ground line connected to ground node 77a and latch circuit write data DIL1 in accordance with test mode instruction signal TM.

Figure 39:
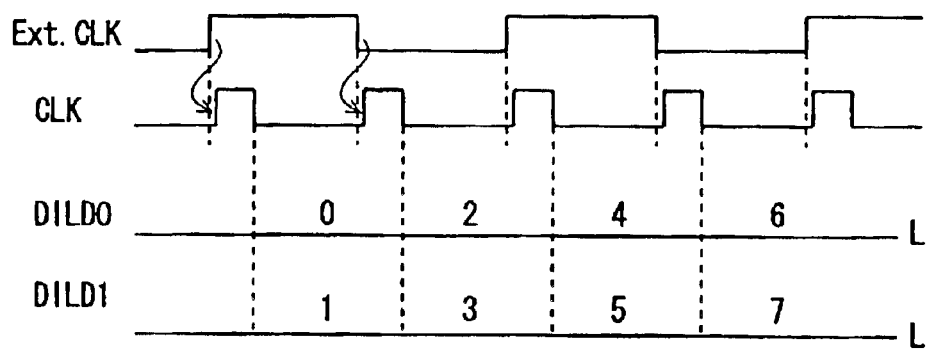
FIG. 39 is a timing chart representing the operation of a data pattern generator illustrated in FIG. 38.

In the configuration shown in FIG. 38, therefore, selectors 87a and 87d select the signal on the ground line connected to ground node 77a in the test mode, so that an L-level signal is transmitted for internal write data DILD0 and DILD1 as shown in FIG. 39. Therefore, L-level data can be written to all of memory cells.

The configuration of the data input section shown in each of FIGS. 24 to 38 is provided for each data terminal. For each data terminal, any of the data input sections may be disposed. In the memory cell array, an IO block is arranged corresponding to each data terminal, a column selecting operation is performed on an IO block basis, and any of the above-described data patterns can be written.

Figure 40:
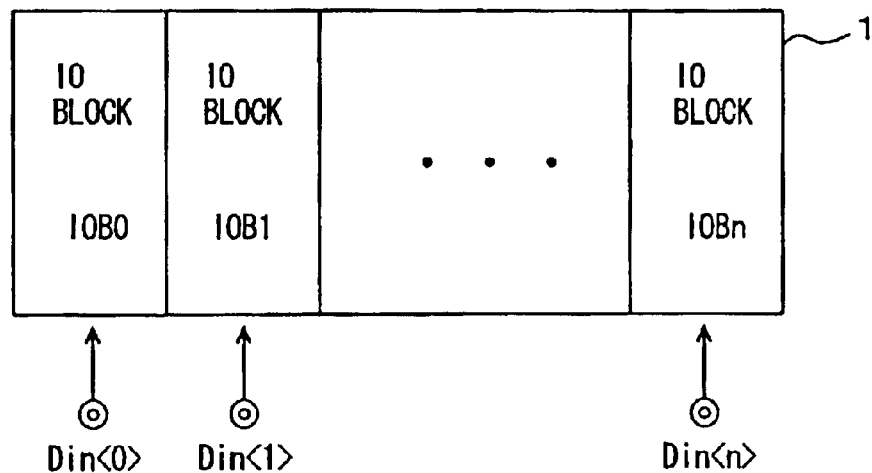
FIG. 40 is a diagram schematically illustrating a correspondence relationship between data input terminals and IO blocks of a memory array in the sixteenth embodiment of the invention.

Specifically, as shown in FIG. 40, memory array 1 is divided into IO blocks IOB0 to IOBn in correspondence to write data bits Din<0> to Din<n>, respectively. That is, memory array 1 is divided into IO blocks IOB0 to IOBn in correspondence to data input terminals. Write data bits Din<0> to Din<n> are written into 10 blocks IOB0 to IOBn, respectively. In the case of using any of the data input sections shown in FIGS. 23 to 38, the data pattern generator generates a pattern for one data bit Din<i>. In each of IO blocks IOB0 to IOBn, a data pattern generated by a data pattern generator can be written into memory cells.

As described above, according to the sixteenth embodiment of the invention, signals of the fixed voltage level are generated and two bits are transmitted in parallel to the internal data lines. Thus, data at the same logic level can be easily written to all the memory cells in a corresponding IO block.

Seventeenth Embodiment

Figure 41:
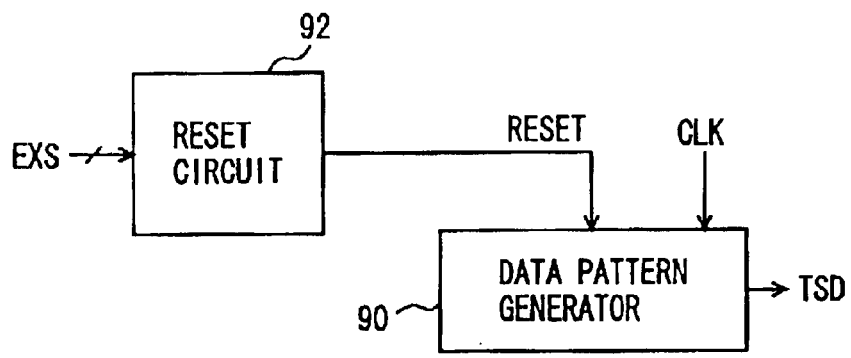
FIG. 41 is a diagram schematically showing the configuration of a data pattern generating section according to a seventeenth embodiment of the invention.

FIG. 41 is a diagram schematically showing the configuration of a test pattern generator according to a seventeenth embodiment of the invention. In FIG. 41, the test pattern generator includes a data pattern generator 90 for generating a data train of a predetermined pattern when activated, and a reset circuit 92 for resetting data pattern generator 90 in accordance with an external signal EXS. By a reset signal RESET from reset circuit 92, test data TDS is initialized.

By initializing test data TSD generated by data pattern generator 90 by using reset circuit 92, a data bit train can be generated in a desired sequence with reliability. Specifically, when data pattern generator 90 generates test data TSD synchronously with internal clock signal CLK, internal clock signal CLK is generated synchronously with an external clock signal but is independent of data input. There is consequently the possibility that, when a write command instructing writing of data is applied, whether the initial value of test data TSD generated by data pattern generator is the H or L level cannot be accurately determined.

Therefore, in the case of writing, for example, a checker pattern into memory cells, there is the possibility that an inverted checker pattern is written into memory cells. By generating reset signal RESET in accordance with external signal EXS by using reset circuit 92 and initializing test data TSD, a desired data pattern can be generated with reliability.

Figure 42:
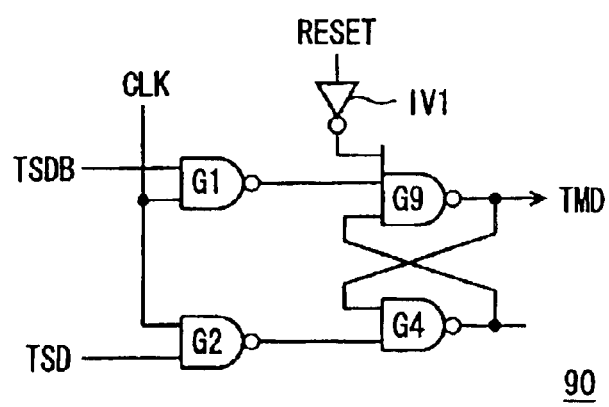
FIG. 42 is a diagram schematically showing the configuration of a data pattern generator illustrated in FIG. 41.

FIG. 42 is a diagram showing an example of the configuration of data pattern generator 90 illustrated in FIG. 41. FIG. 42 shows the configuration of a section of generating internal test mode data TMD. According to whether data pattern generator 90 is a two-bit checker pattern generator or four-bit checker pattern generator, the number of stages of flip flops connected is determined. FIG. 42 shows the configuration of the flip flop at the first stage.

In FIG. 42, data pattern generator 90 includes an NAND gate G1 receiving internal clock signal CLK and complementary test data TSDB, an NAND gate G2 receiving internal clock signal CLK and test data TSD, an inverter IV inverting reset signal RESET, and an NAND gate G9 receiving an output signal of inverter IV, an output signal of NAND gate G1, and an output signal of NAND gate G4 and generating internal intermediate test mode data TM). NAND gate G4 receives an output signal of NAND gate G2 and an output signal of NAND gate G9.

In the configuration of data pattern generator 90 shown in FIG. 42, when reset signal RESET is made active and turns H level, an output signal of inverter IV goes low, and intermediate test mode data TMD output from NAND gate G9 is set to the H level.

In data pattern generator 90 shown in FIG. 42, therefore, intermediate test mode data TMD can be initialized to the H level.

In the configuration shown in FIG. 42, data pattern generator 90 always generates test data synchronously with internal clock signal CLK. However, by using a combined signal (AND signal) of internal dock signal CLK and test mode instruction signal TM, test data can be generated only in the test operation mode, so that current consumption in the normal operation mode can be reduced. This is similarly applied to the data pattern generators in the foregoing eleventh to fourteenth embodiments.

Modification

Figure 43:
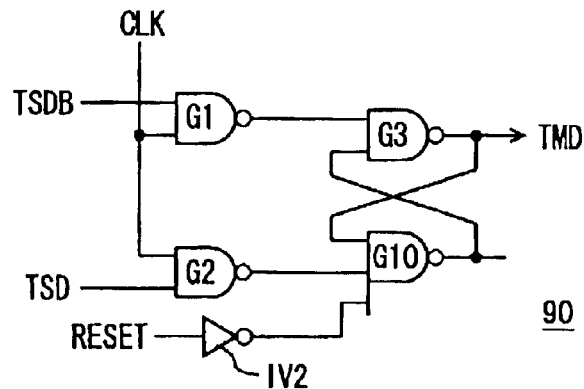
FIG. 43 is a diagram schematically showing the configuration of a modification of the data pattern generator illustrated in FIG. 41.

FIG. 43 is a diagram showing a modification of data pattern generator 90 illustrated in FIG. 41. In data pattern generator 90 shown in FIG. 43, a latch circuit is constructed by NAND gates G3 and G10. Reset signal RESET is applied to NAND gate G10 via an inverter IV2. NAND gate G3 receives an output signal of NAND gate G10 and generates internal intermediate test mode data TMD with corresponding NAND gate G10.

A transfer gate at the input stage is constructed by NAND gate G1 receiving internal clock signal CLK and complementary test data TSDB and NAND gate G2 receiving internal dock signal CLK and test data TSD.

In the configuration of data pattern generator 90 shown in FIG. 43, when reset signal RESET is activated to the H level, an output signal of NAND gate G10 goes high. When internal clock signal CLK is at the L level, an output signal of NAND gate G1 is at the H level and intermediate test mode data TMD is initialized to the L level. Therefore, in data pattern generator 90 shown in FIG. 43, a test data pattern starting at the L level can be generated.

Figure 44:
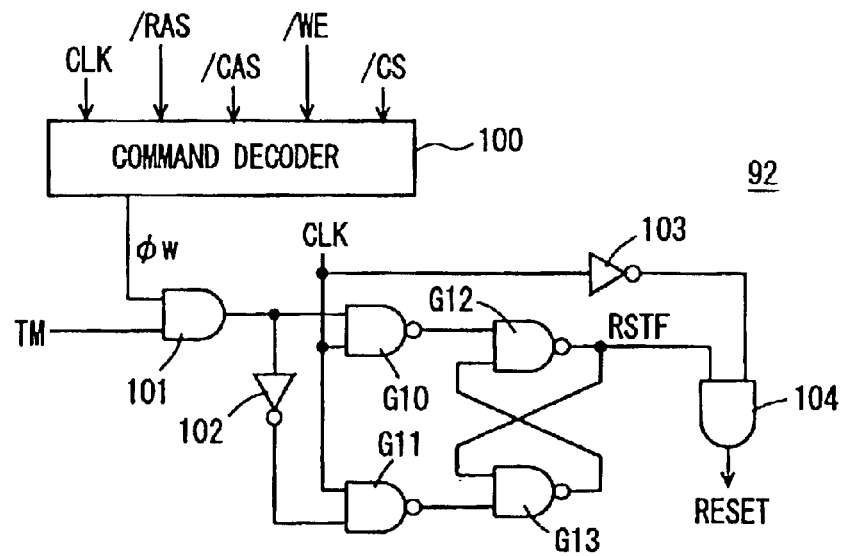
FIG. 44 is a diagram showing the configuration of a reset circuit illustrated in FIG. 41.

FIG. 44 is a diagram showing an example of the configuration of reset circuit 92 illustrated in FIG. 41. In FIG. 44, reset circuit 92 is activated in response to a write operation instruction signal φw from a command decoder 100 and test mode instruction signal TM. Command decoder 100 receives internal clock signal CLK, a row address strobe signal /RAS, a column address strobe signal /CAS, a write enable signal /WE, and a chip select signal /CS. When external control signals /RAS, /CAS, and /WE and chip select signal /CS are each set to a predetermined logic level at the rising edge of internal clock signal CLK, it is determined that the write command indicating writing of data is applied and write operation instruction signal φw is made active.

Control signals /RAS, /CAS, /WE, and /CS are supplied from an external tester. Therefore, in the case of using a low-speed tester, synchronously with the rising edge of the external clock signal, external control signals /RAS, /CAS, /WE and /CS are each set to a predetermined logic level. However, internal clock signal CLK is generated synchronously with the external clock signal, and even when command decoder 100 determines the logic level of each of the control signals at the rising edge of internal clock signal CLK, an operation mode designated can be identified accurately.

Figure 45:
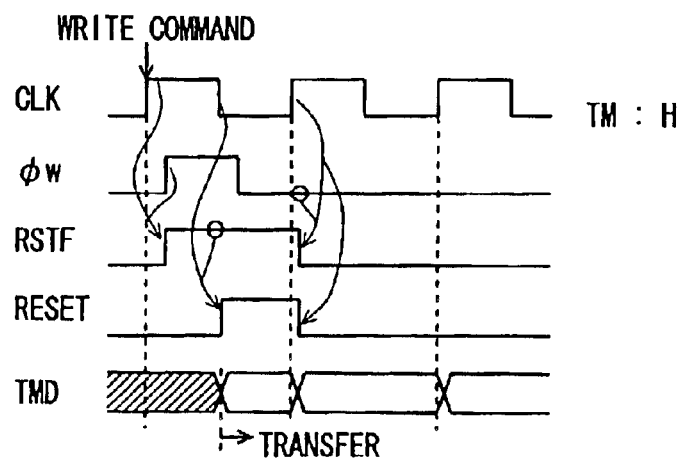
FIG. 45 is a timing chart representing an operation of the reset circuit illustrated in FIG. 44.

Reset circuit 92 includes an AND circuit 101 receiving write operation mode instruction signal φw and test mode instruction signal TM, an inverter 102 receiving an output signal of AND circuit 101, an NAND gate G10 receiving an output signal of AND circuit 101 and internal clock signal CLK, an NAND gate G11 receiving internal clock signal CLK and an output signal of inverter 102, NAND gates G12 and G13 constructing a cross-coupled type flip flop for latching output signals of NAND gates G10 and G11, an inverter 103 receiving internal clock signal CLK, and an AND circuit 104 receiving an output signal RSTF of NAND gate G12 and an output signal of inverter 103 and generating reset signal RESET. The operation of reset circuit 92 shown in FIG. 44 will now be described with reference to the timing chart shown in FIG. 45.

At the rising edge of internal clock signal (or external clock signal) CLK, an external control signal is set to a predetermined logic state and a write command instructing writing of data is supplied. The write command is supplied, as an example, when chip select signal /CS, column address strobe signal /CAS, and write enable signal /WE are set to the L level and row address strobe signal /RAS is set to the H level at the rising edge of internal clock signal CLK.

When the write command is supplied, command decoder 100 activates write operation instruction signal φw. Write operation instruction signal φw is generated in the form of a one-shot pulse and maintains the H level for a predetermined period. When write operation instruction signal φw is set to the H level in the test mode, an output signal of AND circuit 101 goes high. Since internal clock signal CLK is at the H level, an output signal of NAND gate G11 goes low, and output signal RSTF of NAND gate G12 accordingly goes high. When internal clock signal CLK is at the H level, an output signal of inverter 103 is at the L level, and reset signal RESET from AND circuit 104 maintains the L level.

When internal clock signal CLK goes low, output signals of NAND gates G10 and G11 go high, and internal signal RSTF is latched at the H level by NAND gates G12 and G13. An output signal of inverter 103 goes high in response to the falling edge of internal clock signal CLK and reset signal RESET from AND circuit 104 goes high responsively.

When internal clock signal CLK is at the L level, therefore, internal write data TMD in data pattern generator 90 is initialized to the H or L level. At the time of writing data, in response to the falling edge of internal clock signal CLK, data of two bits per data input terminal is transferred in parallel. Therefore, by initializing data pattern generator 90 in response to the falling edge of internal clock signal CLK, data pattern generator 90 can be initialized synchronously with the transfer of write data to selected memory cells. Data having a predetermined bit pattern can be accurately written into a selected memory cell.

In the normal operation mode, test mode instruction signal TM is at the L level, internal signal RSTF is held at the L level in reset circuit 92 and accordingly, reset signal RESET is held at the L level.

In reset circuit 92 shown in FIG. 44, a signal obtained through an AND processing of internal clock signal CLK and test mode instruction signal TM may replace internal clock signal CLK. In this configuration, it is unnecessary to provide AND circuit 101.

As described above, according to the seventeenth embodiment of the invention, data pattern generator for generating a write data train is initialized in the test mode. Thus, test data having a desired data pattern can be accurately generated.

Eighteenth Embodiment

Figure 46:
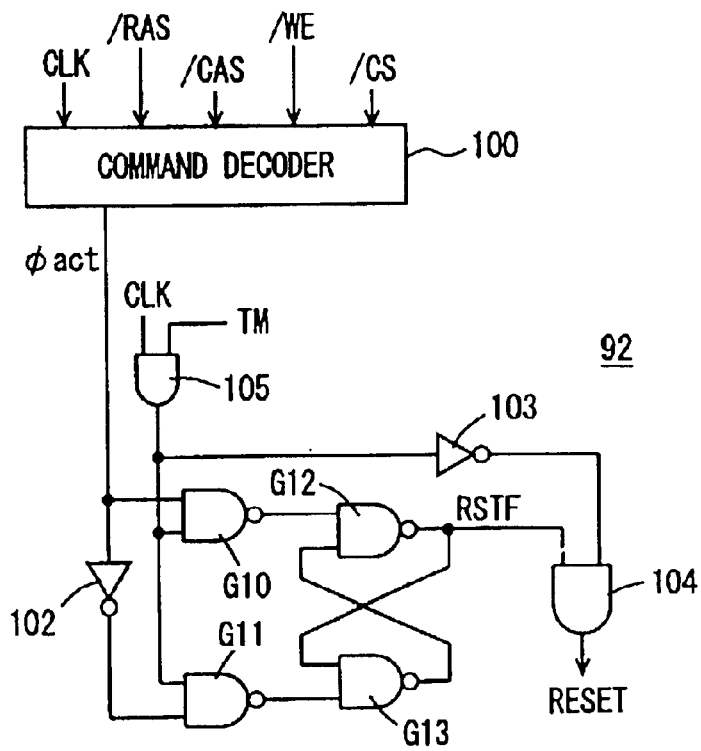
FIG. 46 is a diagram showing the configuration of a reset circuit according to an eighteenth embodiment of the invention.

FIG. 46 is a diagram schematically showing the configuration of a reset circuit according to an eighteenth embodiment of the invention. In FIG. 46, reset circuit 92 includes a flip flop for performing a transferring operation in accordance with an output signal of an AND circuit 105 which in turn receives internal clock signal CLK and test mode signal TM. The configuration of reset circuit 92 is similar to that of reset circuit 92 shown in FIG. 44, and corresponding parts are designated with the same reference numerals and their detailed description will not be repeated.

Command decoder 100 determines that an active command for performing memory cell selection (word line selection) is applied when external control signals /RAS, /CAS, /WE, and /CS are each in a predetermined logic state at the rising edge of internal clock signal CLK and activates a row activate instruction signal φact. Row activate instruction signal φact is supplied to NAND gate G10, and to NAND gate G11 via inverter 102.

In reset circuit 92 shown in FIG. 46, the initialization is performed by an active command.

Figure 47:
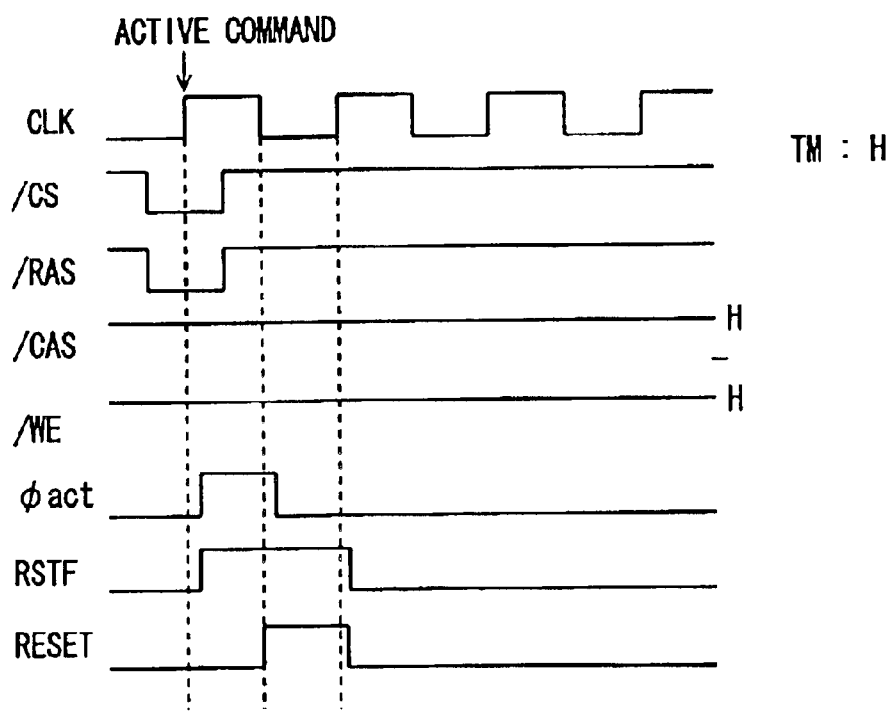
FIG. 47 is a timing chart representing an operation of a reset circuit illustrated in FIG. 41.

FIG. 47 is a timing chart representing an operation of reset circuit 92 illustrated in FIG. 46. An active command is supplied when chip select signal /CS and row address strobe signal /RAS are set to the L level at the rising edge of internal clock signal CLK and column address strobe signal /CAS and write enable signal /WE are held at the H level. When the active command is supplied, row activate instruction signal φact is activated and accordingly, the flip flop constructed by NAND gates G12 and G13 is reset in reset circuit 92, and output signal RSTF turns H level.

When internal clock signal CLK goes low, reset signal REST goes low in accordance with a hold signal RSTF of the flip flop. Therefore, also in reset circuit 92 shown in FIG. 46, when internal clock signal CLK is at the L level, reset signal RESET can be activated to the H level.

The active command is a command for activating circuits related to row selection and does not instruct input of data. However, by presetting the number of clock cycles required since the active command is applied until the write command instructing writing of data is supplied subsequently, the logic level of test data generated internally can be known in advance and a test data pattern accurately having a desired pattern can be written to selected memory cells.

The active command is a command applied before data input. By supplying the active command for resetting the test data pattern, data pattern generator 90 can be initialized by reset circuit 92 reliably with a sufficient margin in data writing.

Nineteenth Embodiment

Figure 48:
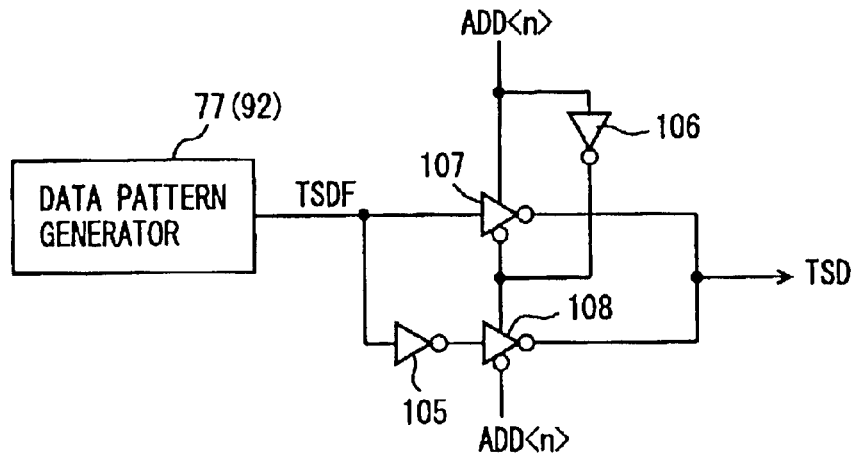
FIG. 48 is a diagram schematically showing the configuration of a data pattern generating section according to a nineteenth embodiment of the invention.

FIG. 48 is a diagram schematically showing the configuration of a data pattern generating section according to a nineteenth embodiment of the invention. In FIG. 48, data TSDF output from data pattern generator 77 or 92 shown in FIG. 24 or 41 is selectively inverted according to the value of an address signal bit ADD<n>. Specifically, this data pattern generating section includes an inverter 106 inverting address bit ADD<n>, an inverter 105 receiving output data TSDF of data pattern generator 77 or 92, a tri-state inverter buffer 107 that is activated, when address bit ADD<n> is "1", to invert output test data TSDF of data pattern generator 77 and generate test data TSD to a selected memory cell, and a tri-state inverter buffer 108 that is activated, when address signal bit ADD<n> is "0", to invert an output signal of inverter 105 and generate write test data TSD for a selected memory cell.

In the configuration of the data pattern generating section shown in FIG. 48, when address signal bit ADD<n> is "1", write data TSD to a memory cell is provided by inverted data of test data TSDF generated by data pattern generator 77 or 92. On the other hand, when address signal bit ADD<n> is "0", test data TSD is provided by data equal to data TSDF generated by data pattern generator 77 or 92.

Figure 49A:
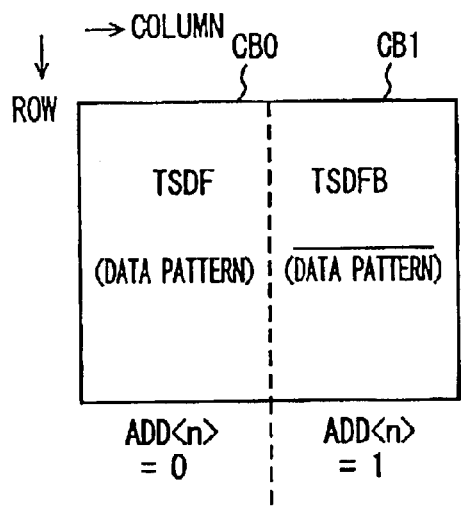
FIGS. 49A and 49B are diagrams showing a write data pattern applied to a memory array by the data pattern generating section illustrated in FIG. 48.

When address signal bit ADD<n> is a column address signal bit, as shown in FIG. 49A, the memory array is divided into two column blocks CB0 and CB1. Column block CB0 is an area where address signal bit ADD<n> is "0". Column block CB1 is an area where address signal bit ADD<n> is "1". Since output data of tri-state inverter buffer 108 is transmitted to column block CB0 as a data pattern, test data TSDF generated by data pattern generator 77 or 92 is written. On the other hand, output data bit TSDF of data pattern generator 77 or 92 is transmitted to column block CB1 via tri-state inverter buffer 107. Therefore, this data pattern is formed of inverted data TSDFB of output data TSDF of data pattern generator 77 or 92.

In column block CB0, therefore, test data of the same pattern as the data pattern generated by data pattern generator 77 or 92 are stored. On the other hand, in column block CB1, an inverted pattern (Idata pattern) of the data pattern generated by data pattern generator 77 or 92 are stored.

Figure 49B:
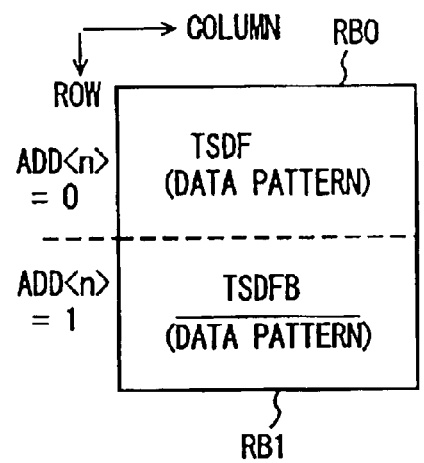

In the case where address signal bit ADD<n> is a row address signal bit, as shown in FIG. 49B, the memory array is divided into two row blocks RB0 and RB1 by row address signal bit ADD<n>. Row block RB0 is an area where address signal bit ADD<n> is "0", and row block RB1 is an area where row address signal bit ADD<n> is "1". Therefore, in row block RB0, data TSDF generated by data pattern generator 77 or 92 are stored as a test data pattern. On the other hand, in row block RB1, an inverted data pattern of the data pattern generated by data pattern generator 77 or 92 is stored.

Therefore, also in the case of using one data pattern generator internally, different data patterns can be stored in the address regions determined by address signal bit ADD<n> in the memory array, and a more accurate memory cell test can be carried out.

In the divided configuration of the memory array shown in FIGS. 49A and 49B, address signal bit ADD<n> may be the least significant address bit of the row address signal bits. In this case, the data pattern can be inverted every row and in addition to the checker pattern in the row direction (column extending direction), a checker pattern in the column direction (row extending direction) can be stored.

As described above, according to the nineteenth embodiment of the invention, test data generated by the data pattern generator is selectively inverted according to the address signal bit. According to the address region, the data pattern or the inverted pattern of the data pattern can be stored. Thus, by using a small number of data pattern generator(s), a complicated data pattern can be stored in memory cells in the test mode.

Twelfth Embodiment

Figure 50:
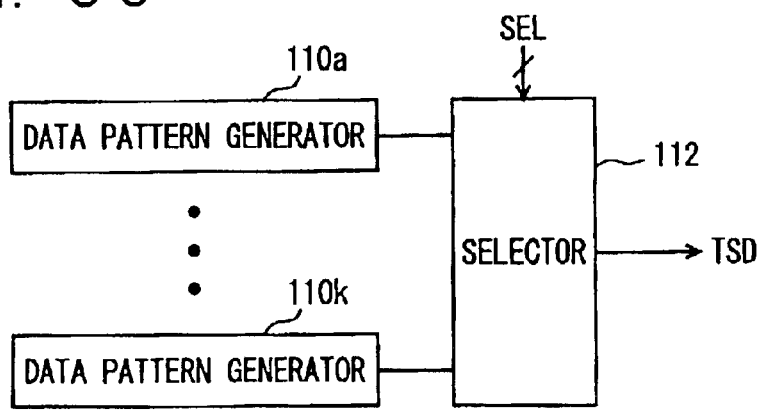
FIG. 50 is a diagram schematically showing the configuration of a data pattern generating section according to a twentieth embodiment of the invention.

FIG. 50 is a diagram schematically showing the configuration of a test data pattern generating section according to a twelfth embodiment of the invention. In FIG. 50, the test data pattern generating section includes a plurality of data pattern generators 110a to 110k and a selector 112 for selecting output data of data pattern generators 110a to 110k to generate test write data TSD in accordance with a selection signal SEL.

Data pattern generators 110a to 110k generate data patterns which are different from each other. One of output data of data pattern generators 110a to 110k is selected according to selection signal SEL and test data TSD to be written to a memory cell is generated. The test data pattern to be written into the memory array can be variously changed, and a more accurate test can be performed.

First Configuration of Selection Signal Generating Section

Figure 51:
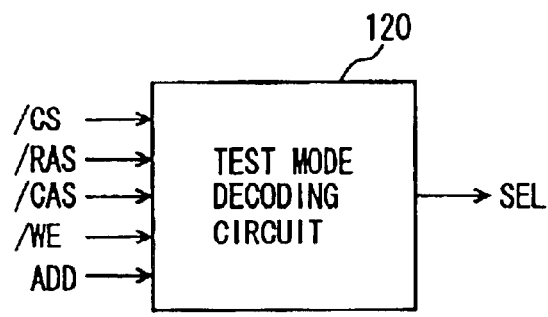
FIG. 51 is a diagram showing the configuration of a selection signal generating section illustrated in FIG. 50.

FIG. 51 is a diagram schematically showing the configuration of a section for generating selection signal SEL shown in FIG. 50. In FIG. 51, selection signal SEL is generated by a test mode decoding circuit 120. Test mode decoding circuit 120 receives chip select signal /CS, row address strobe signal /RAS, column address strobe signal /CAS, write enable signal /WE, and the predetermined number of bits of address signal ADD and drives a selection signal corresponding to a designated test mode into an active state. When a WCBR condition (WE and CAS before RAS), for example is set, test mode decoding circuit 120 selects, according to address signal ADD, output data of the test data pattern generator corresponding to the test mode designated among selection signal SEL of a plurality of bits. Under the WCBR condition, chip select signal /CS is at the L level.

In test mode decoding circuit 120 shown in FIG. 51, selection signal SEL is selectively generated synchronously with an external signal, not internal clock CLK. Alternately, test mode decoding circuit 120 may be configured to be supplied with internal clock signal CLK for determining the logic levels of the external signals at the rising edge of internal clock signal CLK.

Second Configuration of Selection Signal Generating Section

Figure 52:
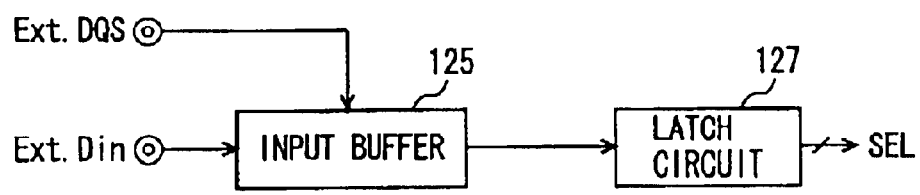
FIG. 52 is a diagram schematically showing the configuration of a first modification of the selection signal generating section illustrated in FIG. 50.

FIG. 52 is a diagram schematically showing another configuration of the section for generating selection signal SEL shown in FIG. 50. In FIG. 52, the selection signal generating section includes an input buffer 125 for taking in external input data Ext.Din in accordance with external data strobe signal Ext.DQS and a latch circuit 127 for latching an output signal of input buffer 125 and generating selection signal SEL. Latch circuit 127 is activated in the test operation mode and latches supplied data.

In the case of use of the data pattern generator for generating a test data pattern internally, it is unnecessary to take in externally supplied write data. Therefore, in the case of use of the data pattern generator, external data strobe signal Ext.DQS does not have to be generated and is not used. Consequently, by using external data strobe signal Ext.DQS which is not used in the test mode, as a control signal for setting a selection signal, in order to set selection signal SEL, selection signal SEL can be set at any intended timing.

Since external write data is not used in the test mode, using external data strobe signal Ext.DQS, a selection signal of selection signal SEL can be selected by using input buffer 125 without any problem. Input buffer 125 takes in external write data Ext.Din in accordance with data strobe signal Ext.DQS (or internal data strobe signal DQS) and generates internal write data in the normal operation mode.

As data generated by input buffer 125, either data DILF or DIL may be used to set selection signal SEL.

Input buffer 125 may be provided dedicatedly for a test, separately from a circuit for inputting data in the normal operation mode.

Latch circuit 127 simply latches a signal supplied from input buffer 125 and is formed of, for example, an inverter latch. Latch circuit 127 may be activated in response to test mode instruction signal TM to perform latching operation so as to latch data from input buffer 125 in the test mode. Where input buffer 125 is used also in the normal operation mode, latch circuit 127 is disconnected from input buffer 125 by using the test mode instruction signal in the normal operation mode. Thus, latch circuit 127 can be prevented from operating according to write data in the normal operation mode to reduce power consumption.

Third Configuration of Selection Signal Generating Section

Figure 53:
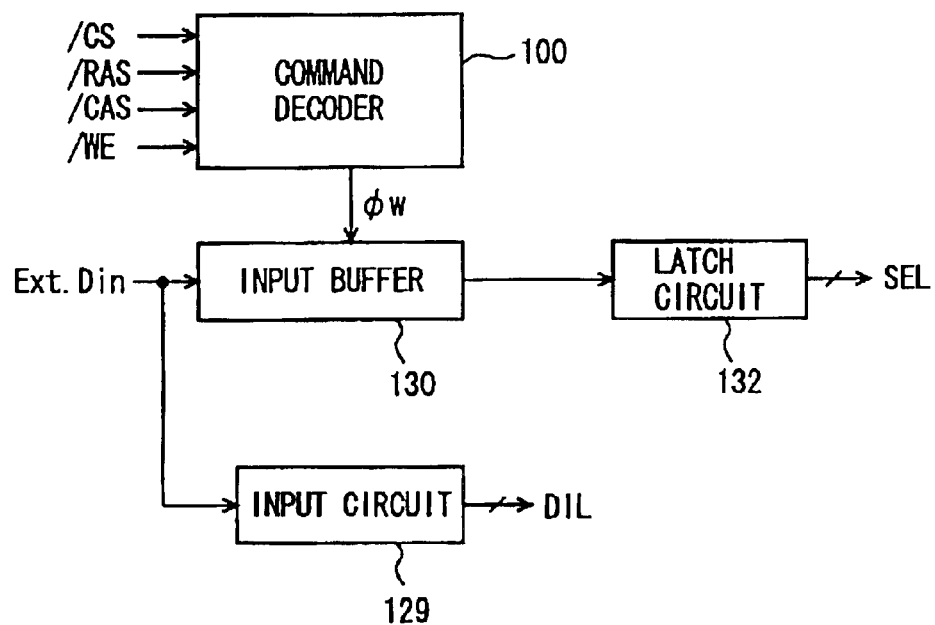
FIG. 53 is a diagram schematically showing the configuration of a second modification of a section of generating a selection signal illustrated in FIG. 50.

FIG. 53 is a diagram schematically showing further another configuration of the section of generating selection signal SEL illustrated in FIG. 50. In FIG. 53, according to write operation instruction signal φw from command decoder 100, an input buffer 130 takes in external write data Ext.Din, and a latch circuit 132 latches an output signal of input buffer 130 and generates selection signal SEL. Specifically, input buffer 130 and latch circuit 132 each include a circuit having a width of a plurality of bits, take in and latch data of a plurality of bits, and generate selection signal SEL. The latch signal of latch circuit 132 may be further decoded to generate selection signal SEL.

Input buffer 130 is provided separately from an input circuit 129 for generating internal write data DIL in the normal operation mode. In the case where a data strobe signal is used, when a write command is supplied, input circuit 129 generally takes in and transfers external write data Ext.Din to generate internal write data in accordance with an internal data strobe signal and a transfer/latch instruction signal generated synchronously with the data strobe signal. In the case where the data strobe signal is not used, input circuit 129 takes in and latches data supplied according to write operation instruction signal φwr, clock signal CLK and burst length, when the write command is applied. In the test operation mode, input circuit 129 is not used and data generated by the data pattern generator is written as test data into a selected memory cell.

In the configuration shown in FIG. 53, when test data is written into a selected memory cell, by setting selection signal SEL in latch circuit 132 in accordance with external data, a data pattern can be generated according to the write data.

In the configuration shown in FIG. 53, test mode instruction signal TM is applied to input buffer 130. Input buffer 130 may be constructed to takes in external write data Ext.Din only in the test operation mode.

In the semiconductor memory device using no data strobe signal, input buffer 130 and input circuit 129 may be formed into a common circuit. According to a write operation control signal, not write operation instruction signal φw, input buffer 130 takes in external write data and a selection signal is latched by latch circuit 132.

Latch circuit 132 is activated in the test operation mode to perform the latching operation.

As described above, according to the twelfth embodiment of the invention, a plurality of data pattern generators are provided, pattern data from one data pattern generator is selected, according to a selection signal, and transferred to selected memory cells. Consequently, a various data pattern can be generated according to a test mode and written into memory cells. A test of interference between memory cells or the like can be preformed.

21st Embodiment

Figure 54:
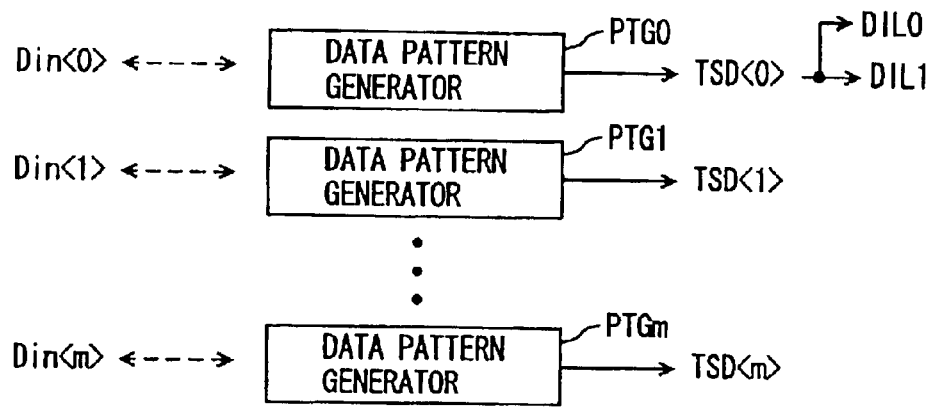
FIG. 54 is a diagram schematically showing the configuration of a data pattern generating unit according to a 21st embodiment of the invention.

FIG. 54 is a diagram schematically showing the configuration of a test data pattern generating section according to a 21rst embodiment of the invention. In the configuration shown in FIG. 54, data pattern generators PTG0 to PTGm are provided in correspondence to data input terminals. Specifically, data pattern generators PTG0 to PTGm are provided in correspondence to write data Din<0> to Din<m>, respectively, and test data TSD<0> to TSD<m> from data pattern generators PTG0 to PTGm are written into memory cells of corresponding IO blocks. From test data TSD<i>, data DILi0 and DILi1 of two bits for the corresponding IO block is generated.

Thus, a data pattern can be generated for each IO block, the data pattern can be varied every data bit, and a complicated test can be carried out.

Modification

Figure 55:
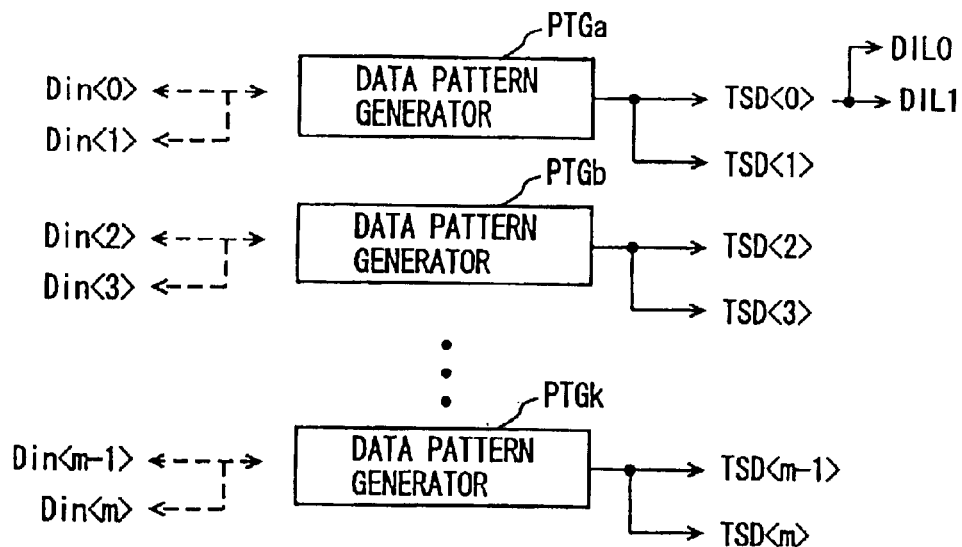
FIG. 55 is a diagram schematically showing the configuration of a modification of a data pattern generating section according to the 21st embodiment of the invention.

FIG. 55 is a diagram showing a modification of the data pattern generating section according to the twenty first embodiment of the invention. In FIG. 55, one data pattern generator is provided for a predetermined number of write data bits. FIG. 55 shows, as an example, a configuration in which one data pattern generator is provided per two data input terminals. Specifically, a data pattern generator PTGa is disposed in correspondence to input data Din<0> and Din<1>, and a data pattern generator PTGb is provided in correspondence to input data Din<2> and Din<3>. A data pattern generator PTGk is disposed in correspondence to input data Din<m-1> and Din<m>.

Data pattern generator PTGa generates test data TSD<0> and TSD<1> in correspondence to write data Din<0> and Din<1>, and data pattern generator PTGb generates test data TSD<2> and TSD<3>. Data pattern generator PTGk generates test data TSD<m-1> and TSD<m>.

Test data TSD generated by each of data pattern generators PTGa to PTGk is selected by a corresponding selector in each clock cycle and transferred as 2-bit parallel data per data terminal. According to test data TSD<0>, 2-bit parallel data DIL0 and DIL1 are transferred to an IO block provided in correspondence to the data input node.

In the case of the configuration shown in FIG. 55, one data pattern generator is disposed in correspondence to a plurality of data input terminals, so that the flexibility of the test data pattern may decrease as compared with the configuration shown in FIG. 54. However, the number of data pattern generators can be reduced and accordingly, the occupying area of the pattern generators can be advantageously reduced.

Each of data pattern generators PTGa to PTGk does not have to be disposed for 2-bit input data, but they may be disposed on a byte-data or word-data basis.

As described above, according to the 21st embodiment of the invention, a data pattern generator is disposed corresponding to a data input terminal. At least every predetermined number of data terminals, the test data pattern can be varied. Therefore, the flexibility of the test data pattern can be improved, and a more accurate test can be performed.

22nd Embodiment

Figure 56:
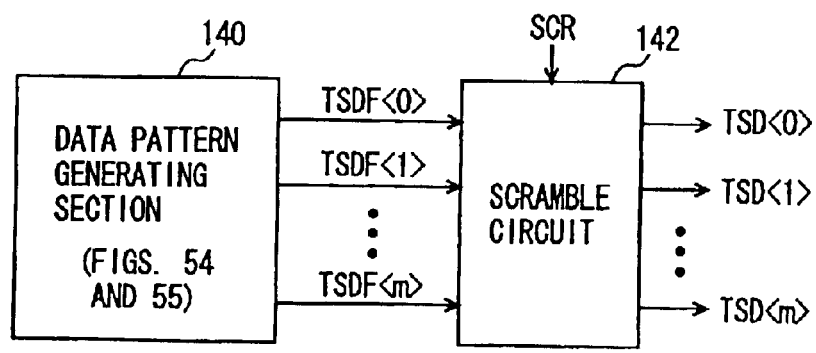
FIG. 56 is a diagram schematically showing the configuration of a data pattern generating section according to a 22nd embodiment of the invention.

FIG. 56 is a diagram schematically showing the configuration of a test data generating section according to a 22nd embodiment of the invention. In FIG. 56, the test data generating section includes a data pattern generating section 140 for generating test data TSDF<0:m> and a scramble circuit 142 for scrambling test data pattern TSDF<0:m> from data pattern generating section 140, in accordance with a scramble signal SCR, to generate test data TSD<m:0>. Test pattern generating section 140 includes data pattern generators PTG0 to PTGm shown in FIG. 54 or PTGa to PTGk shown in FIG. 55 and generates test data pattern TSDF<m:0>. Test data bit TSD<i> is generated in correspondence to a data terminal.

Scramble circuit 142 switches connection between data TSDF<0> to TSDF<m> and test data TSD<0> to TSD<m> in accordance with scramble signal SCR. Specifically, internal test data TSDF<0> to TSDF<m> generated for each data terminal is scrambled by scramble circuit 142, and write data TSD<0> to TSD<m> to memory cells are generated, thereby allowing a data pattern for each data terminal to be changed. The flexibility of the data pattern for each data terminal can be further increased and an accurate memory cell test can be performed.

Figure 57:
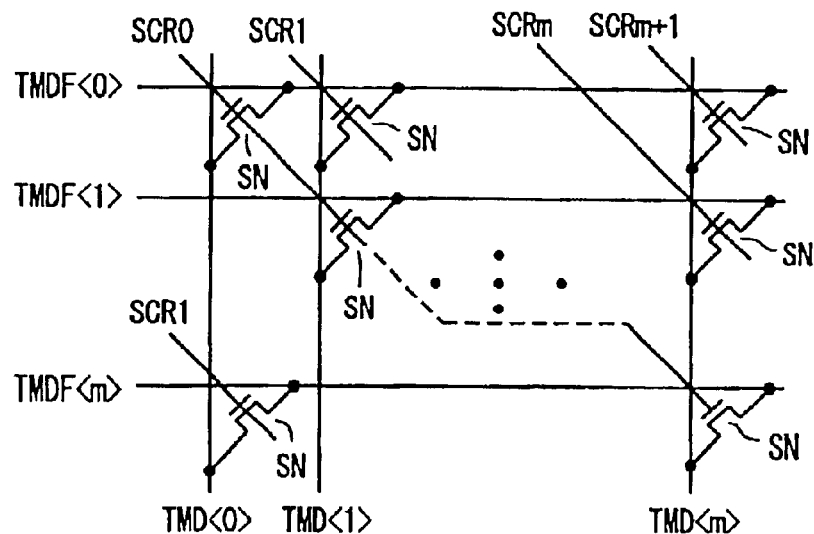
FIG. 57 is a diagram showing an example of the configuration of a scramble circuit illustrated in FIG. 56.

FIG. 57 is a diagram showing an example of the configuration of scramble circuit 42 illustrated in FIG. 56. In FIG. 57, at the intersections of signal lines for transmitting data TMDF<0> to TMDF<m> from data pattern generating section 140 and signal lines for transmitting output data TMD<0> to TMD<m> of scramble circuit 142, switching elements SW are arranges. In the configuration shown in FIG. 57, as an example, the same scramble signal is supplied to switching elements SW disposed being aligned on a diagonal line. In the arrangement shown in FIG. 57, test data TMDF<0> to TMDF<m> are sequentially shifted to generate test data TMD<0> to TMD<m>. As a shift signal, scramble signals SCR0 to SCRm+1 are used. For example, when shift signal SCR0 is made active, switching elements SW disposed on a common diagonal line are made conductive, test signals TMDF<0> to TMDF<m> are coupled to test write data TMD<0> to TMD<m>, respectively, in a one-to-one correspondence relationship. In the case where shift signal SCR1 is made active, shift data TMDF<0> to TMDF<m> is shifted by one bit and test data TMD<1> to TMD<m> and TMD<0> is transmitted.

As shown in FIG. 57, therefore, in scramble circuit 42, by disposing switching elements SW in an appropriate manner in accordance with a scramble route, a mode of scrambling the test data can be determined according to scramble signal SCR.

Figure 58:
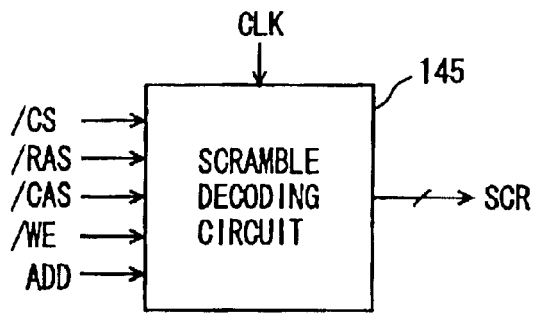
FIG. 58 is a diagram schematically showing the configuration of a section of generating a scramble signal illustrated in FIG. 56.

FIG. 58 is a diagram showing the configuration of a section of generating scramble signal SCR illustrated in FIG. 56. In FIG. 58, the scramble signal generating section includes a scramble decoding circuit 145 for determining that a scramble setting mode is designated when external signals /CAS, /RAS, /CS, and /WE are each set to a predetermined logic level state at the rising edge of internal clock signal CLK and generating scramble signal SCR according to currently applied address signal ADD. When chip select signal /CS, row address strobe signal /RAS, column address strobe signal /CAS, and write enable signal /WE are set, for example, to the WCBR condition at the rising edge of internal clock signal CLK, scramble decoding circuit 145 decodes predetermined bits of address signal ADD to generate scramble signal SCR. Scramble decoding circuit 145 therefore contains a latch circuit and latches the set scramble signal SCR until the test mode is reset (reset path is not shown).

In the configuration shown in FIG. 58, write data Din may additionally supplied, as scramble mode setting data, to scramble decoding circuit 145 to generate scramble signal SCR in accordance with the address signal bit and write data.

Generally, in a synchronous type semiconductor memory device, a mode register for setting an operation mode (column latency, burst length, or the like) is provided, and a mode register set command for setting data in the mode register is prepared. Therefore, the mode register set command may be used to generate scramble signal SCR.

Modification

Figure 59:
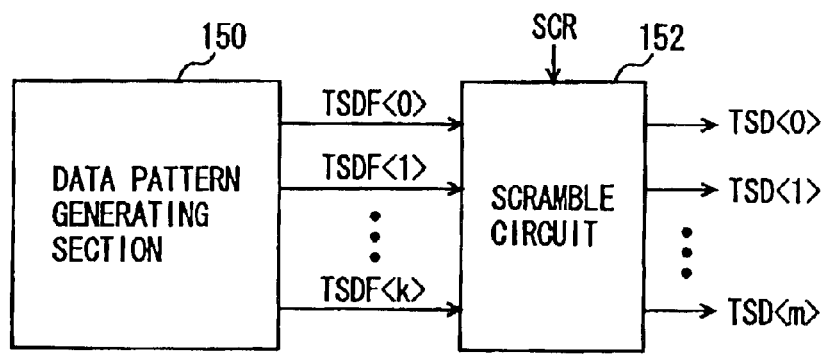
FIG. 59 is a diagram schematically showing the configuration of a modification of the data pattern generating section according to the 22nd embodiment of the invention.

FIG. 59 is a diagram showing a modification of the twenty second embodiment of the invention. In FIG. 59, a data pattern generating section 150 generates test data TSDF<0> to TSDF<k>. The number of test data TSDF<0> to TSDF<k> is smaller than the number of data terminals. For example, data pattern generating section 150 has the configuration shown in FIG. 55.

A scramble circuit 152 is provided which scrambles test data TSDF<0> to TSDF<k> from data pattern generating section 150 in accordance with scramble signal SCR to generate write test data TSD<0> to TSD<m> for memory cells.

Scramble circuit 152 switches a transmission path of data TSDF<0> to TSDF<k> generated by data pattern generating section 150 in accordance with scramble signal SCR and generates test write data TSD<0> to TSD<m> for memory cells.

In the case of the configuration shown in FIG. 59, data pattern generating section 150 does not have to generate test data TSDF<0> to TSDF<k> in correspondence to data input terminals, so that the number of internally provided test data pattern generators can be reduced.

As described above, according to the 22nd embodiment of the invention, a test data pattern from a data pattern generating section is scrambled to generate memory cell write data corresponding to each data terminal. The flexibility of the write data pattern to a memory cell can be advantageously improved.

23rd Embodiment

Figure 60:
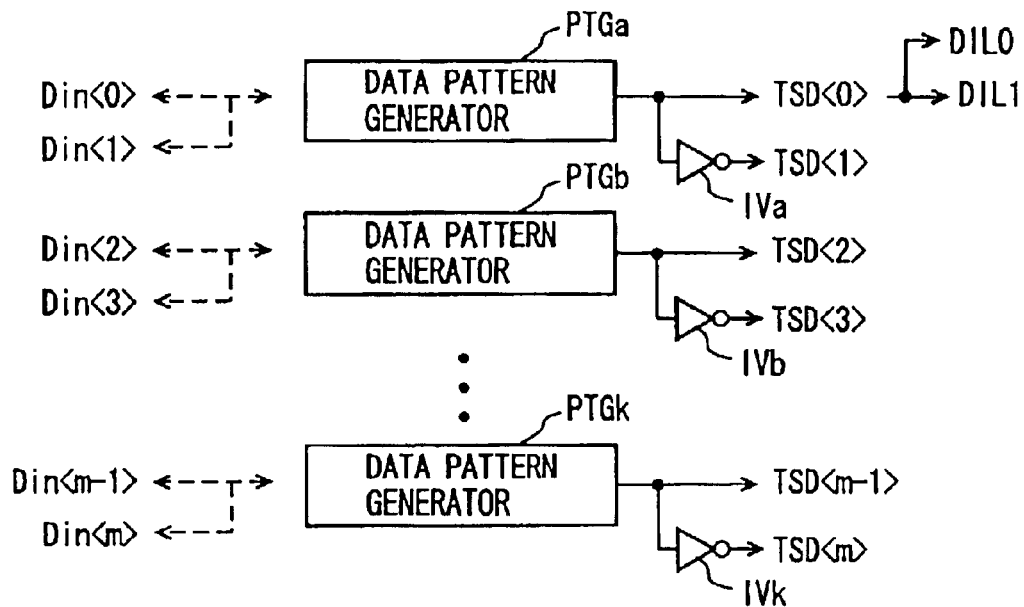
FIG. 60 is a diagram schematically showing the correspondence relation between a data input terminal of a data pattern generating section and internal test data in accordance with a 23rd embodiment of the invention.

FIG. 60 is a diagram schematically showing the configuration of a test data pattern generating section according to a 23rd embodiment of the invention. In the configuration shown in FIG. 60, in correspondence to data pattern generators PTGa to PTGk, inverters IVa to IVk are provided, respectively.

Therefore, from each of data pattern generators PTGa to PTGk, test data complementary to each other are generated equivalently. The complementary test data are transferred as test data corresponding to different data input terminals.

In FIG. 60, each of data pattern generators PTGa to PTGk is disposed in correspondence to 2-bit input data. The complementary data are transferred to internal data lines corresponding to the 2-bit input data. For example, test data TSD<0> and TSD<1> are data complementary to each other, test data TSD<2> and TSD<3> are data complementary to each other, and test data TSD<m-1> to TSD<m> are data complementary to each other.

In the case of the configuration shown in FIG. 60, therefore, with the reduced number of data pattern generators PTGa to PTGk, a different data pattern can be supplied for each data terminal.

Modification

Figure 61:
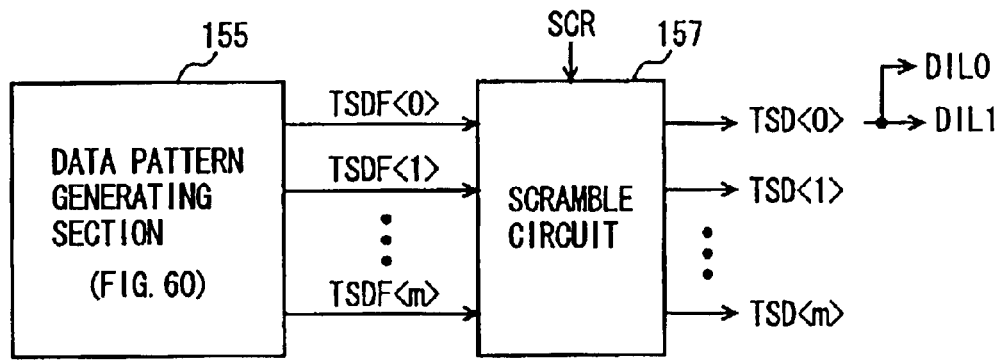
FIG. 61 is a diagram schematically showing the configuration of the data pattern generating section according to the 23rd embodiment of the invention.

FIG. 61 is a diagram schematically showing a modification of the test data generating section of the 23rd embodiment of the invention. In FIG. 61, a scramble circuit 157 is provided for a data pattern generating section 155 for generating test data TSD<m:0>. Test signals TSDF<0> to TSDF<m> shown in FIG. 61 correspond to test data TSD<0> to TSD<m> shown in FIG. 60, respectively.

Scramble circuit 157 scrambles test data TSDF<m:0> from data pattern generating section 155 in response to scramble signal SCR to generate test write data TSD<m:0> for a memory cell.

In the case of the configuration shown in FIG. 61, therefore, the test data pattern can be varied every IO block corresponding to each data terminal. Further, by scrambling test data by means of scramble circuit 157, the flexibility of the test data pattern can be increased, and an accurate memory cell test can be performed.

First Configuration of Scramble Signal Generating Section

Figure 62:
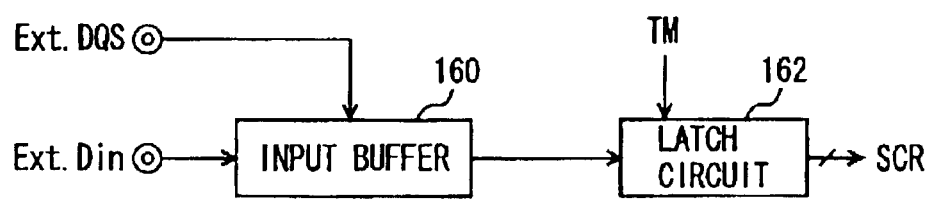
FIG. 62 is a diagram schematically showing the configuration of a section of generating a scramble signal illustrated in FIG. 61.

FIG. 62 is a diagram schematically showing the configuration of a section of generating scramble signal SCR shown in FIG. 61. In FIG. 62, the scramble signal generating section includes an input buffer 160 for taking in signal Ext.Din supplied to the data input terminal in accordance with external data strobe signal Ext.DQS and a latch circuit 162 for latching an output signal of input buffer 160. Scramble signal SCR is generated from latch circuit 162.

In the test operation mode, test data is internally generated, so that it is unnecessary to supply external data strobe signal Ext.DQS. Therefore, the terminal for the data strobe signal is used for activating input buffer 160 selectively, signal Ext.Din supplied to the data input terminal is taken in and latched by latch circuit 162, thereby enabling scramble signal SCR to be generated according to external data. In this case, input buffer 160 and latch circuit 162 may be constructed by a circuit having a width of a plurality of bits and scramble signal SCR may be set by external data Ext.Din of a plurality of bits. Alternatively, further a decoder may be provided to latch circuit 162 to decode the data latched by latch circuit 152, for generating scramble signal SCR.

Input buffer 160 shown in FIG. 62 is provided separately from the buffer circuit in the input circuit for inputting write data in the normal operation mode. The input circuit for inputting data in the normal operation mode operates in accordance with the data strobe signal and transfer/latch instruction signal internally generated. Consequently, in the case of supplying a signal via a strobe terminal which receives external data strobe signal Ext.DQS and setting input buffer 160 to a state of taking in an external signal, input buffer 160 has to be provided separately. Input buffer 160 may be activated in response to signal Ext.DQS applied to the strobe terminal only in the test mode.

Second Configuration of Scramble Signal Generating Section

Figure 63:
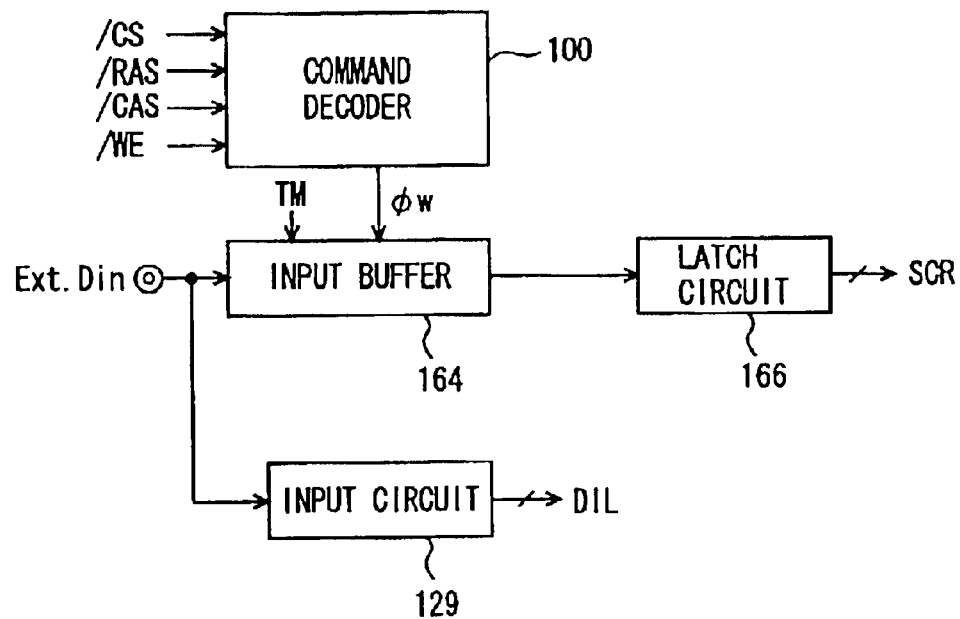
FIG. 63 is a diagram showing a first modification of the configuration of the section of generating the scramble signal illustrated in FIG. 61.

FIG. 63 is a diagram schematically showing the configuration of a section of generating scramble signal illustrated in FIG. 61. In FIG. 63, the scramble signal generating section includes an input buffer 164 for taking in external signal Ext.Din of a plurality of bits applied to a data input terminal when write operation mode instruction signal φw applied from command decoder 100 is made active, and a latch circuit 166 for latching an output signal of input buffer 164 and generating scramble signal SCR. Input buffer 164 is provided separately from input circuit 129 for taking in external data Ext.Din and generating internal write data DIL in the normal operation mode.

In the case of the configuration shown in FIG. 63, the state of scramble signal SCR can be set in the operation mode of performing data writing, to enable internal write test data to be generated according to a data pattern from the data pattern generator.

In the configuration shown in FIG. 63 as well, input buffer 164 may be constructed to be activated only in the test mode.

The output signal of latch circuit 166 may be further decoded, thereby generating scramble signal SCR.

The configuration of the scramble signal generating section shown in FIGS. 62 and 63 may be used to generate scramble signal SCR shown in FIG. 56.

As described above, according to the 23rd embodiment of the invention, output data of the data pattern generators of the number smaller than that of the data input terminals is scrambled to generate test write data to memory cells. Therefore, a test data pattern can be flexibly generated by using the test data pattern generators of a reduced number, and a more accurate test can be performed.

24th Embodiment

Figure 64:
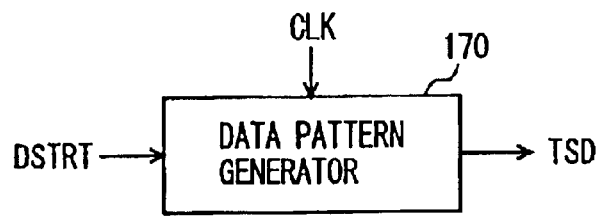
FIG. 64 is a diagram schematically showing the configuration of a data pattern generating section according to a 24th embodiment of the invention.

FIG. 64 is a diagram schematically showing the configuration of a data pattern generator according to a 24th embodiment of the invention. The initial value of a data pattern generator 170 shown in FIG. 64 can be set by initialization data DSTRT. Therefore, different from a data pattern generator having a resetting function, the initial value of data pattern generator 170 can be set according to initialization data DSTRT, the flexibility of the data pattern generated by data pattern generator 170 can be increased.

Figure 65:
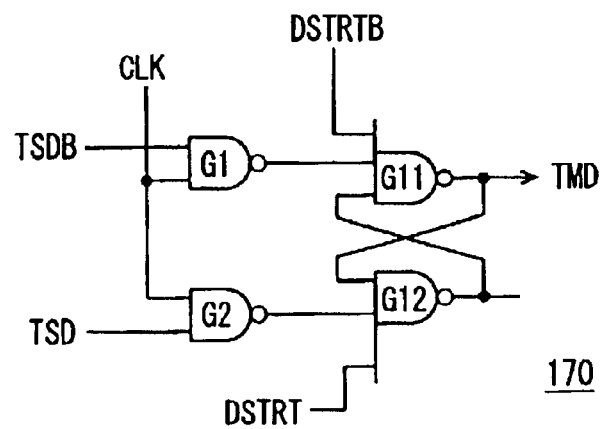
FIG. 65 is a diagram showing an example of the configuration of the data pattern generator illustrated in FIG. 64.

FIG. 65 is a diagram showing the configuration of a main portion of data pattern generator 170 illustrated in FIG. 64. In FIG. 65, data pattern generator 170 includes NAND gates G1 and G2 for transferring output test data TSDB and TSD in accordance with internal dock signal CLK, and NAND gates G11 and G12 constructing a cross-coupled type flip flop for latching output signals of NAND gates G1 and G2.

NAND gate G1 receives initialization data DSTRT via an inverter IV5 at its first input, receives an output signal of NAND gate G1 at its second input, receives an output signal of NAND gate G12 at its third input, and generates internal test mode data TMD.

NAND gate G12 receives initialization data DSTRT at its first input, receives NAND gate G2 at its second input, and receives an output signal of NAND gate G11 at its third input.

When initialization data DSTRT is at the H level, complementary initialization data DSTRTB is at the H level, and internal test mode data TMD is set to the H level. At this time, an output signal of NAND gate G12 goes low (when internal clock signal CLK is at the L level), and internal test data TMD can be initialized to the H level.

On the other hand, when initialization data DSTRT is at the L level, a complementary initialization data DSTRTB is at the H level. When an output signal of NAND gate G12 is at the H level and internal clock signal CLK is at the L level, internal test mode data TMD output from NAND gate G11 attains the L level.

As shown in FIG. 65, by using initialization data DSTRT, the state of internal test mode data TMD of data pattern generator 170 can be set, and the logic level of first data in a data pattern train can be accordingly set. After completion of the initialization operation, both initialization data DSTRT and DSTRTB are set to the H level, to exerts no influence on the flip flop operation of NAND gates G11 and G12.

First Configuration of Initialization Data Generating Section

Figure 66:
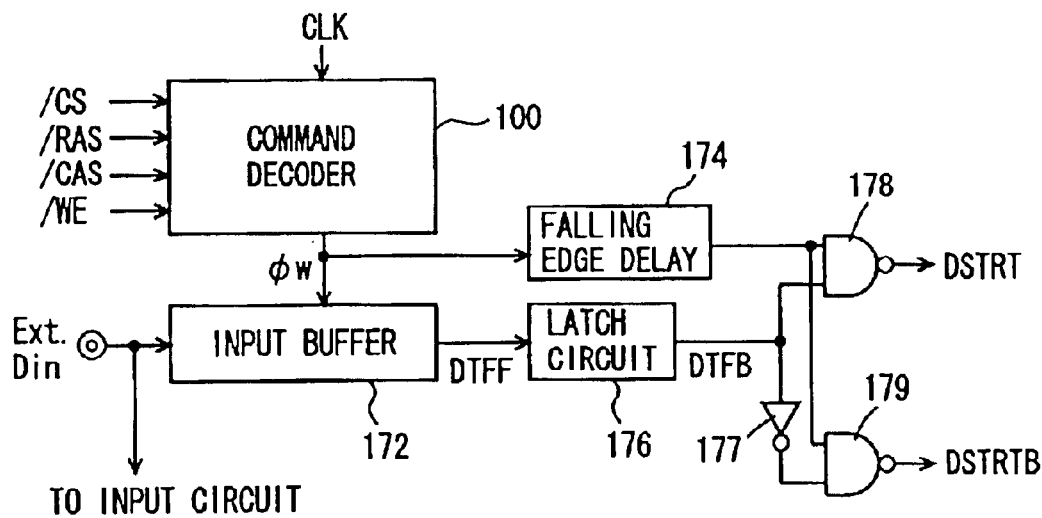
FIG. 66 is a diagram schematically showing the configuration of a section of generating initialization data illustrated in FIG. 64.

FIG. 66 is a diagram schematically showing the configuration of a section of generating initialization data DSTRT and DSTRTB illustrated in FIG. 65. In FIG. 66, the initialization data generating section includes an input buffer 172 for taking in data Ext.Din supplied to a data input terminal in response to write operation mode instruction signal φw from command decoder 100, a latch circuit 176 for latching and inverting output data DTFF of input buffer 172, a fall delaying circuit 174 for delaying the falling of write operation mode instruction signal φw by a predetermined time, an inverter circuit 177 receiving data latched by latch circuit 176, an NAND circuit 178 receiving an output signal of fall delaying circuit 174 and latched data DTFB of latch circuit 176 and generating initialization data DTSRT, and an NAND circuit 179 receiving an output signal of inverter 177 and an output signal of fall delaying circuit 174 and generating complementary initialization data DTSRTB.

Latch circuit 176 is formed of, for example, an inverter latch for inverting and latching data DTFF supplied from input buffer 172.

Figure 67:
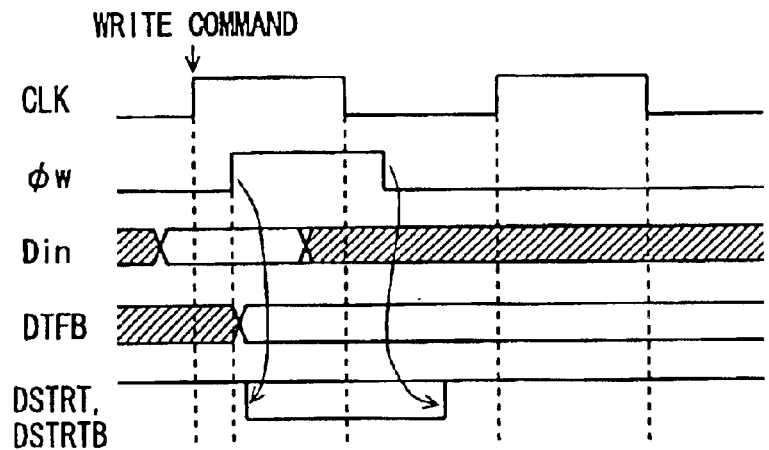
FIG. 67 is a timing chart representing an operation of an initial value data generating section illustrated in FIG. 66.

A data input terminal to which input buffer 172 is connected is coupled to an input circuit for generating internal write data in the normal operation mode. Now, the operation of the initialization data generating section shown in FIG. 66 will be described with reference to the timing chart of FIG. 67.

When a write command is supplied at the rising edge of internal clock signal CLK, command decoder 100 generates write operation instruction signal φw having a predetermined time width. Simultaneously with the write command, initialization data Din is supplied to the data input terminal. Input buffer 172 takes in initialization data Din supplied externally in accordance with write operation instruction signal φw and generates data DTFF.

Latch circuit 176 inverts and latches data DTFF from input buffer 172. When write operation instruction signal φw is at the H level, NAND circuits 178 and 179 operate as an inverter, and generate initialization data DTSRT and DTSRTB in accordance with latched data DTFB of latch circuit 176. When write operation instruction signal φw goes low and a predetermined time elapses, an output signal of fall delaying circuit 174 also goes low, and both output data DSTRT and DSTRTB of NAND circuits 178 and 179 attain H level. Therefore, when fall delay circuit 174 outputs an H-level signal in accordance with write operation mode instruction signal φw from command decoder 100, initialization data DSTRT and DSTRTB are set to the logic levels according to external initialization data Din, and an initial value is set in data pattern generator 170 shown in FIG. 65 when internal clock signal CLK is at the L level.

When an output signal of fall delaying circuit 174 goes low and both initialization data DSTRT and DSTRTB attain H level, both NAND gates G11 and G12 shown in FIG. 65 change the logic levels of their respective output signals in accordance with the signals transferred from NAND gates G11 and G12 synchronously with internal clock signal CLK.

Therefore, by generating initialization data in the form of the one-shot pulse by using the fall delaying circuit as shown in FIG. 66, an initial value can be set in the data pattern generator with reliability.

Fall delaying circuit 174 may be also constructed to delay the falling of write operation instruction signal φw when test mode instruction signal TM is at the H level or active state. In the normal operation mode, the operation of the initialization data generating section can be stopped. With test mode instruction signal TM being applied to input buffer 172, input buffer 172 may be configured to operate only in the test mode.

Second Configuration of Initialization Data Generating Section

Figure 68:
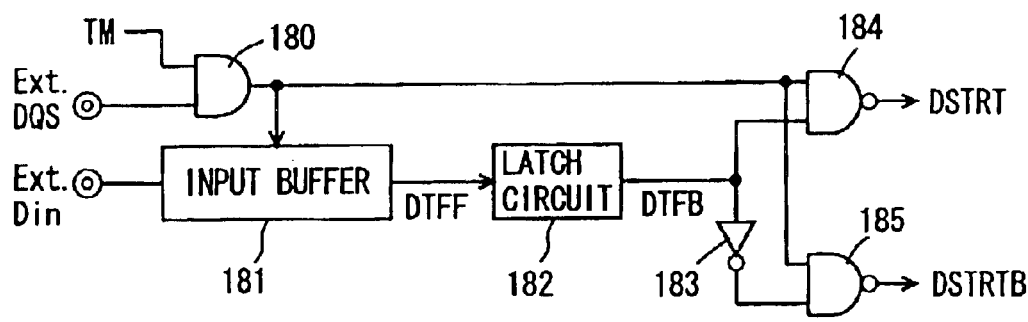
FIG. 68 is a diagram schematically showing the configuration of a first modification of an initial data generating section illustrated in FIG. 64.

FIG. 68 is a diagram showing another configuration of an initialization data generating section. In FIG. 68, the initialization data generating section includes an AND circuit 180 receiving signal Ext.DQS applied externally to a strobe terminal and test mode instruction signal, an input buffer 181 for taking in, as initialization data, data Ext.Din supplied to the data input terminal when an output signal of AND circuit 180 is at the H level, a latch circuit 182 for latching and inverting output data DTFF of input buffer 181, an inverter 183 for inverting latched data DTFB of latch circuit 182, an NAND circuit 184 receiving an output signal of AND circuit 180 and latch data DTFB of latch circuit 182 and generating initialization data DSTRT, and an NAND circuit 185 receiving an output signal of inverter 183 and an output signal of AND circuit 180 and generating complementary initialization data DSTRTB.

Input buffer 181 is a circuit provided separately from the input circuit for generating internal write data in the normal operation mode. Since external data strobe signal Ext.DQS changes synchronously with the clock signal in inputting data in the normal operation mode, the operation of input buffer 181 is stopped in the test mode.

In the test mode, test mode instruction signal TM is at the H level, AND circuit 180 generates a strobe signal in accordance with data strobe signal Ext.DQS applied to the strobe terminal, and input buffer 181 takes in external data Ext.Din supplied to the data input terminal in accordance with the strobe signal from AND circuit 180 and generates internal data DTFF. Latch circuit 182 inverts and latches internal data DTFF of input buffer 181.

Figure 69:
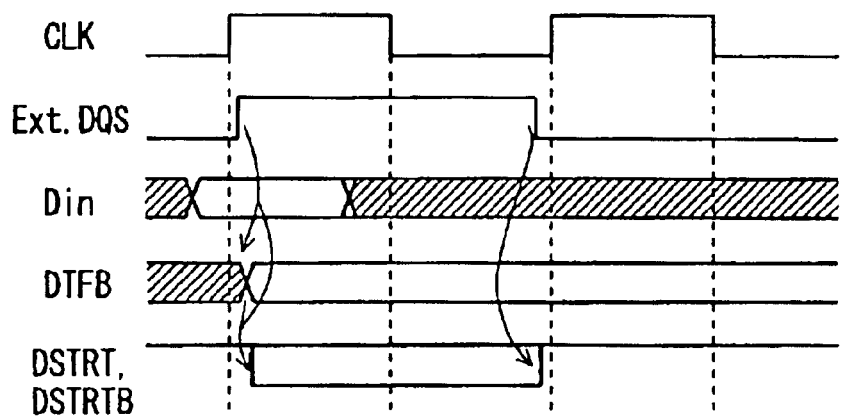
FIG. 69 is a timing chart representing an operation of the circuit illustrated in FIG. 68.

In the test mode, test data is internally generated by the data pattern generator. Consequently, it is unnecessary to generate data strobe signal DQS. Strobe signal Ext.DQS can be generated as a signal having a predetermined time width to set the initialization data (it is not necessarily a clocking signal synchronized with an internal/external clock signal). As shown in the timing chart of FIG. 69, therefore, initialization data DSTRT and DSTRTB can be set in a state according to external initialization data Ext.Din based on the time width of external data strobe signal Ext.DQS.

After completion of the initialization operation, external data strobe signal Ext.DQS is set to the L level, both initialization data DSTRT and DSTRTB are set to the H level, so as not to exert an adverse influence on the transferring operation of the flip flop of the data pattern generator.

By performing initialization with data strobe signal Ext.DQS, initial data of data pattern generator 170 can be initialized at a desired timing when needed. In this case as well, in place of internal clock signal CLK, data strobe signal DQS internally generated may be applied to data pattern generator 170.

As described above, according to the 24th embodiment of the invention, the initial value of the data pattern generator is set according to an external data, and therefore, a test data pattern having a desired pattern can be generated accurately.

25th Embodiment

Figure 70:
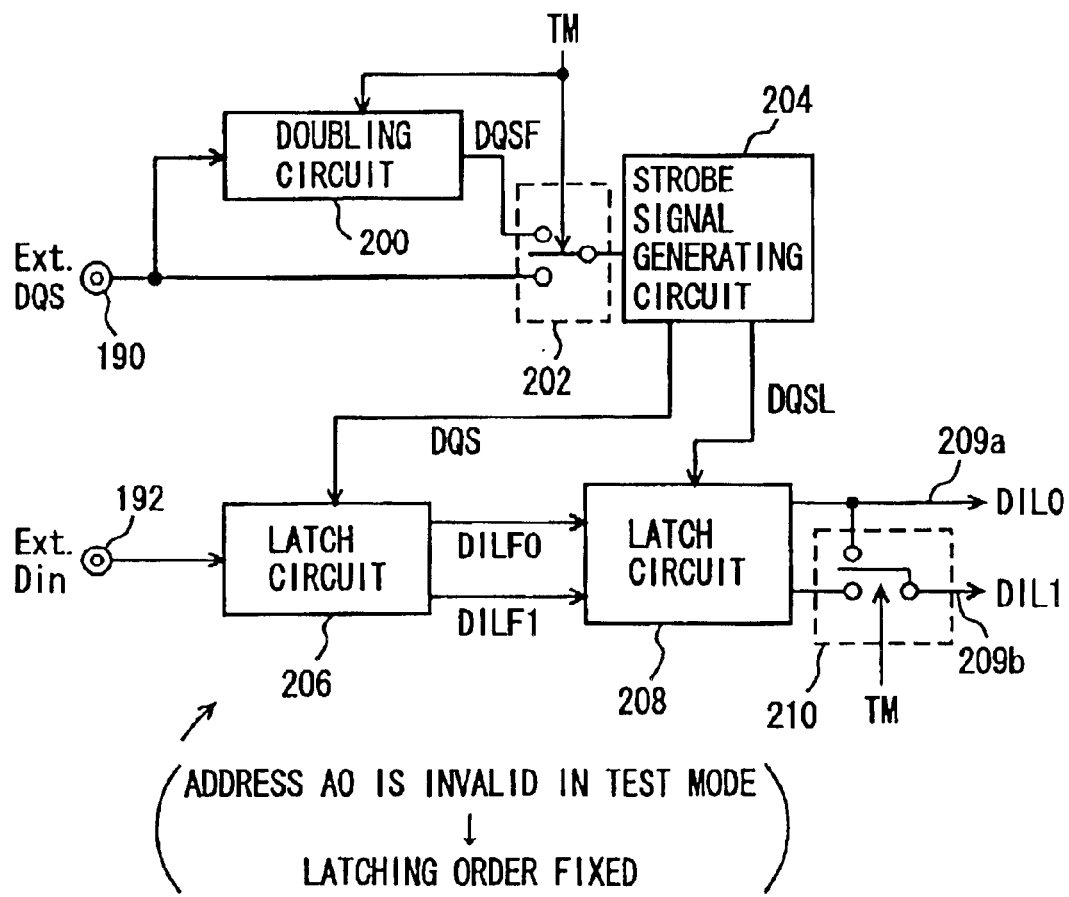
FIG. 70 is a diagram schematically showing the configuration of a data input section according to a 25th embodiment of the invention.

FIG. 70 is a diagram schematically showing the configuration of a data input section according to a 25th embodiment of the invention. In FIG. 70, the data input section includes a doubling circuit 200 for frequency-multiplying external data strobe signal Ext.DQS applied to strobe terminal 190 when test mode instruction signal TM is made active and generating double-speed data strobe signal DQSF, a selector 202 for selecting one of double-speed strobe signal DQSF from doubling circuit 200 and external data strobe signal Ext.DQS applied to strobe terminal 190 in accordance with test mode instruction signal TM, a strobe signal generating circuit 204 for generating internal data strobe signal DQS and transfer/latch instruction signal DQSL in accordance with a signal applied via selector 202, a latch circuit 206 for latching external data Ext.Din supplied to data input terminal 192 and sequentially outputting internal latch data DILF0 and DILF1, a latch circuit 208 for sequentially taking in latch data DILLLF0 and DILF1 output from latch circuit 206 in accordance with transfer/latch instruction signal DQSL and outputting the taken in signals in parallel, and a selector 210 for transmitting a signal on an output signal line 209a of latch circuit 208 onto a signal line 209b in accordance with test mode instruction signal TM.

Data DIL0 and DIL1 are transferred to internal signal lines 209a and 209b, respectively. In the test mode, address signal bit A0 determining the order of taking in data in latch circuit 206 is made invalid and the order of taking in data by the latch circuit is fixed.

Alternatively, signal lines 209a and 209b may be coupled to register circuits, and the contents of these register circuits may be transmitted to internal write data lines in accordance with an address signal. In accordance with an address signal bit, connection between the register circuits and the internal write data lines is established (in normal operation mode). In the test mode, address signal bit A0 is made invalid, and a connection path between the internal write data lines and the register circuits is fixed.

Doubling circuit 200 generates a one-shot pulse signal in response to the rising and falling edges of external data strobe signal Ext.DQS and generates double-speed data strobe signal DQSF.

Strobe signal generating circuit 204 generates internal data strobe signal DQS and transfer/latch instruction signal DQSL in accordance with double-speed data strobe signal DQSF, as in the normal mode of operation. Latch circuit 206 executes latching operation in accordance with internal data strobe signal DQS which is twice as fast as external data strobe signal Ext.DQS in the test mode. The tester transfer write data in accordance with external data strobe signal Ext.DQS. In this case, therefore, write data Ext.Din is transferred at a halved speed of the operating speed of latch circuits 206 and 208.

By transferring a signal on signal line 209*a* onto signal line 204*b* through selector 210 disposed in the output section of latch circuit 208, only the latch circuit transferring external data transfers valid data in each of latch circuits 206 and 208. The valid data is selected by selector 210 and transferred to internal signal lines 209*a* and 209*b*. Thus, even when the internal input circuit operates at a double speed of the external data transfer speed, it can be seen externally that the input circuit operates equivalently at the speed of external data strobe signal Ext.DQS and generates internal write data DIL0 and DIL1 of two bits. Consequently, the internal circuit can be operated at high speed to generate internal write data by using a low-speed tester, and therefore, an accurate test can be carried out.

Another internal circuit operates in accordance with a double-speed internal clock signal having a frequency twice as high as that of the external clock signal, so that the internal circuit can be operated at high speed. The input circuit section can be operated at a quadruple speed of the external clock signal by using a low-speed tester, to write data into the selected memory cells.

Figure 71:
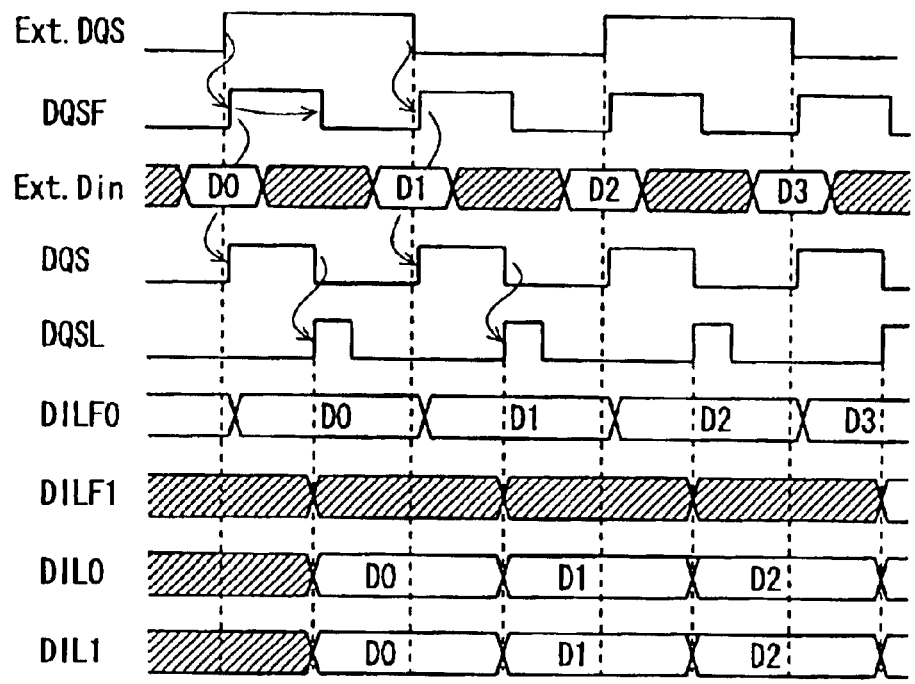
FIG. 71 is a timing chart showing the operation of the data input section illustrated in FIG. 70.

FIG. 71 is a timing chart representing an operation of the data input section illustrated in FIG. 70. Referring to FIG. 71, the operations of the data input section shown in FIG. 70 will be described. Each of latch circuits 206 and 208 has the configuration as described in the foregoing embodiments, and includes two latches provided in parallel. These two latches perform the latching operation alternately.

In the test mode, selector 202 selects double-speed strobe signal DQSF output from doubling circuit 200 and supplies it to strobe signal generating circuit 204. Doubling circuit 200 generates one-shot pulse signals synchronously with the rising and falling edges of signal Ext.DQS supplied to strobe terminal 190 in the test mode.

Strobe signal generating circuit 204 generates internal data strobe signal DQS in accordance with double-speed strobe signal. DQSF and generates transfer/latch instruction signal DQSL in the form of a one-shot pulse in response to the falling edge of internal data strobe signal DQS.

In the input circuit, latch circuit 206 takes in and latches external data Ext.Din supplied to data input terminal 192 in accordance with internal data strobe signal DQS and generates latched data DILF0 in accordance with data D0 to D3 supplied externally in response to the rising edge of internal data strobe signal DQS. External data Ext.Din is supplied from a low-speed tester and transferred synchronously with the falling and rising edges of external data strobe signal Ext.DQS. Therefore, even when the latch circuits in latch circuit 206 perform the latching operation in response to the falling edge of internal data strobe signal DQS, only invalid data is supplied at that time, and latch data DILF1 from latch circuit 206 is kept always in an invalid state.

On the other hand, according to transfer/latch instruction signal DQSL, latch circuit 208 transfers output data DILF0 and DILF1 of latch circuit 206 at the first stage. However, selector 210 transmits output data DIL0 of latch circuit 208 onto signal line 209*b* in accordance with test mode instruction signal TM, so that the signals having the same logic level are simultaneously transmitted as internal write data DIL0 and DIL1. Consequently, when an external low-speed tester transfers write data Ext.Din at low speed synchronously with the rising and falling edges of data strobe signal Ext.DQS, double-speed data strobe signal DQSF is internally generated, and external data is taken in to be expanded in bit width through a copying operation for transference to internal signal lines 209*a* and 209*b*. Consequently, the data input section can be operated at a double speed of the external data strobe signal and the external clock signal, to transfer data according to the external write data to the memory cells.

In latch circuit 206 at the first stage in the input circuit shown in FIG. 70, if in the test mode as well, either of data DILF0 and DILF1 is set first is determined, the switching path of selector 210 has to be altered in accordance with an address signal. In the test mode, however, by fixing the latching order of latch circuit 206 and making the internal address signal invalid, internal data DILF0 can be always generated from latch circuit 206 in accordance with external write data with reliability, and internal write data DIL0 and DIL1 can be generated by selector 210.

In latch circuit 206, the configuration of fixing the latching order is readily achieved by forcibly setting the least significant bit for determining the even/odd of the address signal to a state indicative of, for example, an odd address in accordance with test mode instruction signal TM.

As described above, according to the 25th embodiment of the invention, the data strobe signal which is twice as fast as the external data strobe signal is generated and signals of two bits having the same logic level are generated per data input terminal. Even when a low-speed tester transfers write data at low speed in accordance with the data strobe signal, the input section can be operated, with reliability, at the doubled speed of the external data strobe signal (external clock signal). Even with a low-speed tester, the input circuit can be operated in the DDR mode at high speed to generate the internal write data. Thus, the semiconductor memory device with the DDR mode can be tested at high speed using a low-speed tester.

The address signal is also transferred synchronously with the external clock signal from the low-speed tester. However, by setting the burst length of the semiconductor memory device to a burst length twice as long as the burst length at the time of transfer of the tester, a burst address can be generated internally in accordance with the external address in the semiconductor memory device, to select a memory cell for writing test data to the selected memory cells.

26th Embodiment

Figure 72:
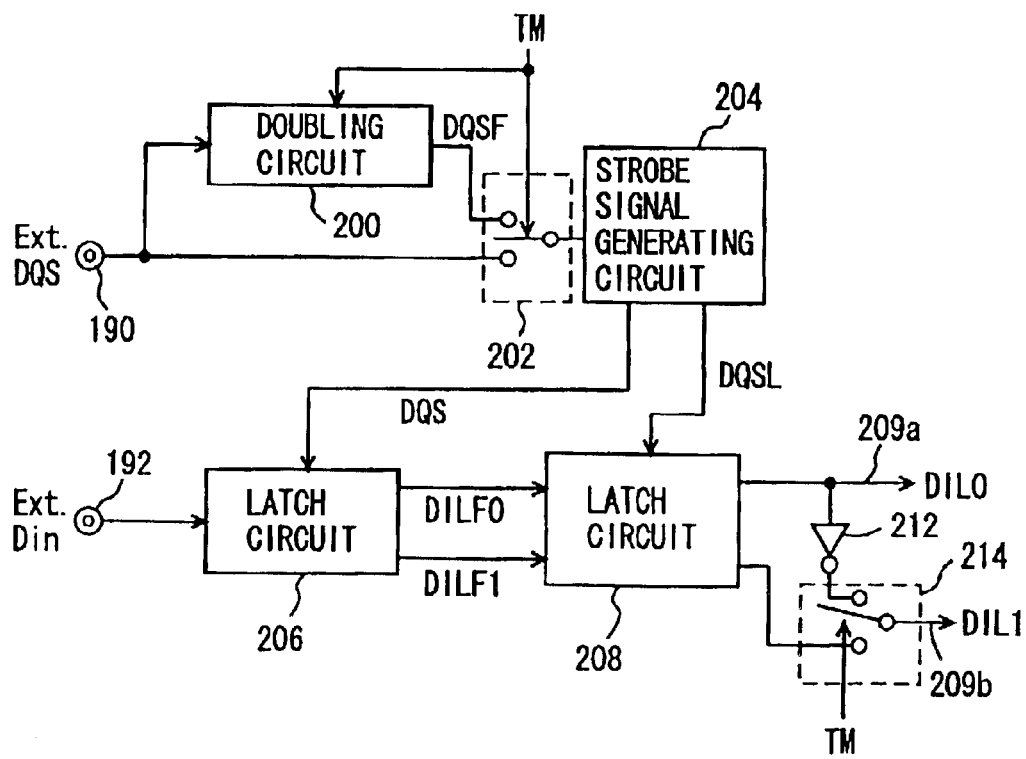
FIG. 72 is a diagram schematically showing the configuration of a data input section according to a 26th embodiment of the invention.

FIG. 72 is a diagram schematically showing the configuration of a data input section according to a 26th embodiment of the invention. The data input section shown in FIG. 72 is different in configuration from the data input section shown in FIG. 70 in the following point. The data input section shown in FIG. 72 includes an inverter 212 receiving data DIL0 on output signal line 209a of latch circuit 208, and a selector 214 for selecting one of an output signal of inverter 212 and output data of latch circuit 208 for transference onto internal data line 209b. The other configuration of the data input section shown in FIG. 72 is the same as that of the data input section shown in FIG. 70. The same reference numerals are designated to the corresponding parts and their detailed description will not be repeated.

In the configuration shown in FIG. 72, when test mode instruction signal TM is activated, selector 214 selects the output signal of inverter 212 and transmits it onto internal data line 209b. Therefore, in the test mode, internal write data DIL0 and DIL1 become complementary data, so that the logic levels of data on the adjacent columns can be always made different from each other. Thus, a test pattern such as a checker pattern can be readily generated and written into memory cells.

The address signal is transferred from a low-speed tester in accordance with external clock signal Ext.CLK. However, when this semiconductor memory device operates in a burst mode and data is transferred in a unit of a burst length BL, by setting the burst length to 2-BL in the semiconductor memory device, the memory cell can be selected accurately and test data can be written into the selected memory cells.

As described above, according to the 26th embodiment of the invention, in the test mode, the double-speed data strobe signal is internally generated to take in data transferred according to the external data strobe signal. Then, the bit width of the taken in data is expanded to generate 2-bit data with one-bit data inverted, and the 2-bit data is transferred to the internal data lines. Thus, even when a low-speed tester is used to transfer write data, a complicated test pattern such as a checker pattern can be generated and written into memory cells. Consequently, the semiconductor memory device with DDR mode can be tested at high speed with the low-speed tester.

In the configuration shown in FIG. 72, inverter 212 may be formed of a tri-state inverter buffer that is selectively activated in accordance with test mode instruction signal TM. By stopping the operation of inverter 212 in the normal operation mode, power consumption in the normal operation mode can be reduced.

27th Embodiment

Figure 73:
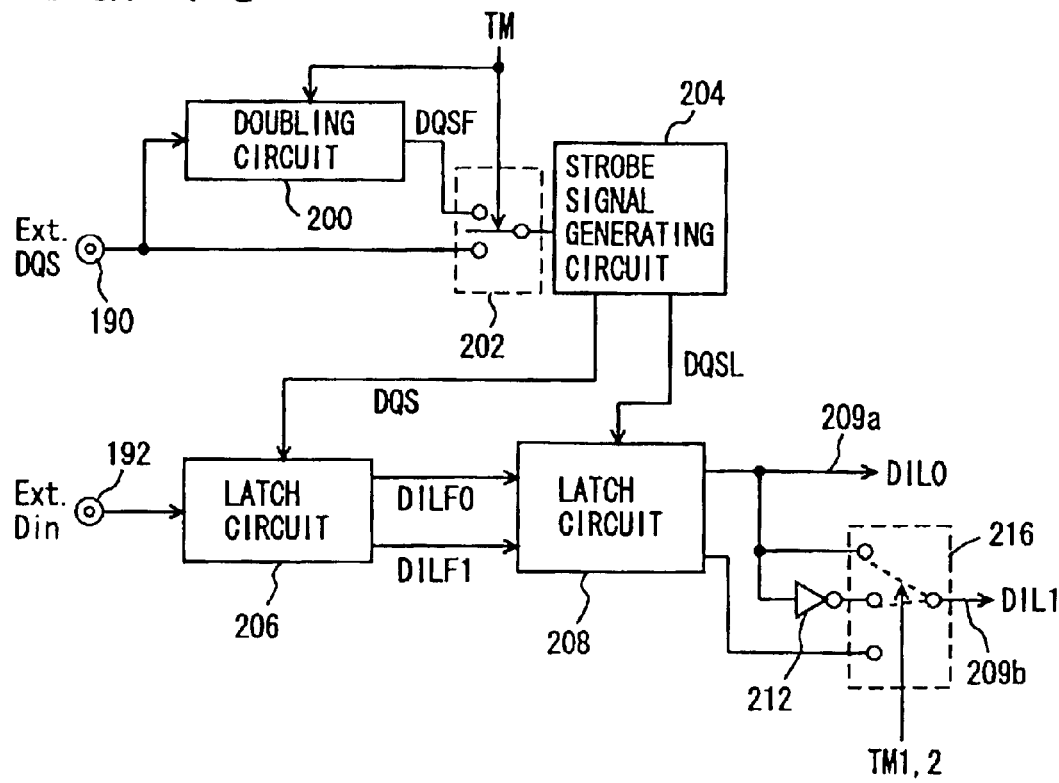
FIG. 73 is a diagram schematically showing the configuration of a data input section according to a 27th embodiment of the invention.

FIG. 73 is a diagram schematically showing the configuration of a data input section according to a 27th embodiment of the invention. The data input section shown in FIG. 73 is different in configuration from the data input section shown in FIG. 70 in the following point. Between latch circuit 208 and internal signal line 209b, a 3:1 multiplexer 216 is provided which selects one of output data of inverter 212 and two bit data of latch circuit 208 in accordance with test mode specifying signals TM1 and TM2 and transmits the selected data to internal signal line 209b. The other configuration of the data input section shown in FIG. 73 is the same as that of the data input section shown in FIG. 70. The same reference numerals are designated to corresponding parts and their detailed description will not be repeated.

In the data input section shown in FIG. 73, 3:1 multiplexer 216 selects a data signal to be transmitted to internal signal line 209b in accordance with test mode specifying signals TM1 and TM2. In the test mode, one of the output signal of inverter 212 and internal write data DIL0 on internal signal line 209a is selected and transmitted to internal signal line 209b. Therefore, the configurations of the data input section shown in FIGS. 70 and 72 can be achieved by switching test mode specifying signals TM1 and TM2. The flexibility of the test pattern can be therefore increased. In the normal mode, the 3:1 multiplexer 216 selects the data corresponding to data DILF1 from latch circuit 208 for transmission to internal signal line 209b.

Configuration of Test Mode Specifying Signal Generating Section

Figure 74A:
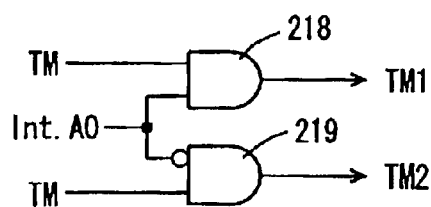
FIG. 74A is a diagram showing an example of the configuration of a section of generating a test mode specifying signal illustrated in FIG. 73

FIG. 74A is a diagram schematically showing the configuration of a section for generating the test mode specifying signals. In FIG. 74A, a test mode specifying signal generating section includes an AND circuit 218 receiving test mode instruction signal TM and an internal address signal I bit Int.A0, and a gate circuit 219 receiving internal address signal bit Int.A0 and test mode instruction signal TM. Gate circuit 219 activates test mode specifying signal TM2 when internal address signal bit Int.A0 of is at the L level and test mode instruction signal TM is at the H level. When test mode instruction signal TM is at the H level and internal address signal bit Int.A0 is at the H level, AND circuit 218 activates test mode specifying signal TM1. Test mode specifying signals TM1 and TM2 are latched by a not-shown latch circuit.

Figure 74B:
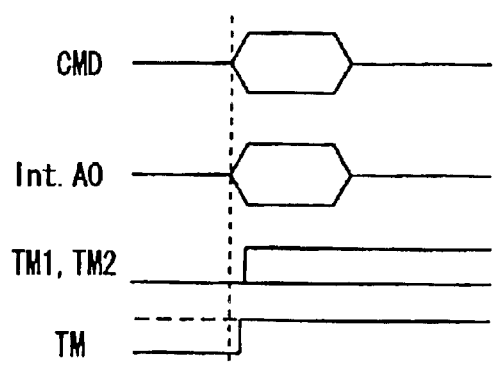
FIG. 74B is a timing chart representing an operation of the circuit illustrated in FIG. 74A.

FIG. 74B is a timing chart representing an operation of the configuration of the test mode specifying signal generating section shown in FIG. 74A. Referring to FIG. 74B, the operation of the circuit shown in FIG. 74A will be described.

In FIG. 74B, in specifying a test mode, a command as a combination of logic levels of external control signals instructs a test mode, and concurrently internal address signal bit Int.A0 is set to the H or L level to set a data pattern according to the contents of a test to be carried out. Test mode instruction signal TM is made active according to command CMD, and one of test mode specifying signals TM1 and TM2 is activated according to internal address signal bit Int.A0. Test mode specifying signals TM1 and TM2 are latched by the not-shown latch circuit.

The circuit of decoding command CMD and generating test mode instruction signal TM is achieved by a test mode decoder. When external control signals /CS, /RAS, /CAS, and /WE and a specific address signal bit are each set in a predetermined state, test mode instruction signal TM is made active.

Test mode instruction signal TM may be activated by a test mode entry instruction command. After the test mode entry, in order to specify the test mode, with a specific address signal bit set in a predetermined state, the test mode instruction signal is applied again together with test mode instruction command CMD in this test mode setting sequence.

Address signal bit Int.A0 is a signal generated by simply buffering an external address signal bit and does not instruct taking in of an address (upon instruction of the test mode, row/column selection instruction is not supplied). As an operation mode of specifying a test mode after the test mode entry, FIG. 74B shows a state where test mode instruction signal TM is already set to the H level.

Second Configuration of Test Mode Specifying Signal Generating Section

Figure 75:
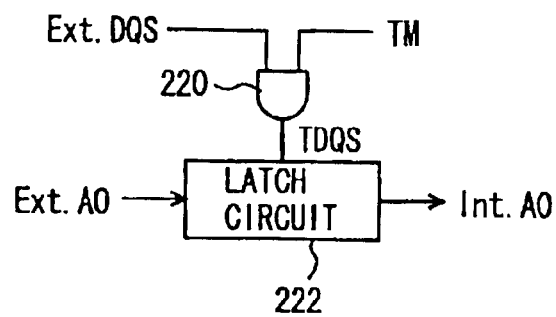
FIG. 75 is a diagram schematically showing a modification of a section of generating a test mode specifying signal illustrated in FIG. 73.

FIG. 75 is a diagram schematically showing another configuration of the test mode specifying signal generating section according to the twenty seventh embodiment of the invention. In FIG. 75, the test mode specifying signal generating section includes an AND circuit 220 receiving external data strobe signal Ext.DQS and test mode instruction signal TM, and a latch circuit 222 for latching external address signal bit Ext.A0 and generating internal address signal bit Int.A0 in accordance with output signal TDQS of AND circuit 220.

Since test data is internally generated in the test operation mode, it is unnecessary to apply the data strobe signal from the outside of the memory device, and therefore, data strobe signal Ext.DQS is used to specify a test mode. Latch circuit 222 takes in external address signal bit Ext.A0 synchronously with the rising edge and/or falling edge of output signal TDQS of AND circuit 220 and generates internal address signal bit Int.A0.

Figure 76:
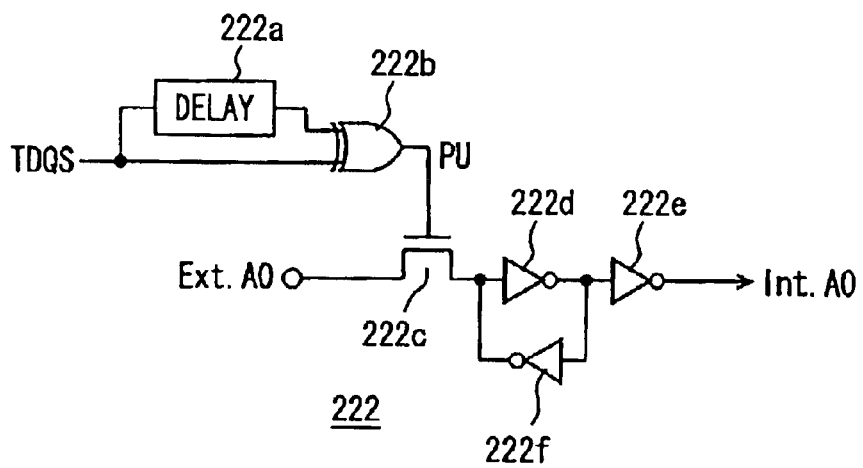
FIG. 76 is a diagram showing an example of the configuration of a latch circuit illustrated in FIG. 75.

FIG. 76 is a diagram showing an example of the configuration of latch circuit 222 illustrated in FIG. 75. In FIG. 76, latch circuit 222 includes a delay circuit 222a for delaying output signal TDQS of AND circuit 220 shown in FIG. 75 by a predetermined time, an EXOR circuit 222b receiving an output signal of delay circuit 222a and output signal TDQS of AND circuit 220, a transfer gate 222c for passing external address signal bit Ext.A0 in accordance with an output signal PU of EXOR circuit 222b, an inverter 222d for inverting a signal passed through transfer gate 222c, an inverter 222e for inverting an output signal of inverter 222d to generate internal address signal bit Int.A0, and an inverter 222f for inverting and transmitting an output signal of inverter 222d to the input of inverter 222d.

Delay circuit 222a and EXOR circuit 22b function as a circuit for detecting a transition in output signal TDQS of AND circuit 220. Therefore, each time external data strobe signal Ext.DQS makes transition, pulse signal PU having a predetermined time width is output from EXOR circuit 222b and accordingly, external address signal bit Ext.A0 is taken in and latched.

Figure 77:
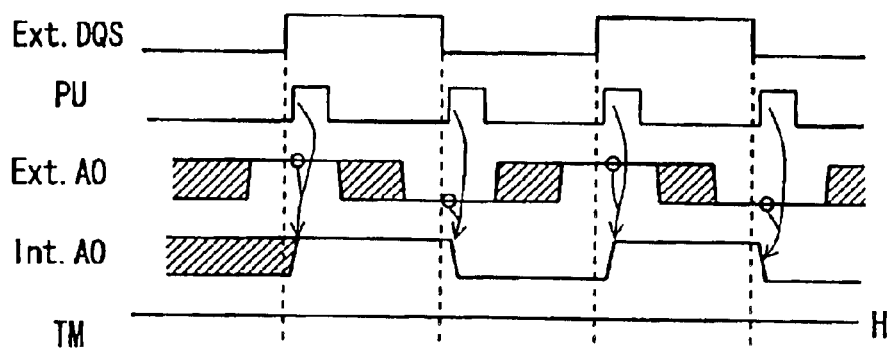
FIG. 77 is a timing chart representing an operation of the latch circuit illustrated in FIG. 75.

FIG. 77 is a timing chart representing an operation of the test mode specifying signal generating section shown in FIGS. 75 and 76. Referring to the timing chart of FIG. 77, the operations of the circuits shown in FIGS. 75 and 76 will be described.

Before external data strobe signal Ext.DQS rises, external address signal bit Ext.A0 is set to, for example, the H level. When external data strobe signal Ext.DQS changes to the H level, output pulse signal PU of EXOR circuit 222b goes high and is kept at H level for a predetermined period, transfer gate 222c is responsively made conductive, and internal address signal bit int.A0 attains H level according to external address signal bit Ext.A0.

When data strobe signal Ext.DQS turns L level, output pulse signal PU of EXOR circuit 222b is set H level again for a predetermined period, and transfer gate 222c is made conductive. In this state, when address signal bit Ext.A0 is already set to the L level, according to the external address signal bit, internal address signal bit Int.A0 changes to the L level in response to output pulse signal PU. Subsequently, pulse signal PU is generated each time external data strobe signal Ext.DQS changes, and internal address signal bit Int.A0 is set to the logic level corresponding to external address signal bit Ext.A0.

Consequently, in the test mode, by holding test mode instruction signal TM at the H level, the test mode can be specified according to a change or transition in external data strobe signal Ext.DQS. According to the method of specifying the test mode, it is unnecessary to designate the "test mode exit" in order to complete one test mode, so that the test mode can be changed at high speed.

In the normal operation mode, output signal TDQS of AND circuit 220 is at the L level, output pulse signal PU of EXOR circuit 222b maintains the L level, and latch circuit 222 does not operate.

In the configurations shown in FIGS. 75 and 76, latch circuit 222 may latch external address signal bit Ext.A0 synchronously with the rising or falling edge of data strobe signal Ext.DQS and generate internal address signal bit Int.A0.

In the case of the configuration of taking in an externally applied address signal bit in accordance with the external data strobe signal and generating the test mode specifying signal, in the test mode, test mode specifying signals TM1 and TM2 can be set to a definite state at a desired timing. Thus, in the test mode, the test mode specifying signals can be set with a sufficient margin to execute the designated test mode.

Third Configuration of Test Mode Specifying Signal Generating Section

Figure 78:
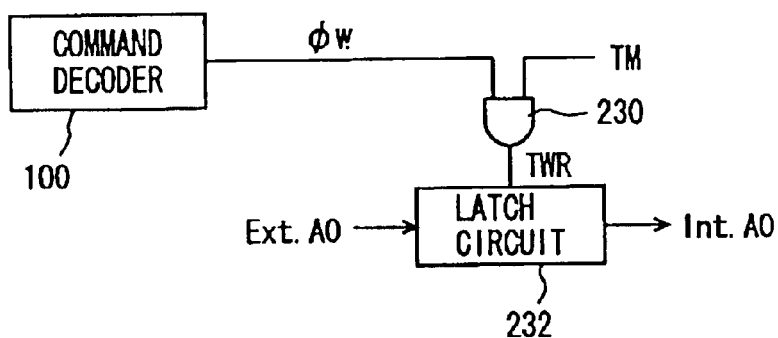
FIG. 78 is a diagram schematically showing the configuration of a second modification of the internal signal generating circuit.

FIG. 78 is a diagram schematically showing further another configuration of a section of generating the test mode specifying signal illustrated in FIG. 70. In FIG. 78, the test mode specifying signal generating section includes an AND circuit 230 receiving write operation instruction signal φw from command decoder 100 and test mode instruction signal TM and a latch circuit 232 for taking in external address signal bit Ext.A0 in accordance with an output signal TWR of AND circuit 230 and generating internal address signal bit Int.A0.

Command decoder 100 takes in external control signals /RAS, /CAS, /WE, and /CS at the rising edge of an external clock signal (or internal clock signal), identifies an operation mode designated according to the logic levels of the control signals and activates, when a command of designating the writing operation mode is supplied, write operation instruction signal φw.

Figure 79:
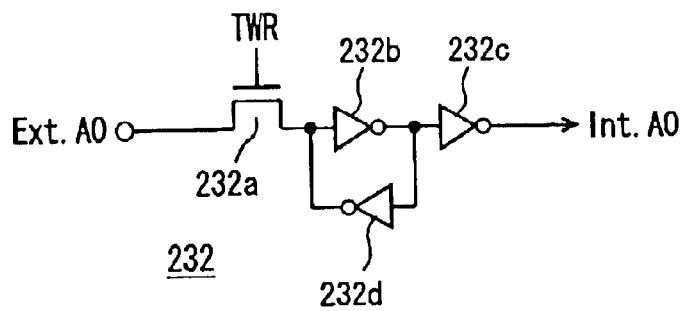
FIG. 79 is a diagram showing an example of the configuration of a latch circuit illustrated in FIG. 78.

FIG. 79 is a diagram showing an example of the configuration of latch circuit 232 illustrated in FIG. 78. In FIG. 79, latch circuit 232 includes a transfer gate 232a for transferring external address signal bit Ext.A0 in accordance with output signal TWR of AND circuit 230 shown in FIG. 78, an inverter 2332b for inverting a signal transferred via transfer gate 232a, an inverter 232c for inverting an output signal of inverter 232b to generate internal address signal bit Int.A0, and an inverter 232d for inverting and transmitting an output signal of inverter 232b to an input of inverter 232b.

In the configuration of latch circuit 232 shown in FIG. 79, when output signal TWR of AND circuit 230 is activated in response to write operation instruction signal φw in the test mode, transfer gate 232a is made conductive, and internal address signal bit Int.A0 is generated according to external address signal bit Ext.A0.

When an output signal of AND circuit 230 turns L level, transfer gate 232a becomes non-conductive, and latch circuit 232 enters a latch state.

Figure 80:
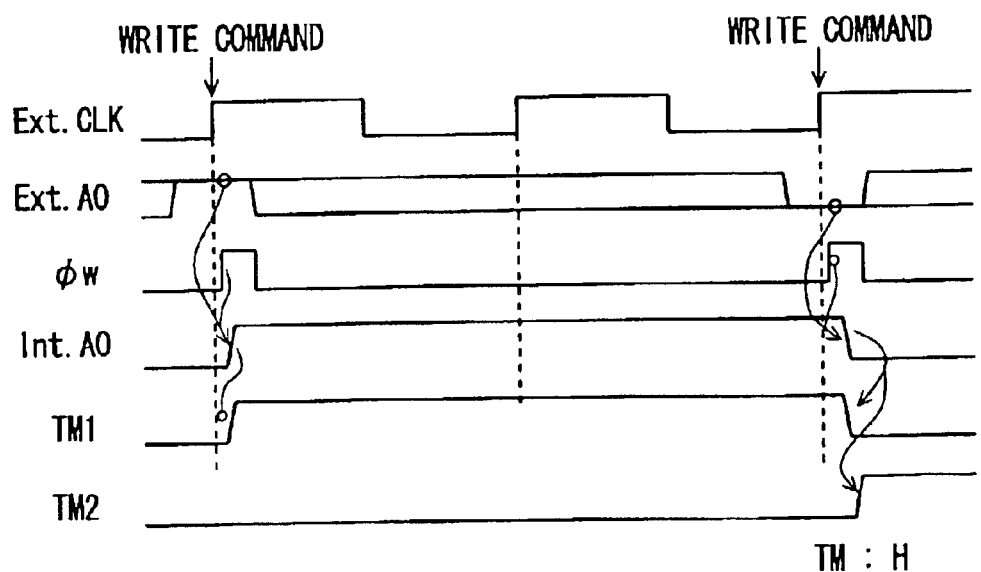
FIG. 80 is a timing chart representing an operation of the circuit illustrated in FIG. 78.
Figure 81:
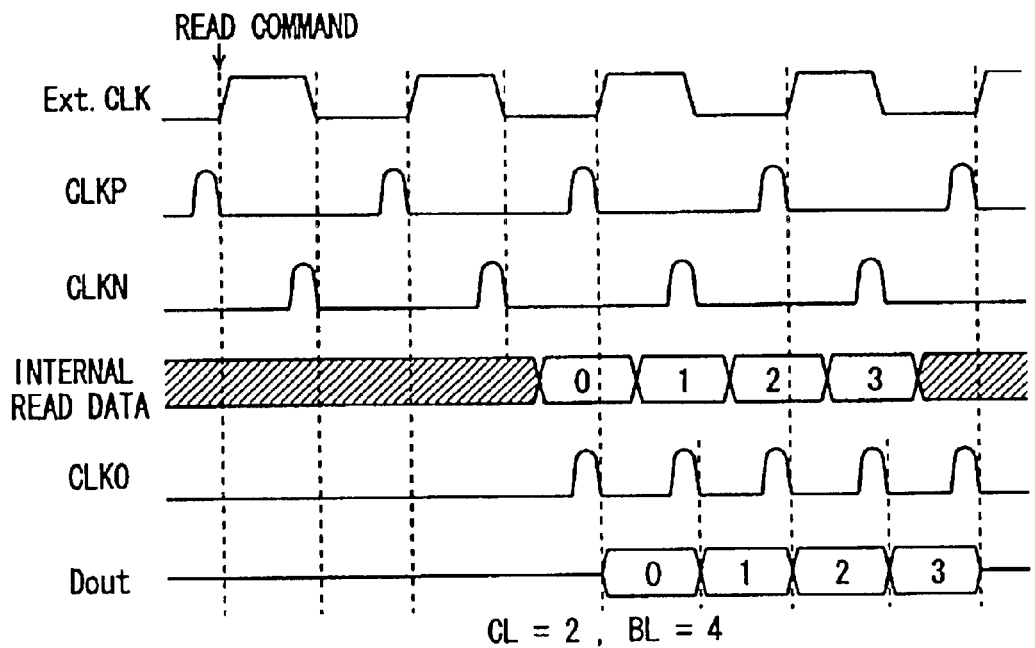
FIG. 81 is a timing chart representing an operation in outputting data of a conventional DDR mode semiconductor memory device.
Figure 82:
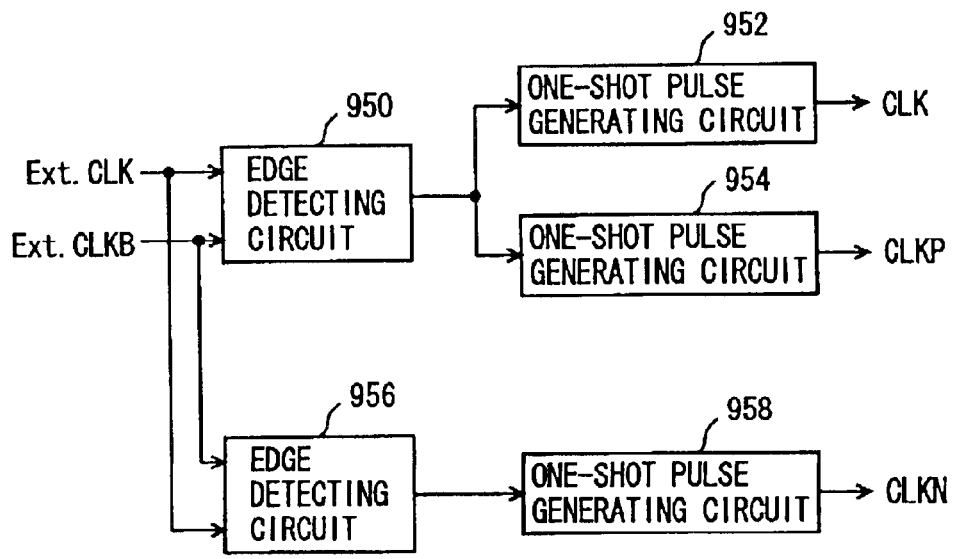
FIG. 82 is a diagram schematically showing the configuration of an internal clock generating section in the conventional DDR mode semiconductor memory device.
Figure 83:
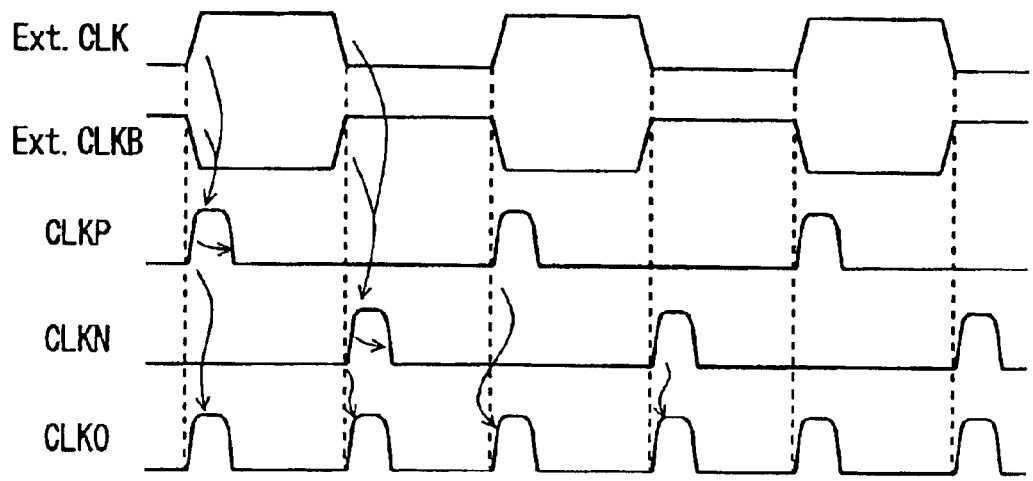
FIG. 83 is a signal waveform diagram representing an operation of the internal clock generating section illustrated in FIG. 82.
Figure 84:
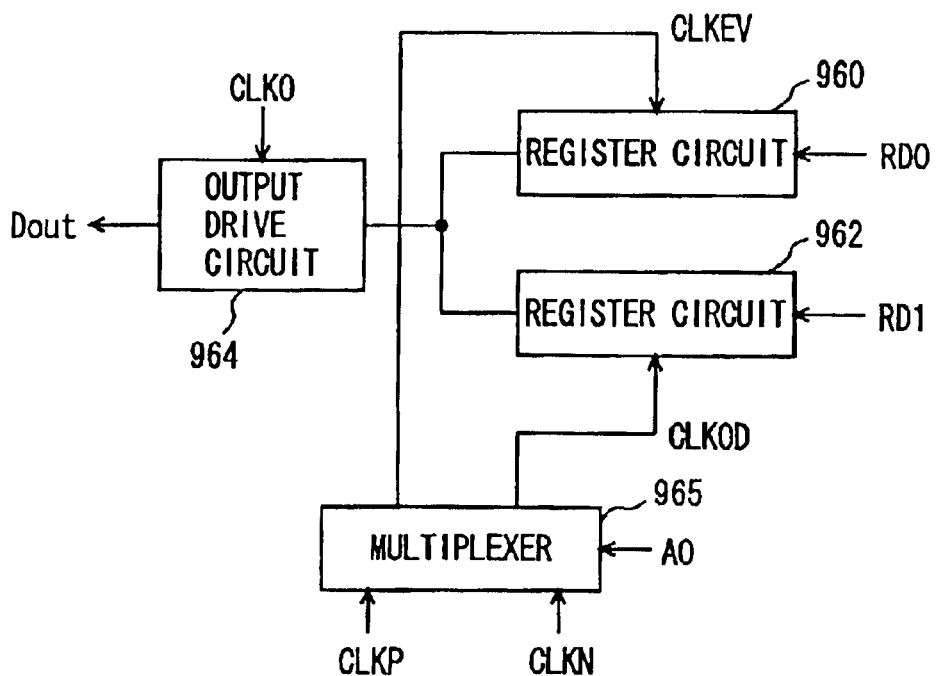
FIG. 84 is a diagram schematically showing the configuration of a data output unit in a conventional DDR mode semiconductor memory device.

FIG. 80 is a timing chart representing an operation of the test mode specifying signal generating section illustrated in FIGS. 78 and 79. Referring to FIG. 80, the operations of the circuits shown in FIGS. 78 and 79 will be described.

In the test mode, when a write command instructing writing of data is supplied, write operation instruction signal φw is made active and external address signal bit Ext.A0 is latched by latch circuit 232. In the case where address signal bit Ext.A0 is set to the H level, internal address signal bit Int.A0 is at the H level, and test mode specifying signal TM1 goes high.

On the other hand, when the write command is supplied and external address signal bit Ext.A0 is set to the L level, latch circuit 232 sets internal address signal bit Int.A0 to the L level in accordance with external address signal bit Ext.A0 in response to activation of write operation instruction signal φw. In this state, test mode specifying signal TM2 turns active.

In the test mode, when the write command instructing writing of data is supplied, according to currently applied external address signal bit Ext.A0, internal address signal bit Int.A0 changes and accordingly, states of test mode specifying signals TM1 and TM2 are set. In the test mode, data of two bits is generated per data input terminal according to a signal supplied at the rising edge of the external clock signal, the generated 2-bit data is transmitted in parallel to internal data signal lines 209a and 209b, and test write data DIL0 and DILL to memory cells is generated.

Therefore, in the input circuit, it is unnecessary to use internal address signal bit A0 to determine the order of latching external data and in the test mode, internal address signal bit A0 to the latch circuit is set to an invalid state. Consequently, in the configuration of generating 2-bit data from 1-bit data, the least significant internal address signal bit is not used. Therefore, external address signal bit Ext.A0, concurrently applied with the write command in the data writing operation, is used as a signal for setting a data pattern. Without using an extra pin terminal, in the test mode, a data pattern can be set always in the data writing operation. Only by an alteration of the address signal bit, the test data pattern can be changed, and a 4-bit checker pattern, a 2-bit checker pattern, and the like can be easily generated.

As described above, according to the 27th embodiment of the invention, transfer data to memory cells in adjacent columns are set to be the same or inverted. Consequently, the flexibility of the data pattern can be increased, and a highly reliable test can be achieved.

Other Embodiments

As a semiconductor memory device of the invention, what is required for a semiconductor memory device is to transfer data synchronously with the rising and falling edges of an external dock signal. The semiconductor memory device may be a DRAM (Dynamic Random Access Memory) or an SRAM (Static Random Access memory).

A test operation mode may be a test mode of performing a functional test for writing data into a memory cell and determining whether the memory cell is defective or normal, or may be a stress acceleration test of operating an input/output circuit at high speed to accelerate a stress in a burn-in mode.

As described above, according to the invention, an internal signal which changes at a cycle twice as short as an external clock signal or external data strobe signal is generated and the data input/output circuit is operated synchronously with the rising and falling edges of the internal signal. Thus, the high-speed semiconductor memory device can be operated in the DDR mode by using a low-speed tester.

By configuring the semiconductor memory device to generate a test data patter internally in the test mode, the tester is not required to transfer the input data for the test data, but the input data can be generated internally in accordance with a double-speed dock signal. Thus, test data in the DDR mode can be accurately generated.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
a pulse generating circuit receiving a plurality of clock signals different in phase from each other, for generating a one-shot pulse signal in a cycle shorter than a cycle of each of said plurality of clock signals in response to a transition in said plurality of clock signals; and
a data interface circuit for performing at least one of inputting and outputting of data synchronously with the pulse signal generated by said pulse generating circuit.

2. The semiconductor memory device according to claim 1, further comprising a control signal input circuit for taking in an externally applied control signal instructing an operation mode, synchronously with the pulse signal generated from said pulse generating circuit in response to a first clock signal in said plurality of clock signals.

3. The semiconductor memory device according to claim 1, wherein said plurality of clock signals include first and second clock signals the same in frequency but different in phase from each other by a ¼ cycle, and
said pulse generating circuit comprises
a gate circuit for taking an exclusive logical sum operation of said first and second clock signals, and
a pulse generator for generating a pulse signal in response to each of rising and falling edges of an output signal of said gate circuit.

4. A semiconductor memory device operating synchronously with a clock signal in a normal mode of operation for accessing data stored in a plurality of memory cells, comprising:
an internal strobe signal generating circuit receiving signals from a plurality of signal terminals including a strobe terminal for inputting a data strobe signal providing a data strobe timing and a clock terminal for inputting said clock signal, for frequency-multiplying a signal of said strobe terminal, to generate an internal strobe signal in a specific operation mode different from said normal mode of operation; and
a data input circuit for taking in external data in accordance with said internal strobe signal and generating internal write data to be written into a selected memory cell in the plurality of memory cells.

5. The semiconductor memory device according to claim 4, wherein said data input circuit receives data of a plurality of bits divided into at least two groups,
said plurality of signal terminals include a plurality of strobe terminals, arranged corresponding to the groups of the data bits, each for inputting a data strobe signal providing a strobe timing of the data bits of a corresponding group, and
said internal strobe signal generating circuit generates said internal strobe signal in accordance with the signals applied to said plurality of strobe terminals and
in said specified operation mode, signals the same in frequency but different in phase from each other are applied to said plurality of strobe terminals.

6. The semiconductor memory device according to claim 4, wherein said internal strobe signal generating circuit comprises:
a first pulse signal generating circuit for combining in logic the signals from said plurality of signal terminals and generating a first pulse signal; and
a second pulse signal generating circuit for generating a second pulse signal in accordance with said first pulse signal, and
said data input circuit includes, per data input terminal of one bit,
a plurality of first latch circuits for sequentially taking in and latching data supplied externally in response to the first pulse signal from said first pulse signal generating circuit, and
a plurality of transfer/latch circuits receiving in parallel and latching latched data of said plurality of first latch circuits in response to the second pulse signal from said second pulse signal generating circuit for internal transference in parallel.

7. A semiconductor memory device comprising:
an internal data transmission bus having a width of a plurality of bits per data terminal of one bit,
a data pattern generating circuit for generating a data pattern having a predetermined pattern in a specific operation mode, and
a switching circuit for generating data of a plurality of bits corresponding to output data of said data pattern generating circuit for transmission in parallel to said internal data transmission bus in said specific operation mode.

8. The semiconductor memory device according to claim 7, further comprising an internal clock generating circuit for generating an internal clock signal having a frequency higher than a frequency of the external clock signal,
wherein said data pattern generating circuit generates a 2-bit checker pattern in which the logic level changes every cycle of said internal clock signal synchronously with said internal clock signal per data terminal, and
said switching circuit transmits output data bits of said data pattern generating circuit in parallel to said internal data transmission bus.

9. The semiconductor memory device according to claim 7, further comprising an internal clock generating circuit for generating an internal clock signal having a frequency higher than a frequency of an external clock signal in said specific operation mode,
wherein said data pattern generating circuit is a 4-bit checker pattern generating circuit for generating a data pattern synchronously with said internal clock signal per data terminal,
said switching circuit transmits output data of said data pattern generating circuit in parallel to said internal data transmission bus, and
in said 4-bit checker pattern per data terminal, logic levels of data bits are inverted every two clock cycles of said internal clock signal and accordingly, data bits whose logic levels are inverted every data of 4 bits are transmitted to the internal data transmission bus per data terminal.

10. The semiconductor memory device according to claim 7, further comprising an internal clock generating circuit for generating an internal clock signal having a frequency higher than that of an external clock signal in said specific operation mode,
wherein said data pattern generating circuit is a checker pattern generating circuit for generating a checker pattern in which logic level changes every clock cycle in accordance with said internal clock signal per data terminal, and
output data of said checker pattern generating circuit are transmitted in parallel to said internal data transmission bus via said switching circuit, and the logic levels of data bits transmitted in parallel are different from each other per data terminal.

11. The semiconductor memory device according to claim 7, wherein said data pattern generating circuit generates data at a fixed voltage level per data terminal and transmits generated signals of the fixed voltage level in parallel to said internal data transmission bus via said switching circuit.

12. The semiconductor memory device according to claim 7, further comprising a reset circuit for resetting said data pattern generating circuit to an initial state.

13. The semiconductor memory device according to claim 7, wherein said switching circuit comprises, per data terminal,
a logic converting circuit for converting a logic level of a corresponding output data of said data pattern generating circuit, and
a selection circuit for selecting one of the output data of said data pattern generating circuit and output data of said logic converting circuit in accordance with an address signal for transmission to said internal data transmission bus.

14. The semiconductor memory device according to claim 7, wherein said data pattern generating circuit includes
a plurality of data pattern generators, and
a selecting circuit for selecting output data of said plurality of data pattern generators in accordance with a selection signal for transmission to said internal data transmission bus via said switching circuit.

15. The semiconductor memory device according to claim 7, wherein said data pattern generating circuit includes a plurality of data pattern generators arranged corresponding to the data input terminals, and said internal data transmitting bus includes a plurality of internal data lines disposed in correspondence to the data input terminals, and
said switching circuit includes a scramble circuit, disposed between said plurality of data pattern generators and said plurality of internal data transmission lines, for switching connection between said data pattern generators and said internal data transmitting lines in accordance with a switch signal.

16. The semiconductor memory device according to claim 7, wherein said switching circuit includes a logic converting circuit for converting a logic level of output data of said data pattern generating circuit per data terminal, and
output data of said data pattern generating circuit and output data of said logic converting circuit are transmitted to internal data transmission bus lines disposed corresponding to different data input terminals.

17. The semiconductor memory device according to claim 7, wherein said data pattern generating circuit includes a plurality of data pattern generators disposed corresponding to data input terminals, said data pattern generator including a circuit for converting a logic level of an output data pattern and outputting a resultant data pattern in parallel with said output data pattern, and
said switching circuit includes a scramble circuit for scrambling output data including logic converted data of said plurality of data pattern generators and transmitting scrambled output data to said internal data transmission bus disposed corresponding to each data input terminal.

18. The semiconductor memory device according to claim 7, further comprising an initialization circuit for setting an initial value of said data pattern generating circuit in accordance with an external signal.

19. A semiconductor memory device comprising:
a strobe terminal for receiving a strobe signal providing a data strobe timing;
an internal data bus for transmitting a signal of a plurality of bits; and
an internal data generating circuit for, in a specific operation mode, taking in data supplied to a data input terminal in response to a change in a signal applied to said strobe terminal, and generating data of a plurality of bits from taken-in data in response to a change in said signal, for transmission in parallel to said internal data bus, said internal data generating circuit taking in a data bit at a time as said data at said data input terminal and transmitting said plurality of bits at a time onto said internal data bus.

20. The semiconductor memory device according to claim 19, wherein said internal data generating circuit comprises:

a multiplying circuit for frequency-multiplying a signal applied to said strobe terminal in said specific operation mode;

a first pulse generating circuit for generating a first one-shot pulse signal in response to a change in an output signal of said frequency multiplying circuit;

a second pulse generating circuit for generating a second pulse signal in response to said first pulse signal;

a first latch circuit for latching data applied to said data input terminal in response to said first pulse signal;

a second latch circuit for latching and outputting the data latched by said first latch circuit in response to said second pulse signal; and a selection circuit for outputting data corresponding to output data of said second latch circuit in parallel to said internal data bus in said specific operation mode.

* * * * *